United States Patent
Kim et al.

(10) Patent No.: US 12,426,244 B2
(45) Date of Patent: Sep. 23, 2025

(54) SEMICONDUCTOR MEMORY DEVICE

(71) Applicant: SAMSUNG ELECTRONICS CO., LTD., Suwon-si (KR)

(72) Inventors: Hyo-Sub Kim, Suwon-si (KR); Kiseok Lee, Suwon-si (KR); Myeong-Dong Lee, Suwon-si (KR); Jongmin Kim, Suwon-si (KR); Hui-Jung Kim, Suwon-si (KR); Jihun Lee, Suwon-si (KR); Hongjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 464 days.

(21) Appl. No.: 17/983,489

(22) Filed: Nov. 9, 2022

(65) Prior Publication Data

US 2023/0320076 A1 Oct. 5, 2023

(30) Foreign Application Priority Data

Mar. 29, 2022 (KR) ........................ 10-2022-0039204

(51) Int. Cl.
*H10B 12/00* (2023.01)
*G11C 5/06* (2006.01)

(52) U.S. Cl.
CPC ........... *H10B 12/315* (2023.02); *G11C 5/063* (2013.01)

(58) Field of Classification Search
CPC .............................. H10B 12/315; G11C 5/063
See application file for complete search history.

(56) References Cited

U.S. PATENT DOCUMENTS

| | | | |
|---|---|---|---|
| 8,148,260 | B2 | 4/2012 | Shin |
| 10,340,278 | B1 | 7/2019 | Liu et al. |
| 10,685,963 | B2 | 6/2020 | Lee et al. |
| 10,797,056 | B2 | 10/2020 | Kim et al. |
| 10,886,277 | B2 | 1/2021 | Hong et al. |
| 2008/0246067 | A1 | 10/2008 | Yoon et al. |
| 2020/0194374 | A1 | 6/2020 | Kim et al. |
| 2020/0203347 | A1* | 6/2020 | Song ................ H10B 12/485 |
| 2021/0043722 | A1* | 2/2021 | Cho .................. H10D 1/043 |
| 2021/0098460 | A1 | 4/2021 | Lee et al. |
| 2021/0273048 | A1* | 9/2021 | Park ................ H10B 12/482 |

FOREIGN PATENT DOCUMENTS

| | | |
|---|---|---|
| CN | 113517233 | 10/2021 |
| JP | 2014-175316 | 9/2014 |
| KR | 10-2022-0162019 | 12/2022 |

* cited by examiner

*Primary Examiner* — Steven M Page
(74) *Attorney, Agent, or Firm* — Morgan, Lewis & Bockius LLP

(57) ABSTRACT

A semiconductor memory device includes: a device isolation pattern provided on a substrate to provide a first active portion and a second active portion; a first storage node pad disposed on the first active portion; a second storage node pad disposed on the second active portion; a pad separation pattern disposed between the first and second storage node pads; a word line disposed in the substrate to cross the first and second active portions; a bit line disposed on the pad separation pattern and crossing the word line; a buffer layer disposed on the pad separation pattern; and a mask polysilicon pattern interposed between the buffer layer and the bit line, wherein a side surface of the mask polysilicon pattern is substantially aligned to a side surface of the bit line, and the mask polysilicon pattern is vertically overlapped with the pad separation pattern.

20 Claims, 47 Drawing Sheets

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2022-0039204, filed on Mar. 29, 2022, in the Korean Intellectual Property Office, the disclosure of which is incorporated by reference herein in its entirety.

TECHNICAL FIELD

The present inventive concept relates to a semiconductor memory device, and more particularly, to a semiconductor memory device with improved electric characteristics.

DISCUSSION OF THE RELATED ART

Semiconductor devices are small in size, have multiple functions and are low in cost, which makes them important elements in the electronics industry. With the advancement of the electronic industry, there is an increasing demand for a semiconductor device with higher integration density. To increase the integration density of the semiconductor device, it is desirable to reduce linewidths of patterns constituting the semiconductor device. However, often novel and expensive exposure technologies are used to reduce the linewidths of the patterns, and thus, it may become difficult to increase the integration density of the semiconductor device. Thus, a variety of new technologies are currently under development to overcome the difficulty in increasing an integration density of a semiconductor memory device.

SUMMARY

According to an embodiment of the present inventive concept, a semiconductor memory device includes: a device isolation pattern provided on a substrate to provide a first active portion and a second active portion; a first storage node pad disposed on the first active portion; a second storage node pad disposed on the second active portion; a pad separation pattern disposed between the first and second storage node pads; a word line disposed in the substrate to cross the first and second active portions; a bit line disposed on the pad separation pattern and crossing the word line; a buffer layer disposed on the pad separation pattern; and a mask polysilicon pattern interposed between the buffer layer and the bit line, wherein a side surface of the mask polysilicon pattern is substantially aligned to a side surface of the bit line, and the mask polysilicon pattern is vertically overlapped with the pad separation pattern.

According to an embodiment of the present inventive concept, a semiconductor memory device includes: a device isolation pattern disposed on a substrate to provide a first active portion and a second active portion; a first storage node pad and a second storage node pad disposed on the first and second active portions, respectively; a pad separation pattern disposed between the first and second storage node pads; a word line disposed in the substrate to cross the first and second active portions; a bit line crossing the word line; a buffer layer disposed on the pad separation pattern; and a mask polysilicon pattern interposed between the buffer layer and the bit line, wherein the buffer layer includes: a first buffer layer disposed on the pad separation pattern; a second buffer layer disposed on the first buffer layer; and a third buffer layer disposed on the second buffer layer, and a width of the third buffer layer is smaller than each of a width of the first buffer layer and a width of the second buffer layer.

According to an embodiment of the present inventive concept, a semiconductor memory device includes: a device isolation pattern disposed on a substrate to provide first to third active portions, which are adjacent to each other in a first direction; first to third impurity regions disposed on the first to third active portions, respectively; a word line disposed in the substrate and crossing the first and second active portions; a word line capping pattern disposed on the word line; a bit line contact disposed on the first active portion; a first bit line located on the bit line contact and crossing the word line, wherein the first bit line includes a bit line polysilicon pattern, a bit line diffusion prevention pattern, and a bit line interconnection pattern, which are sequentially stacked on the bit line contact; a bit line spacer disposed on a side surface of the first bit line; a bit line capping pattern disposed on a top surface of the first bit line; a first storage node pad disposed on the second active portion; a second storage node pad disposed on the third active portion; a pad separation pattern disposed between the first storage node pad and the second storage node pad; a second bit line disposed on the pad separation pattern; a buffer layer disposed between the second bit line and the pad separation pattern; a mask polysilicon pattern disposed between the buffer layer and the second bit line; a storage node contact electrically connected to the first storage node pad; landing pads disposed on the storage node contact; a landing pad separation pattern disposed between the landing pads; and a data storage pattern disposed on the landing pads, wherein a side surface of the mask polysilicon pattern is substantially aligned to a side surface of the second bit line, and the mask polysilicon pattern is vertically overlapped with the pad separation pattern.

DETAILED DESCRIPTION OF THE EMBODIMENTS

Figure 1:
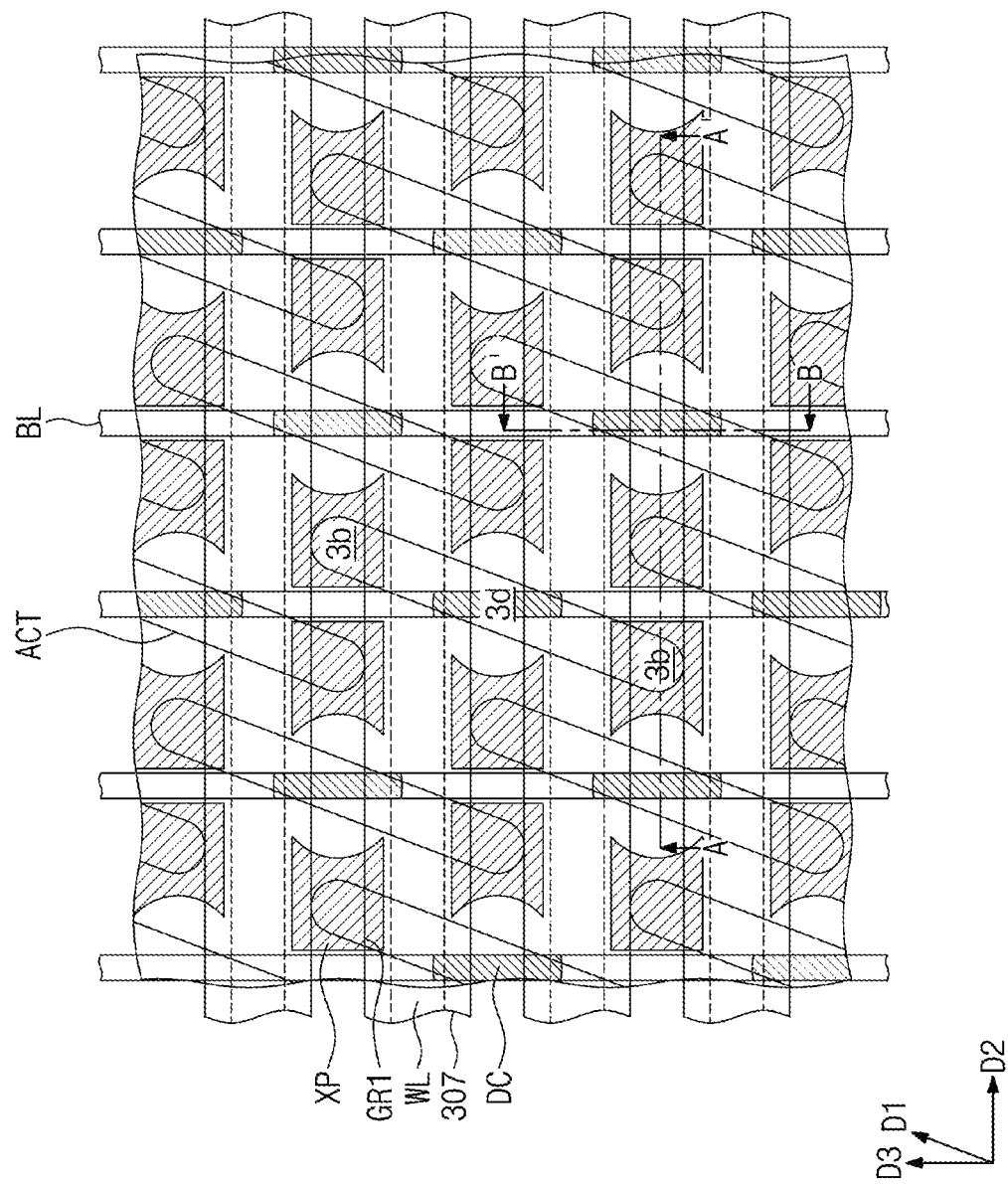
FIG. 1 is a plan view illustrating a semiconductor memory device according to an embodiment of the present inventive concept.
Figure 2:
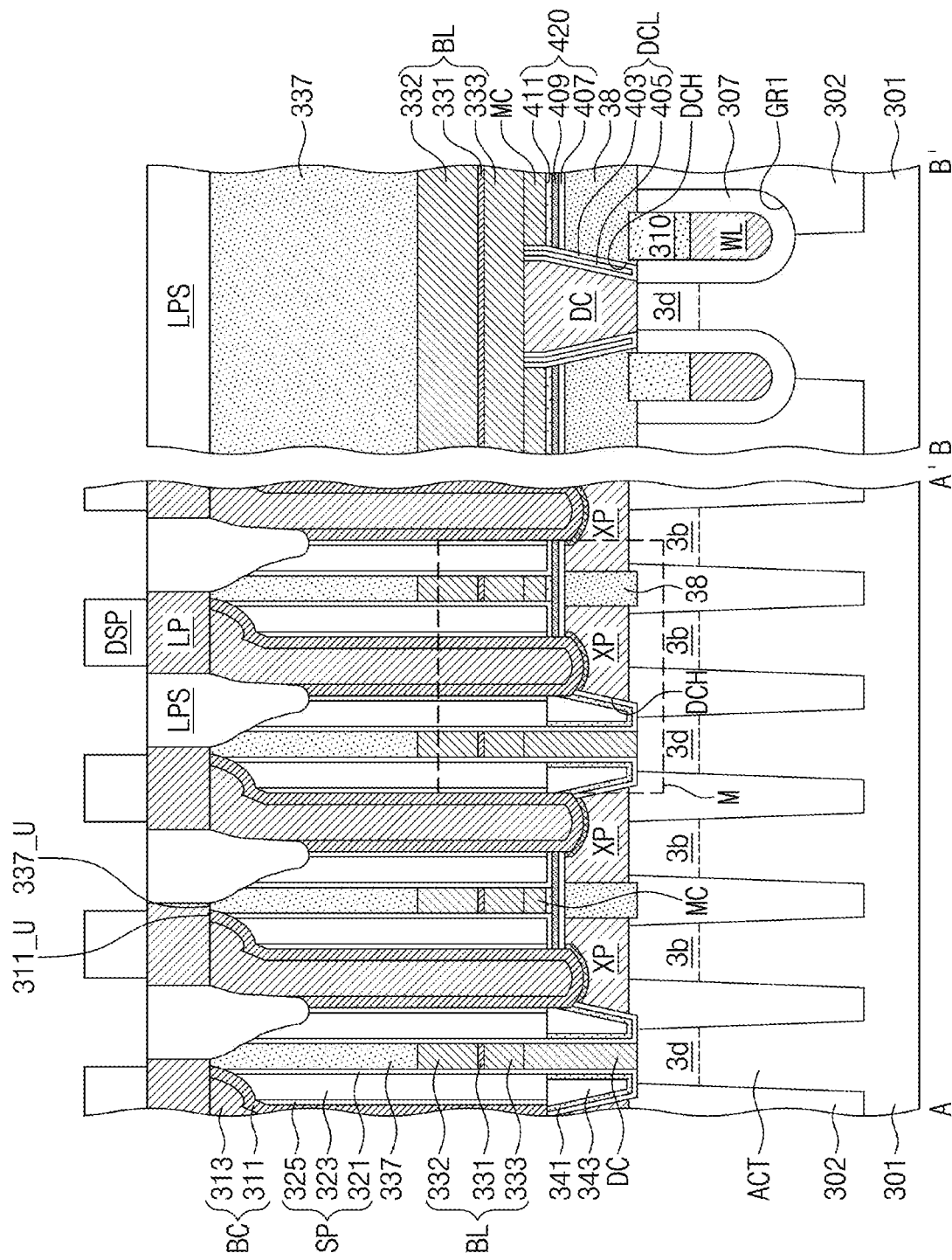
FIG. 2 is a sectional view taken along lines A-A' and B-B' of FIG. 1.
Figure 3:
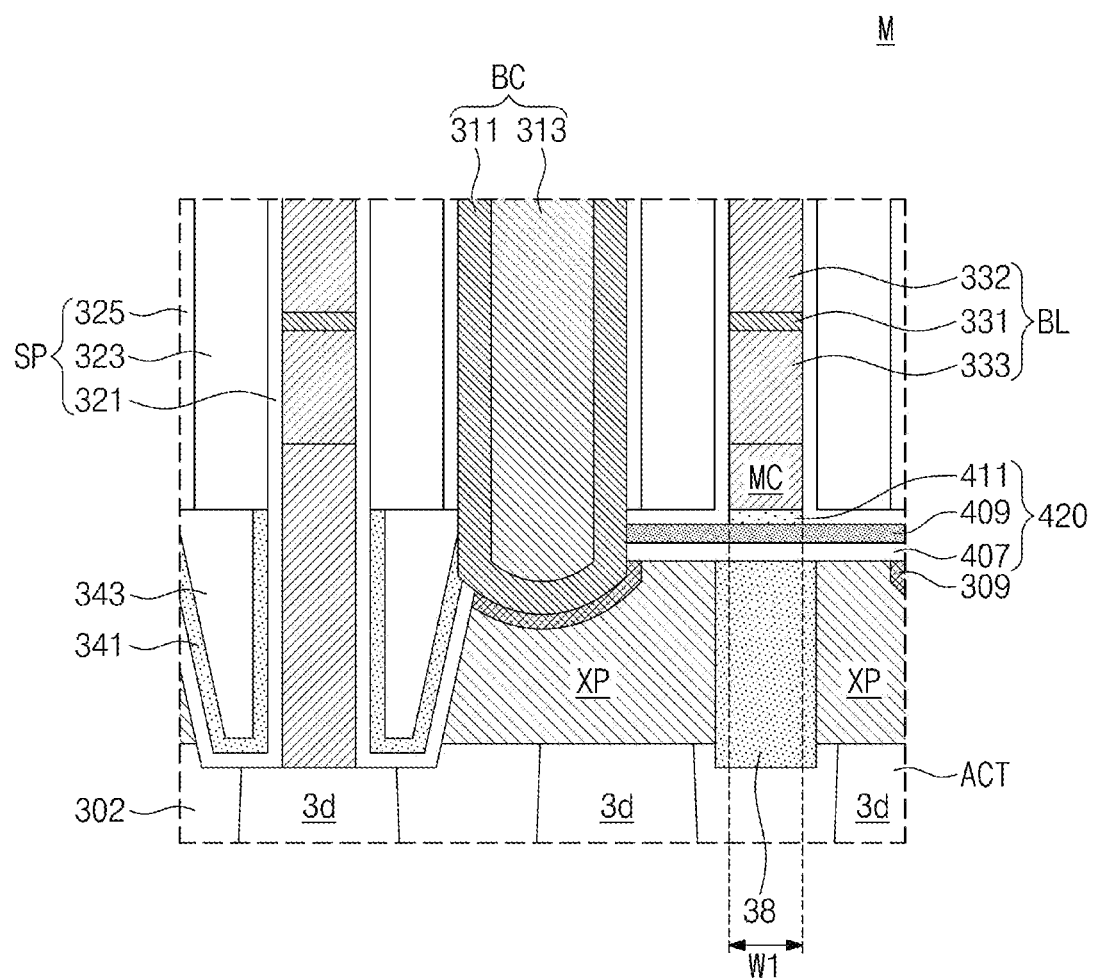
FIG. 3 is an enlarged sectional view of a portion 'M' of FIG. 2.

FIG. 1 is a plan view illustrating a semiconductor memory device according to an embodiment of the present inventive concept. FIG. 2 is a sectional view taken along lines A-A' and B-B' of FIG. 1. FIG. 3 is an enlarged sectional view of a portion 'M' of FIG. 2.

Referring to FIGS. 1 and 2, device isolation patterns 302 may be disposed on a substrate 301 to define active portions ACT. Each of the active portions ACT may have an isolated shape. Each of the active portions ACT may have a bar shape or a rounded shape, which is elongated in a first direction D1, when viewed in a plan view. The active portions ACT may be portions of the substrate 301, which are surrounded by the device isolation patterns 302, when viewed in a plan view.

The substrate 301 may be formed of or include a semiconductor material. The active portions ACT may be arranged to be parallel to each other in the first direction D1, and each active portion ACT may be disposed to have an end portion that is adjacent to a center of another active portion ACT adjacent thereto. The device isolation patterns 302 may be formed of or include at least one of, for example, silicon oxide, silicon oxynitride, or silicon nitride and may have a single- or multi-layered structure. Top surfaces of the device isolation patterns 302 may be located at substantially the same level as top surfaces of the active portions ACT; however, the present inventive concept is not limited thereto. In an embodiment of the present inventive concept, the top surface of the device isolation patterns 302 may be located at a level lower than the top surfaces of the active portions ACT.

A word line WL may be provided to cross the active portions ACT. The word lines WL may be disposed in grooves GR1, which are formed in upper portions of the device isolation patterns 302 and the active portions ACT. The word lines WL may be parallel to a second direction D2 crossing the first direction D1. The word lines WL may be formed of or include at least one of conductive metal materials. A gate dielectric layer 307 may be disposed between the word line WL and inner side surfaces of the grooves GR1. Bottom surfaces of the word lines WL may have an uneven profile. The gate dielectric layer 307 may include at least one of, for example, a thermal oxide layer, a silicon nitride layer, a silicon oxynitride layer, or a high-k dielectric layer. A top surface of the gate dielectric layer 307 may be located at the same level as the top surfaces of the active portions ACT. In an embodiment of the present inventive concept, the top surface of the gate dielectric layer 307 may be located at a level lower than the top surfaces of the active portions ACT.

A first impurity region 3d may be disposed in a portion of the active portion ACT between a pair of the word lines WL, and a pair of second impurity regions 3b may be disposed in opposite edge regions of the active portions ACT. In an embodiment of the present inventive concept, the first and second impurity regions 3d and 3b may be doped with n-type impurities. The first impurity region 3d may correspond to a common drain region, and the second impurity regions 3b may correspond to source regions. The word lines WL and the first and second impurity regions 3d and 3b adjacent thereto may constitute a transistor. Since the word lines WL are disposed in the grooves GR1, a channel region below the word line WL may have an increased channel length within a given planar area. Thus, it may be possible to minimize a short channel effect of a semiconductor memory device.

Top surfaces of the word lines WL may be lower than the top surfaces of the active portions ACT. Word line capping patterns 310 may be disposed on the word lines WL, respectively. The word line capping pattern 310 may be a line-shaped pattern extended in a length direction of the word lines WL and may cover the top surface of the word line WL. For example, the word line capping pattern 310 may cover the entire top surface of the word line WL. The word line capping patterns 310 on the word lines WL may be provided to remaining portions of the grooves GR1. The word line capping pattern 310 may be formed of or include, for example, silicon nitride. A top surface of the word line capping pattern 310 may be located at a level higher than the top surface of the gate dielectric layer 307 and/or the top surface of the device isolation patterns 302.

Bit lines BL may be disposed on the substrate 301. The bit lines BL may be disposed to cross the word line capping patterns 310 and the word lines WL. Referring to FIG. 1, the bit lines BL may be parallel to a third direction D3 that is non-parallel to the first and second directions D1 and D2. The bit line BL may include a bit line polysilicon pattern 333, a bit line diffusion prevention pattern 331, and a bit line interconnection pattern 332, which are sequentially stacked on each other. The bit line diffusion prevention pattern 331 may be formed of or include at least one of, for example, titanium (Ti), titanium nitride (TiN), titanium silicon nitride (TiSiN), tantalum (Ta), tantalum nitride (TaN), or tungsten nitride (WN). The bit line interconnection pattern 332 may be formed of or include at least one of metallic materials (e.g., tungsten, aluminum, copper, ruthenium, and iridium). The bit line polysilicon pattern 333 may be interposed between a bit line contact DC, which will be described below, and the bit line diffusion prevention pattern 331 and between a mask polysilicon pattern MC, which will be described below, and the bit line diffusion prevention pattern 331. The bit line polysilicon pattern 333 may be formed of or include doped polysilicon. Bit line capping patterns 337 may be disposed on the bit lines BL, respectively. The bit line capping patterns 337 may be formed of or include an insulating material (e.g., silicon nitride).

A bit line contact DC may be disposed between the bit line BL and the active portion ACT (e.g., the first impurity region 3d). In an embodiment of the present inventive concept, the bit line contact DC may be formed of or include doped polysilicon. The bit line contact DC may have an elliptical or circular shape, when viewed in a plan view. The bit line contact DC may be disposed on the first impurity region 3d. For example, the bit line contact DC may be in contact with the first impurity region 3d. Unlike the illustrated structure, for example, there may be no observable interface between the bit line contact DC and the bit line polysilicon pattern 333.

A storage node pad XP may be disposed on the active portion ACT with the second impurity region 3b. The storage node pad XP may be formed of or include doped polysilicon. The storage node pad XP may have a rectangle-like shape, when viewed in a plan view. A side surface of the storage node pad XP adjacent to the bit line contact DC may be recessed in a direction away from the bit line contact DC.

A bit line spacer SP may be provided to cover side surfaces of the bit line BL and the bit line capping pattern 337. The bit line spacer SP may include a spacer liner 321, a first spacer 323, and a second spacer 325. Each of the spacer liner 321, the first spacer 323, and the second spacer 325 may be independently formed of or include one of, for example, silicon oxide, silicon nitride, silicon oxynitride, and silicon oxycarbide (SiOC). In an embodiment of the present inventive concept, the spacer liner 321 may be formed of or include a material having an etch selectivity with respect to the first spacer 323; for example, the spacer liner 321 may be formed of or include silicon nitride, and the first spacer 323 may be formed of or include silicon oxide. In addition, each of the spacer liner 321 and the first spacer 323 may be formed of or include silicon oxide. The second spacer 325 may be formed of or include an insulating material (e.g., silicon nitride) having an etch selectivity with respect to the first spacer 323.

The spacer liner 321 may be extended to cover inner side surfaces and bottom surfaces of a contact hole DCH. The contact hole DCH may expose the first impurity region 3d. For example, the spacer liner 321 may cover a side surface of the bit line contact DC, a top surface of the active portion ACT, and a side surface of the storage node pad XP. A first gapfill insulating pattern 341 may be disposed on the spacer liner 321. The first gapfill insulating pattern 341 may be formed of or include, for example, silicon oxide. A second gapfill insulating pattern 343 may be provided on the first gapfill insulating pattern 341 to fill a remaining portion of the contact hole DCH. The second gapfill insulating pattern 343 may be formed of or include, for example, silicon nitride. The first and second gapfill insulating patterns 341 and 343 may be formed of or include different materials from each other.

A pad separation pattern 38 may be interposed between adjacent ones of the storage node pads XP. The pad separation pattern 38 may be formed of or include an insulating material (e.g., silicon nitride). A bottom surface of the pad separation pattern 38 may be located at a level that is the same as or lower than a top surface of the device isolation pattern 302. In an embodiment of the present inventive concept, the pad separation pattern 38 may include a portion that is inserted into the device isolation pattern 302. The bottom surface of the pad separation pattern 38 may be located at a level that is the same as or lower than a bottom surface of the storage node pad XP. In an embodiment of the present inventive concept, a top surface of the pad separation pattern 38 may be coplanar with a top surface of the storage node pad XP; however, the present inventive concept is not limited thereto.

A mask polysilicon pattern MC may be disposed between the pad separation pattern 38 and the bit line BL. In an embodiment of the present inventive concept, the mask polysilicon pattern MC may be formed of or include doped polysilicon. A side surface of the mask polysilicon pattern MC may be aligned to a side surface of the bit line BL. Unlike the illustrated structure, there may be no observable interface between the mask polysilicon pattern MC and the bit line polysilicon pattern 333.

A buffer layer 420 may be interposed between the pad separation pattern 38 and the mask polysilicon pattern MC. The buffer layer 420 may include a first buffer layer 407, a second buffer layer 409, and a third buffer layer 411, which are sequentially stacked on each other. The first to third buffer layers 407, 409, and 411 may be formed of or include insulating materials, which are chosen to have an etch selectivity with respect to each other. The first to third buffer layers 407, 409, and 411 may be formed of or include different materials from each other. For example, the first buffer layer 407 may be formed of or include silicon oxide. The second buffer layer 409 may be formed of or include, for example, silicon nitride. The third buffer layer 411 may be formed of or include, for example, silicon oxynitride.

A contact insulating pattern DCL may be provided below the bit line BL and may be interposed between the bit line contact DC and the pad separation pattern 38 (e.g., see a section B-B' of FIG. 2). The contact insulating pattern DCL may include a first contact insulating pattern 403 and a second contact insulating pattern 405. The first contact insulating pattern 403 may be in contact with a side surface of the pad separation pattern 38, a side surface of the buffer layer 420, and the side surface of the mask polysilicon pattern MC. The first contact insulating pattern 403 may be extended along a bottom surface of the contact hole DCH. The first contact insulating pattern 403 may be in contact with the top surface of the gate dielectric layer 307. The first contact insulating pattern 403 may be in contact with the side surface of the bit line contact DC. The first contact insulating pattern 403 may have a U-shaped profile. The second contact insulating pattern 405 may be disposed on the first contact insulating pattern 403 to fill a remaining portion of the contact hole DCH. The second contact insulating pattern 405 may be spaced apart from the bit line contact DC, the pad separation pattern 38, the buffer layer 420, and the mask polysilicon pattern MC by the first contact insulating pattern 403. The first contact insulating pattern 403 may be formed of or include, for example, silicon nitride. For example, second contact insulating pattern 405 may be formed of or include the same material as the spacer liner 321. For example, the second contact insulating pattern 405 may be formed of or include at least one of silicon nitride or silicon oxide.

A storage node contact BC may be disposed between adjacent ones of the bit lines BL. The storage node contact BC may be disposed in the contact hole DCH between adjacent ones of the bit lines BL. The storage node contact BC may include a contact metal pattern 313 and a contact diffusion prevention pattern 311, which is provided to enclose side and bottom surfaces of the contact metal pattern 313. The contact diffusion prevention pattern 311 may conformally cover the side and bottom surfaces of the contact hole DCH. Both of the contact metal pattern 313 and the contact diffusion prevention pattern 311 may be formed of or include at least one of metallic materials. In an embodiment of the present inventive concept, the contact diffusion prevention pattern 311 may be formed of or include at least one of titanium, titanium nitride, titanium silicon nitride, tantalum, tantalum nitride, or tungsten nitride. The contact metal pattern 313 may be formed of or include at least one of metallic materials (e.g., tungsten, aluminum, and copper). A bottom surface of the contact diffusion prevention pattern 311 may have an uneven shape. A bottom surface of the contact metal pattern 313 may also have an uneven shape. For example, the bottom surface of the contact metal pattern 313 may be rounded.

In an embodiment of the present inventive concept, the storage node pad XP may be in contact with the second impurity region 3b. In this case, it may be possible to significantly reduce a contact resistance between the storage node contact BC and the second impurity region 3b. Furthermore, the storage node contact BC may be formed of a polysilicon-free material. In an embodiment of the present inventive concept, the storage node contact BC may further include a polysilicon pattern disposed below the contact diffusion prevention pattern 311, but, even in this case, the polysilicon pattern may have a size that is smaller than that in the conventional case.

If a content of polysilicon in the storage node contact BC is increased, a tRDL (last data into row free charge time) failure may be increased, because the polysilicon has an electric resistance higher than that of a metallic material. A high-temperature annealing process may be performed to lower the electric resistance of the polysilicon, but the annealing process may increase a risk of a void at an interface between the storage node contact BC, which is formed of polysilicon, and the substrate 301 (or storage node pad) and consequently may increase the tRDL failure. However, according to an embodiment of the present inventive concept, the storage node contact BC may have a low electric resistance, because the storage node contact BC includes a polysilicon-free metallic material, and thus, it may be possible to reduce the tRDL failure and to omit the high-temperature annealing process. This may make it possible to simplify the fabrication process.

A bottom end of the storage node contact BC may be lower than the top surface of the storage node pad XP. An ohmic contact layer 309 may be interposed between the storage node contact BC and the storage node pad XP. The ohmic contact layer 309 may be formed of or include a metal silicide (e.g., cobalt silicide). A bottom surface of the ohmic contact layer 309 may have an uneven shape. For example, the bottom surface of the ohmic contact layer 309 may have a rounded shape. A contact surface (or a top surface) of the storage node pad XP, which is in contact with the ohmic contact layer 309, may also have an uneven shape. For example, the contact surface of the storage node pad XP, which is in contact with the ohmic contact layer 309, may have a concave shape. Since the uneven contact surface has a contact area larger than a flat contact surface, it may be possible to reduce an electric resistance of the storage node contact BC. Accordingly, it may be possible to reduce the tRDL failure.

A top surface 311_U of the contact diffusion prevention pattern 311 may be located at the same level as (i.e., coplanar with) a top surface 337_U of the bit line capping pattern 337. In addition, a top surface of the contact metal pattern 313 may also be located at the same level as (i.e., coplanar with) the top surface 311_U of the contact diffusion prevention pattern 311. Landing pads LP may be located on the storage node contacts BC, respectively. When viewed in a plan view, the landing pads LP may be island-shaped patterns, which are spaced apart from each other. Six landing pads LP may be provided to have a hexagonal shape enclosing one landing pad LP. The landing pads LP may be arranged to form a honeycomb shape.

The landing pad LP may be disposed on the top surface 311_U of the contact diffusion prevention pattern 311, the top surface 337_U of the bit line capping pattern 337, and the top surface of the contact metal pattern 313. For example, the landing pad LP may be in contact with the top surface 311_U of the contact diffusion prevention pattern 311, the top surface 337_U of the bit line capping pattern 337, and the top surface of the contact metal pattern 313. The landing pad LP may be formed of or include the same material as the contact metal pattern 313. Landing pad separation patterns LPS may be disposed between the landing pads LP. Portions of the landing pad separation patterns LPS may be extended into regions that are between adjacent ones of the storage node contact BC and the bit line spacer SP. In addition, the landing pad separation patterns LPS may extend between the bit line capping pattern 337 and the storage node contact BC. Accordingly, bottom ends of the landing pad separation patterns LPS may be lower than a top end of the bit line spacer SP.

Data storage patterns DSP may be disposed on the landing pads LP, respectively. Each of the data storage patterns DSP may be a capacitor including a bottom electrode, a dielectric layer, and a top electrode. In this case, the semiconductor memory device may be a dynamic random access memory (DRAM) device. In addition, the data storage patterns DSP may include a magnetic tunnel junction pattern. In this case, the semiconductor memory device may be a magnetic random access memory (MRAM) device. In an embodiment of the present inventive concept, the data storage patterns DSP may be formed of or include a phase-change material or a variable resistance material. In this case, the semiconductor memory device may be a phase-change random access memory (PRAM) or a resistive random access memory (ReRAM) device.

Referring to FIG. 3, a width of the third buffer layer 411 may be a first width W1. In an embodiment of the present inventive concept, the first width W1 may be uniform, regardless of the height or vertical level. For example, a side surface of the third buffer layer 411 may be substantially aligned to the side surface of the mask polysilicon pattern MC. The side surface of the third buffer layer 411 and the side surface of the mask polysilicon pattern MC may be substantially perpendicular to a top surface of the second buffer layer 409. In an embodiment of the present inventive concept, the first width W1 may gradually increase in a direction toward the substrate 301. The third buffer layer 411 and the mask polysilicon pattern MC may be horizontally offset from the storage node pad XP. The third buffer layer 411 and the mask polysilicon pattern MC may be vertically overlapped with the pad separation pattern 38.

A width of each of the first and second buffer layers 407 and 409 may be larger than that of the third buffer layer 411, when measured in the second direction D2. A portion of each of the first and second buffer layers 407 and 409 may be vertically overlapped with the storage node pad XP. For example, the second buffer layer 409 may cover the entire top surface of the first buffer layer 407. The top surface of the second buffer layer 409 may be covered with the bit line spacer SP. A thickness of each of the first and second buffer layers 407 and 409 may be substantially uniform regardless of a horizontal position. A side surface of each of the first and second buffer layers 407 and 409 may overlap with the storage node contact BC. For example, the side surface of each of the first and second buffer layers 407 and 409 may be in contact with the storage node contact BC. The side surface of the third buffer layer 411 may overlap with the spacer liner 321. For example, the side surface of the third buffer layer 411 may be in contact with the spacer liner 321.

A top surface of the mask polysilicon pattern MC and a top surface of the bit line contact DC may be located at substantially the same level. A thickness of the mask polysilicon pattern MC may be larger than a thickness of each of the first to third buffer layers 407, 409, and 411. In an embodiment of the present inventive concept, the first to third buffer layers 407, 409, and 411 may have substantially the same thickness as each other.

In the case where the mask polysilicon pattern MC and the third buffer layer 411 are not provided as will be described, the second buffer layer 409 may be formed with a thickness (e.g., an increased thickness) to increase stability in a process of forming the bit line BL (e.g., see FIG. 36). If the thickness of the second buffer layer 409 is increased, the second buffer layer 409 may also be etched during a process of etching the bit line BL, thereby having an inclined side surface. Accordingly, the top surface of the first buffer layer 407 may be exposed, and the first buffer layer 407 on the storage node pad XP may also be etched in a subsequent process. In this case, the first buffer layer 407 on the storage node pad XP may have an increased thickness dispersion, and it may be difficult to realize the contact area between the storage node contact BC and the storage node pad XP to a desired value. Since the second buffer layer 409 is formed to have an inclined side surface, a portion of the second buffer layer 409 may be vertically overlapped with the storage node pad XP. This may lead to a reduction in an area of the top surface of the storage node pad XP, which is exposed when the storage node contact BC is formed. In this case, the contact area between the storage node contact BC and the storage node pad XP may be reduced, and thus, the electric characteristics of the semiconductor memory device may be deteriorated.

According to an embodiment of the present inventive concept, as will be described in more detail below, the mask polysilicon pattern MC and the third buffer layer 411 may be used to prevent the second buffer layer 409 from being etched when the bit line BL is formed. Accordingly, even when the second buffer layer 409 is not formed with an increased thickness, it may be possible to increase the stability in a process of forming the bit line BL, and moreover, due to the second buffer layer 409, it may be possible to prevent the first buffer layer 407 from being exposed and etched in a subsequent process. As a result, it may be possible to easily achieve a desired contact area between the storage node contact BC and the storage node pad XP. Furthermore, since side surfaces of the mask polysilicon pattern MC and the third buffer layer 411 are vertically aligned to each other, an area of the top surface of the storage node pad XP, which is exposed when the storage node contact BC is formed, may be increased. As a result, the contact area between the storage node contact BC and the storage node pad XP may be increased, and this may make it possible to increase the electric characteristics of the semiconductor memory device.

FIGS. 4, 6, 8, 10, 12, 14, 16, 18, 20, 22, 24, 26, 28, 30, 32, and 34 are plan views illustrating a method of fabricating a semiconductor memory device, according to an embodiment of the present inventive concept. FIGS. 5, 7, 9, 11, 13, 15, 17, 19, 21, 23, 25, 27, 29, 31, 33, and 35 are sectional views taken along lines A-A' and B-B' of FIGS. 4, 6, 8, 10, 12, 14, 16, 18, 20, 22, 24, 26, 28, 30, 32, and 34, respectively.

Figure 4:
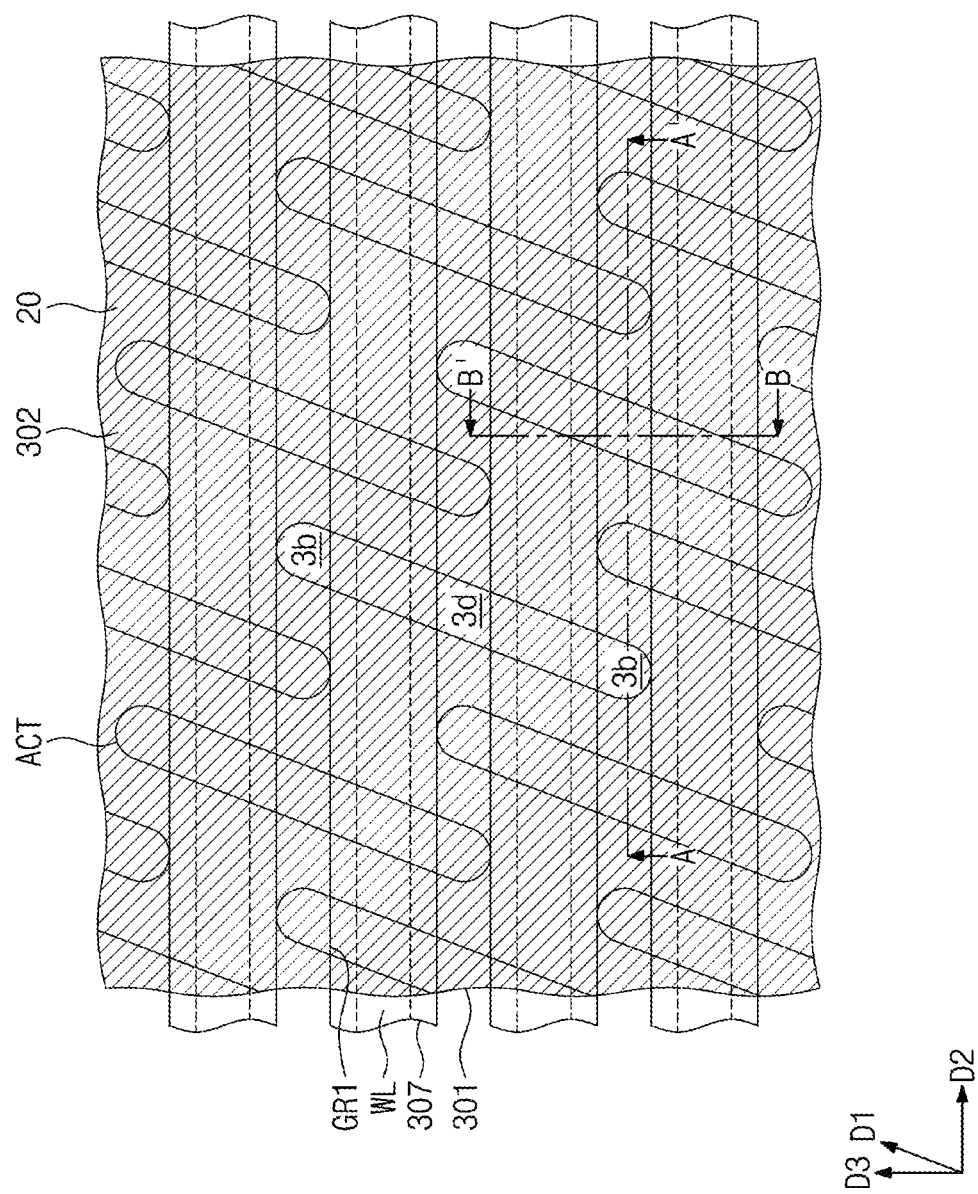
FIGS. 4, 6, 8, 10, 12, 14, 16, 18, 20, 22, 24, 26, 28, 30, 32, and 34 are plan views illustrating a method of fabricating a semiconductor memory device, according to an embodiment of the inventive concept.
Figure 5:
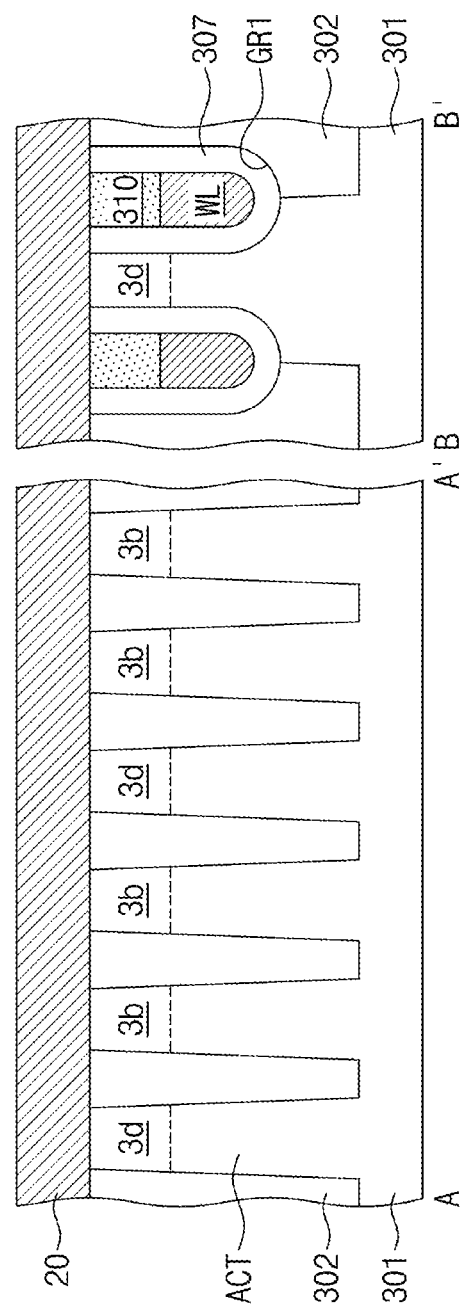
FIGS. 5, 7, 9, 11, 13, 15, 17, 19, 21, 23, 25, 27, 29, 31, 33, and 35 are sectional views taken along lines A-A' and B-B' of FIGS. 4, 6, 8, 10, 12, 14, 16, 18, 20, 22, 24, 26, 28, 30, 32, and 34, respectively.

Referring to FIGS. 4 and 5, the device isolation patterns 302 may be formed on the substrate 301 and may define the active portions ACT. For example, device isolation trenches may be formed on the substrate 301, and the device isolation patterns 302 may be formed to fill the device isolation trenches. The active portions ACT and the device isolation patterns 302 may be patterned to form the grooves GR1. Bottom surfaces of the grooves GR1 may have an uneven shape. The gate dielectric layer 307 may be conformally formed in the grooves GR1. For example, the gate dielectric layer 307 may be formed by a thermal oxidation process, a chemical vapor deposition process, and/or an atomic layer deposition process. A gate conductive layer may be formed to fill the grooves GR1 and then may be etched-back to form the word lines WL. A pair of the word lines WL may be formed to cross the active portions ACT. The word line capping pattern 310 may be respectively formed on the word lines WL by forming an insulating layer (e.g., a silicon nitride layer) on the substrate 301 to fill the grooves GR1 and etching the insulating layer. The first and second impurity regions $3d$ and $3b$ may be formed by injecting dopants into the active portions ACT by using the word line capping patterns 310 and the device isolation pattern 302 as a mask.

A first conductive layer 20 may be formed on the top surface of the substrate 301. For example, the first conductive layer 20 may be formed on the entire top surface of the substrate 301. The first conductive layer 20 may be, for example, a doped poly-silicon layer. The formation of the first conductive layer 20 may include depositing a poly-silicon layer and doping the poly-silicon layer with impurities through an ion implantation process. In addition, the first conductive layer 20 may be formed by depositing a poly-silicon layer, and here, the poly-silicon layer may be doped in situ with impurities during its deposition process.

Figure 6:
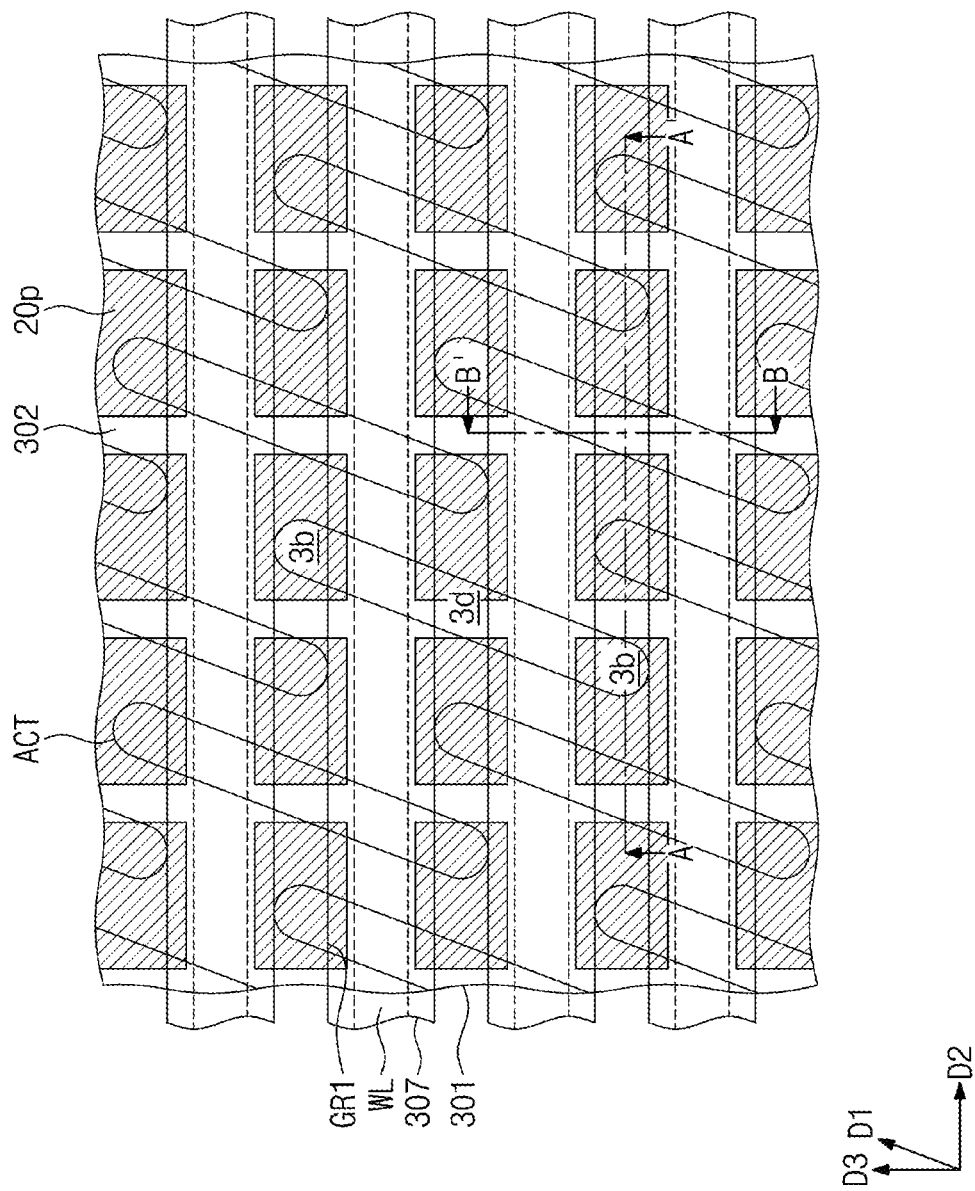
Figure 7:
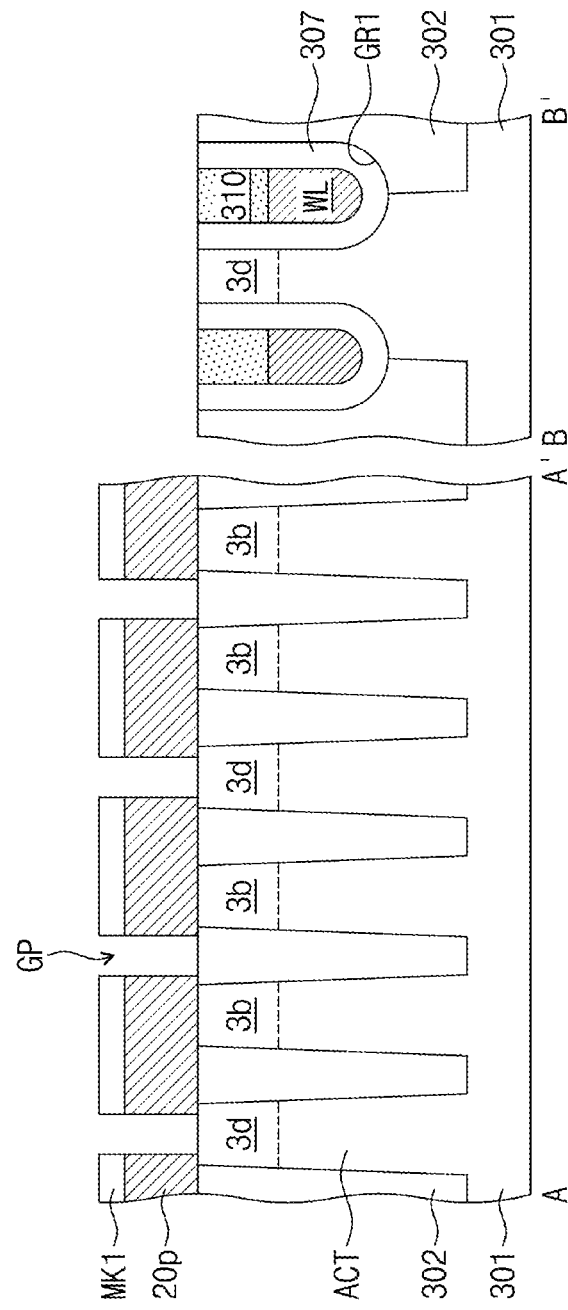

Referring to FIGS. 6 and 7, first mask patterns MK1 may be formed on the first conductive layer 20. The first mask patterns MK1 may be formed of or include a material (e.g., one of silicon oxide, silicon nitride, and silicon oxynitride) having an etch selectivity with respect to the first conductive layer 20. The first mask patterns MK1 may be rectangular patterns, which are two-dimensionally arranged in the second and third directions D2 and D3 to form an array. The first mask patterns MK1 may be vertically overlapped with the second impurity regions $3b$. First conductive patterns 20*p* and gap regions GP between the first conductive patterns 20*p* may be formed by etching the first conductive layer 20 by using the first mask patterns MK1 as an etch mask. The gap regions GP may be formed to partially expose the device isolation pattern 302, the active portions ACT, the word line capping pattern 310, and the gate dielectric layer 307.

Figure 8:
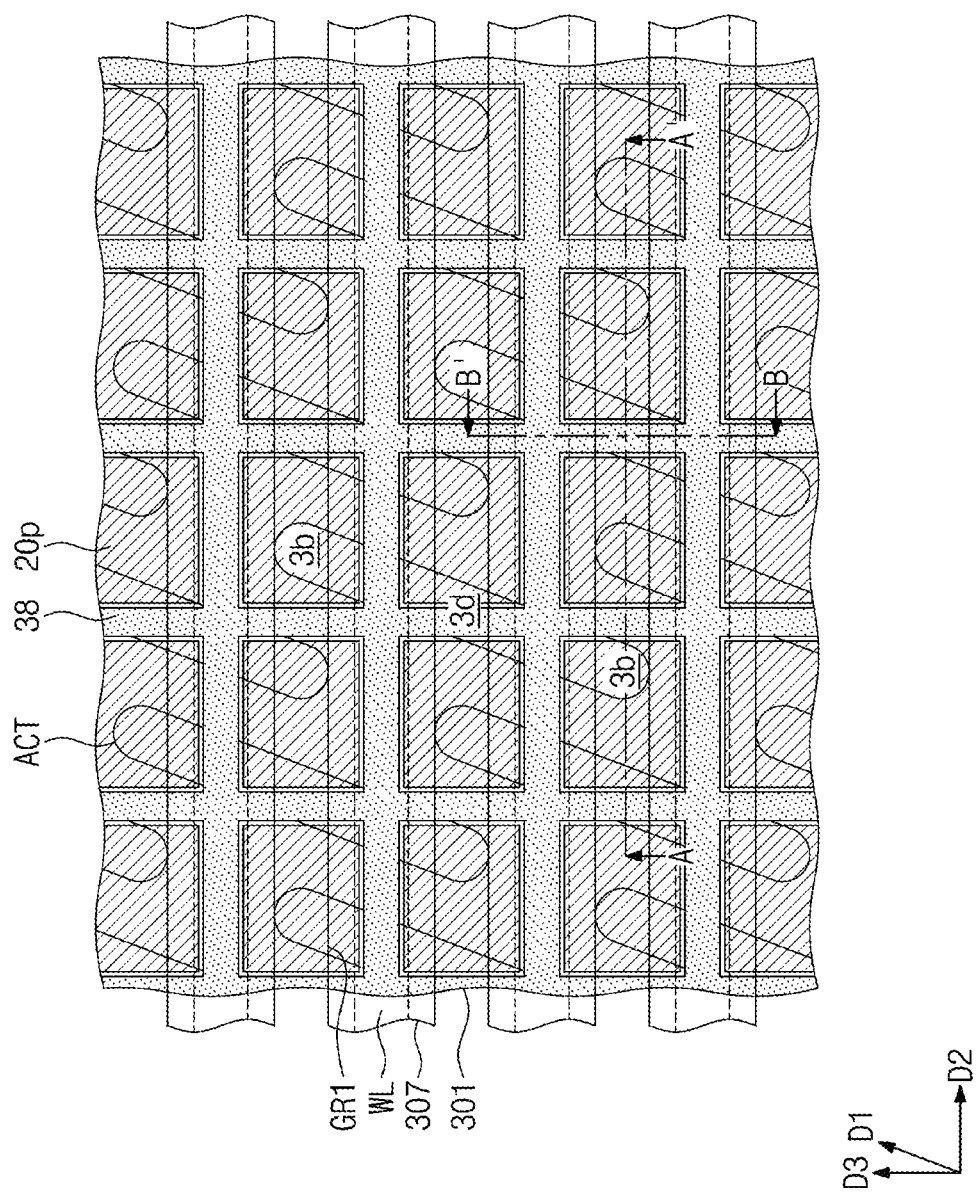
Figure 9:
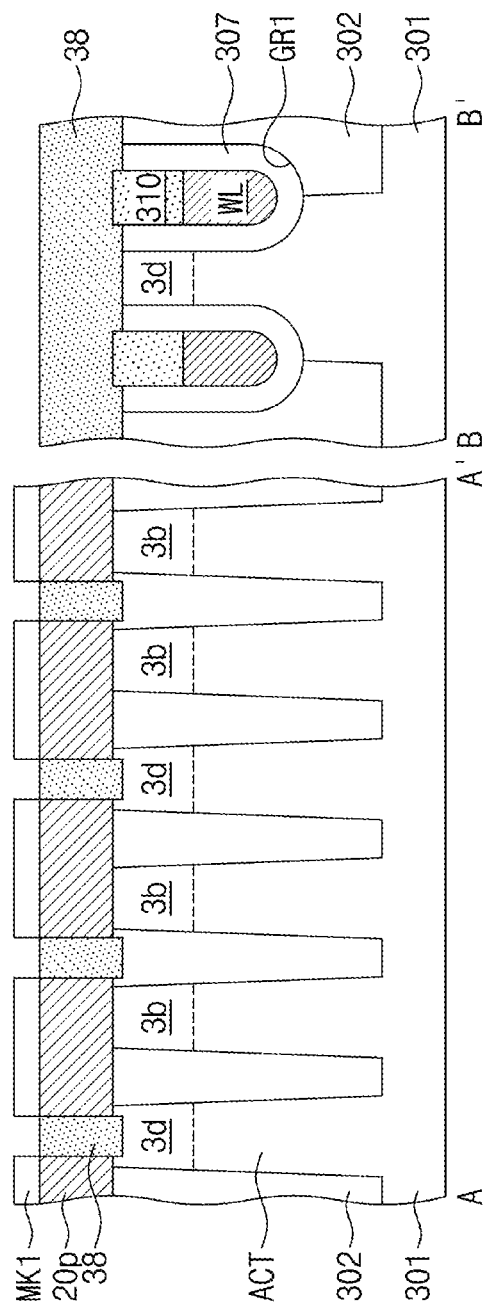

Referring to FIGS. 8 and 9, an upper portion of the device isolation pattern 302 may be selectively removed. In this step, the gate dielectric layer 307 may also be partially removed. For example, an upper portion of the gate dielectric layer 307 may be removed. For example, the process of selectively removing the upper portion of the device isolation pattern 302 may be a wet etching process, which is performed by using an etchant (e.g., hydrofluoric acid (HF)) for silicon oxide. A side surface of the word line capping pattern 310 may also be partially exposed. Furthermore, an upper portion of the active portion ACT with the first impurity region $3d$ may also be partially removed.

The pad separation pattern 38 may be formed in the gap region GP by forming a pad separation layer to fill the gap regions GP and by performing an etch-back process. The pad separation pattern 38 may have a lattice shape, when viewed in a plan view. The pad separation pattern 38 may be formed of or include, for example, silicon nitride.

Figure 10:
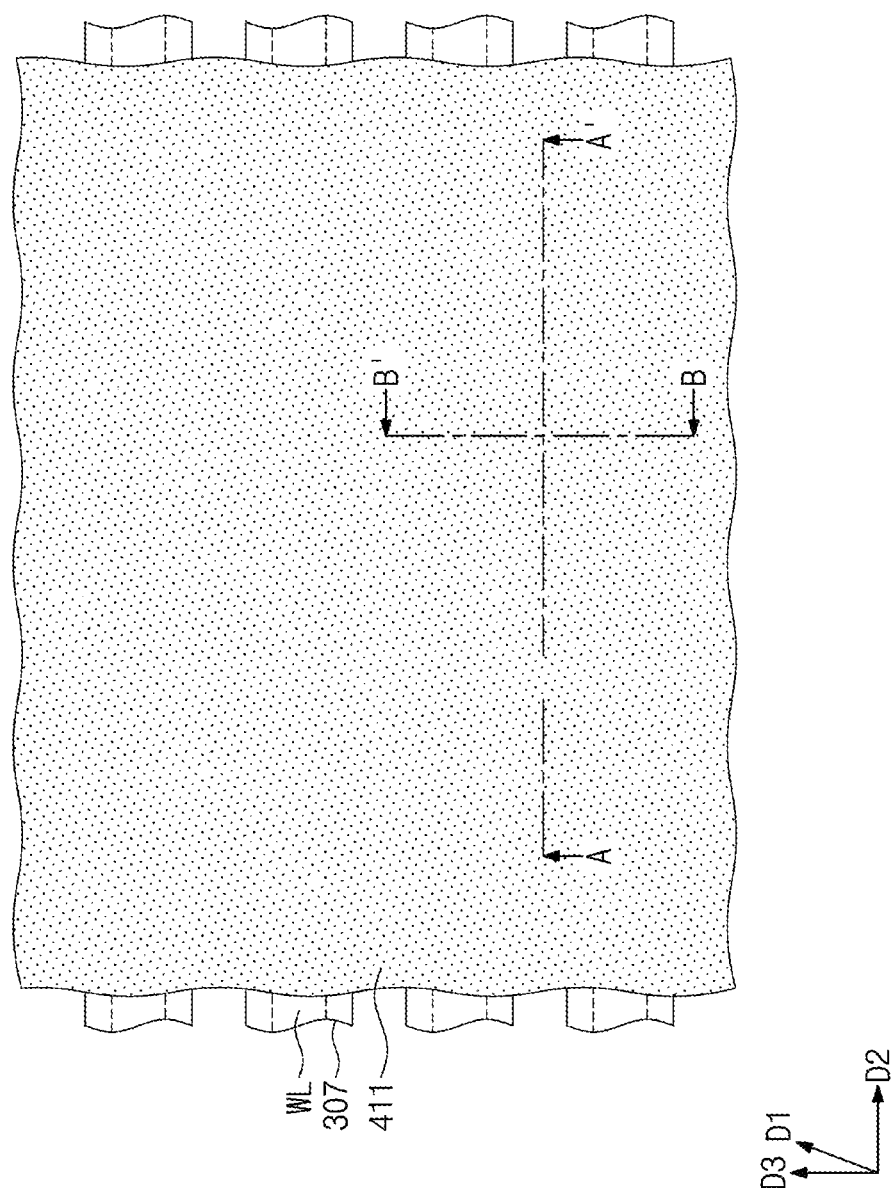
Figure 11:
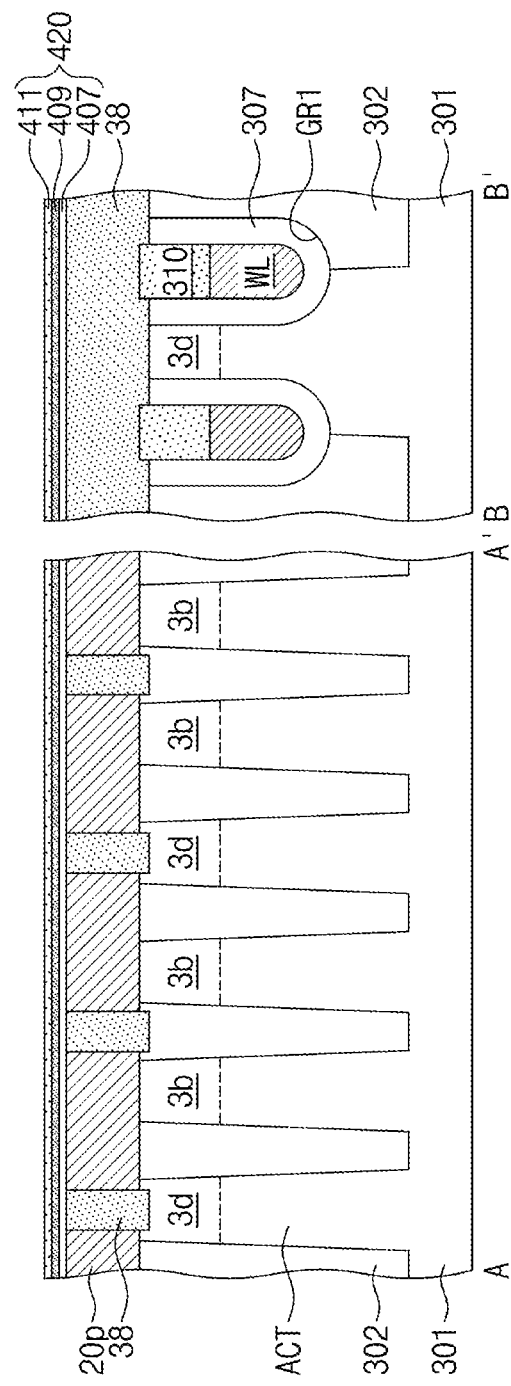

Referring to FIGS. 10 and 11, the first mask patterns MK1 may be removed to expose top surfaces of the first conductive patterns 20*p*. The buffer layer 420 may be formed on the first conductive patterns 20*p* and the pad separation pattern 38. The buffer layer 420 may include the first to third buffer layers 407, 409, and 411, which are sequentially stacked on each other. In an embodiment of the present inventive concept, the first buffer layer 407 may be formed of or include silicon oxide, and the second buffer layer 409 may be formed of or include silicon nitride. The third buffer layer 411 may be formed of or include silicon oxynitride.

Figure 12:
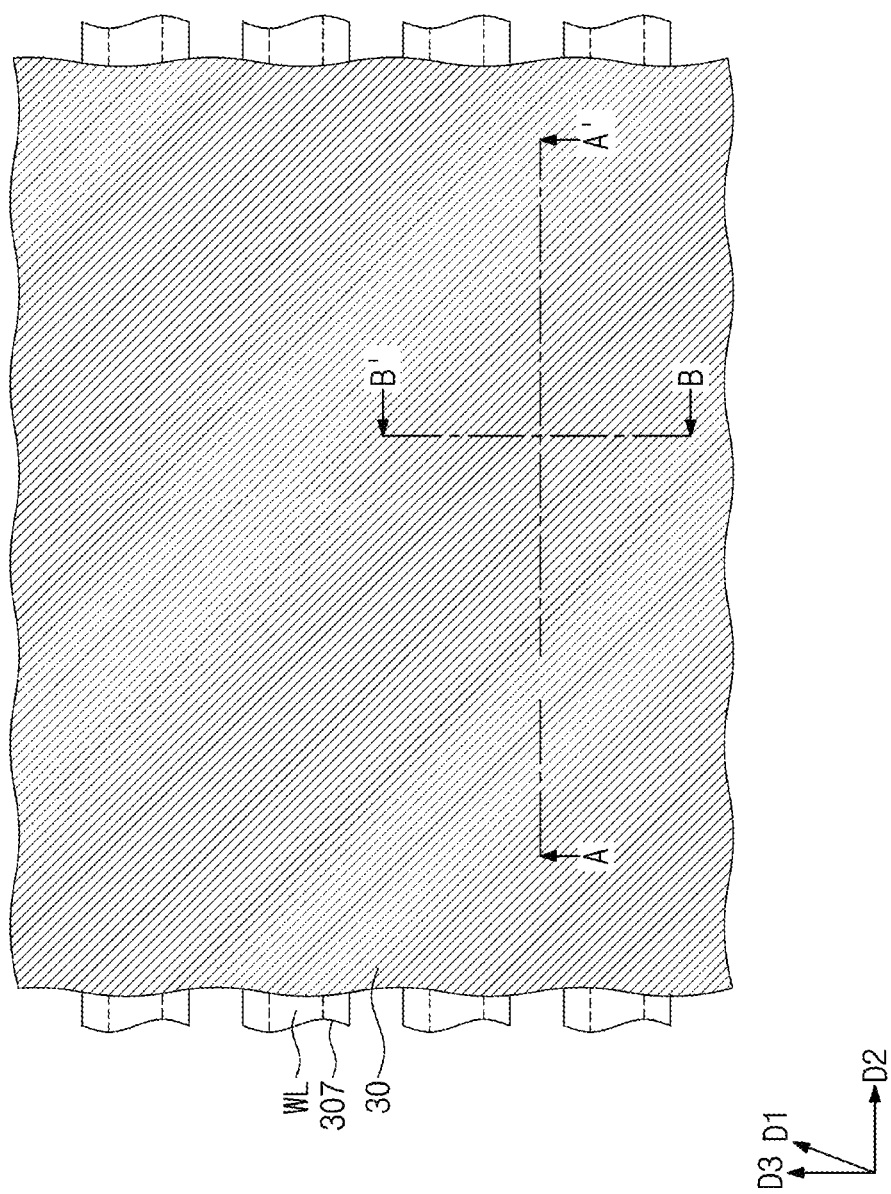
Figure 13:
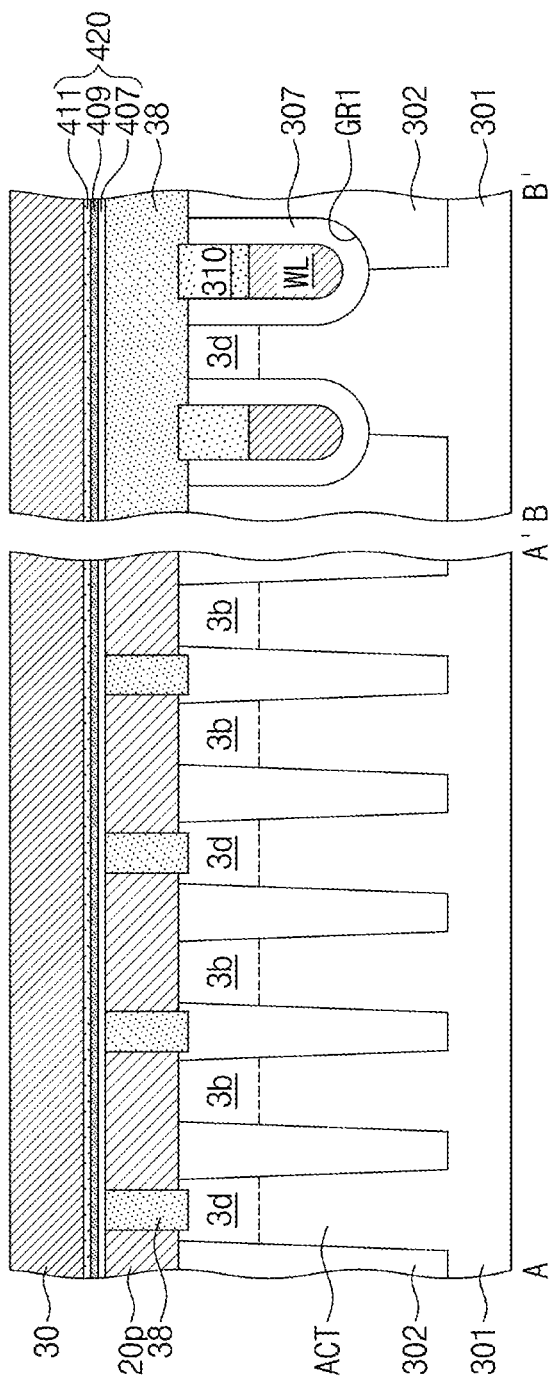

Referring to FIGS. 12 and 13, a second conductive layer 30 may be formed on the buffer layer 420. For example, the second conductive layer 30 may be a doped poly-silicon layer. The formation of the second conductive layer 30 may include depositing a poly-silicon layer and doping the poly-silicon layer through an ion implantation process. In addition, the second conductive layer 30 may be formed by depositing a poly-silicon layer, and here, the poly-silicon layer may be doped in situ with impurities during its deposition process.

Figure 14:
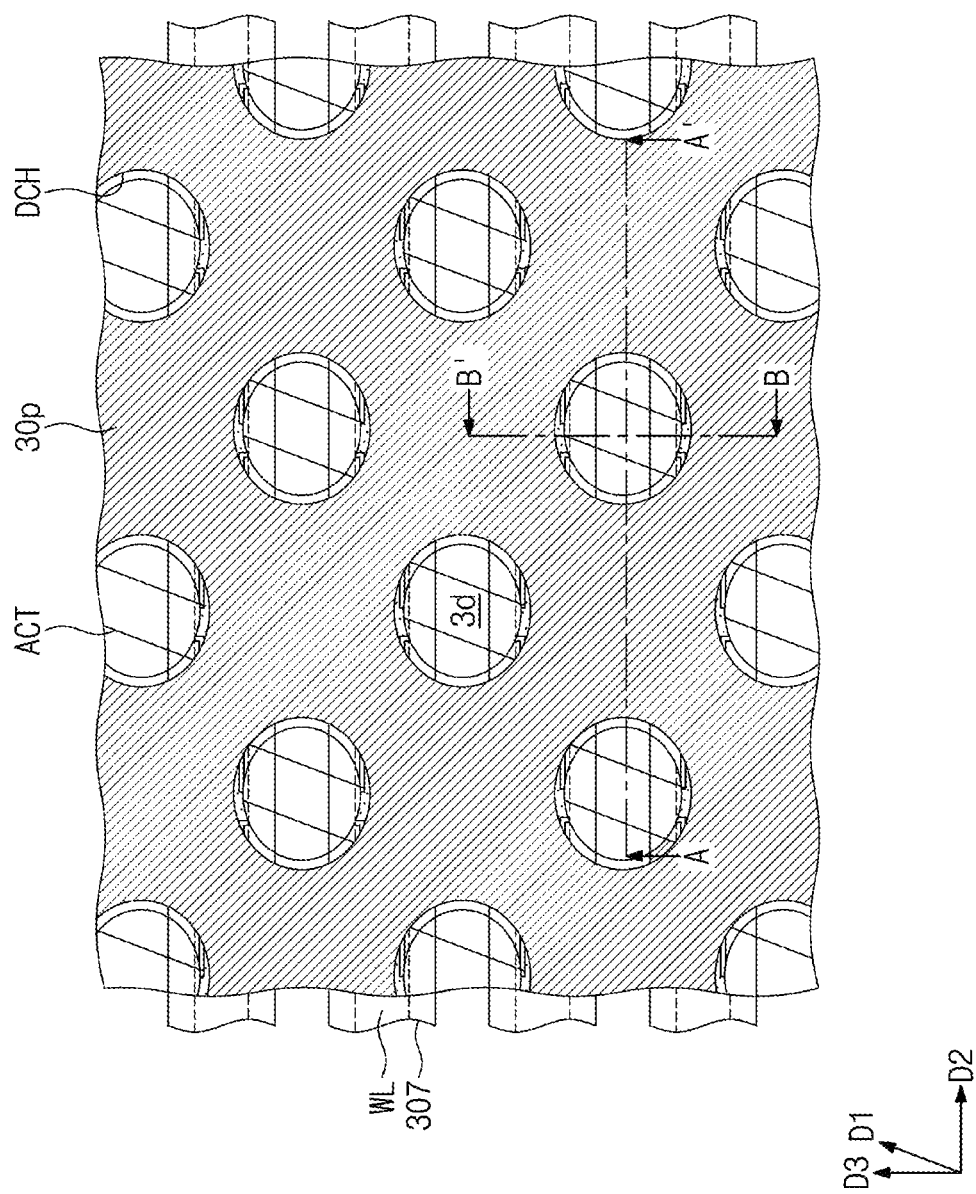
Figure 15:
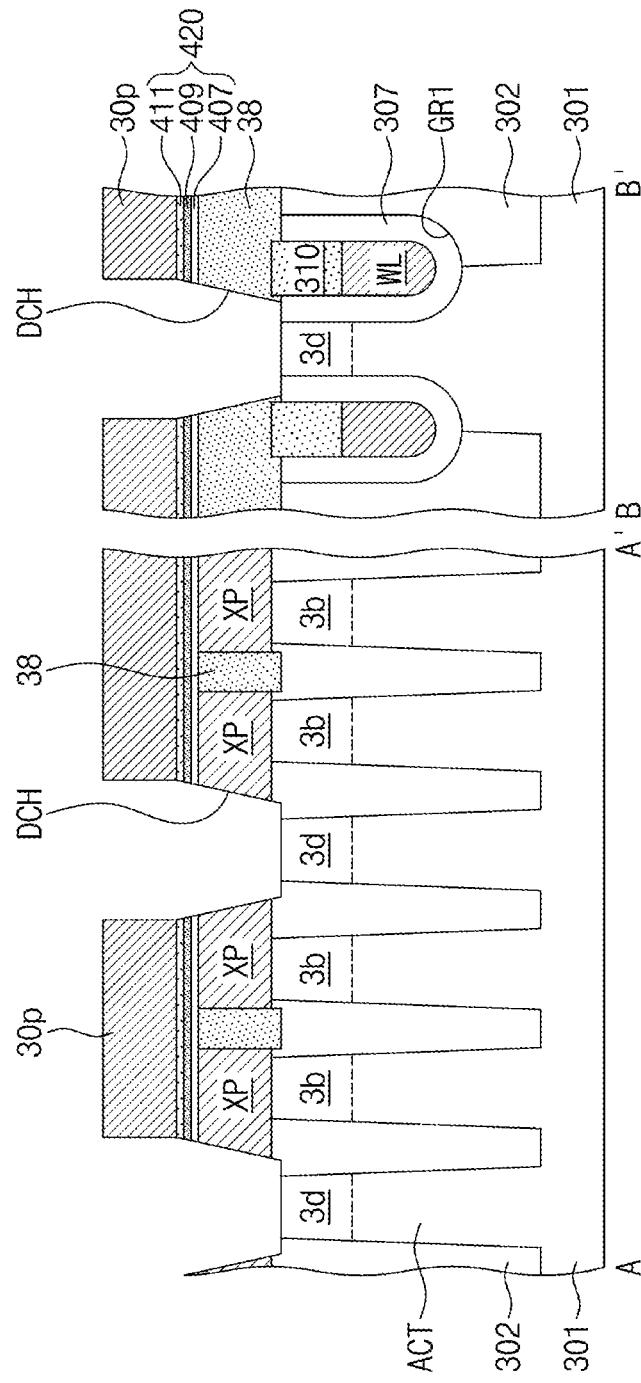

Referring to FIGS. 14 and 15, second mask patterns may be formed on the second conductive layer 30. The second conductive layer 30, the buffer layer 420, and the pad separation pattern 38 on the first impurity regions 3$d$ may be etched using the second mask patterns as an etch mask. Accordingly, the contact holes DCH may be formed to expose the first impurity regions 3$d$. A width of the contact hole DCH may decrease as a distance to the substrate 301 decreases. Here, the first conductive patterns 20$p$, which are adjacent to the pad separation pattern 38, may be partially etched to form the storage node pads XP. The second conductive layer 30 may be etched to form second conductive patterns 30$p$, which are spaced apart from each other.

Figure 16:
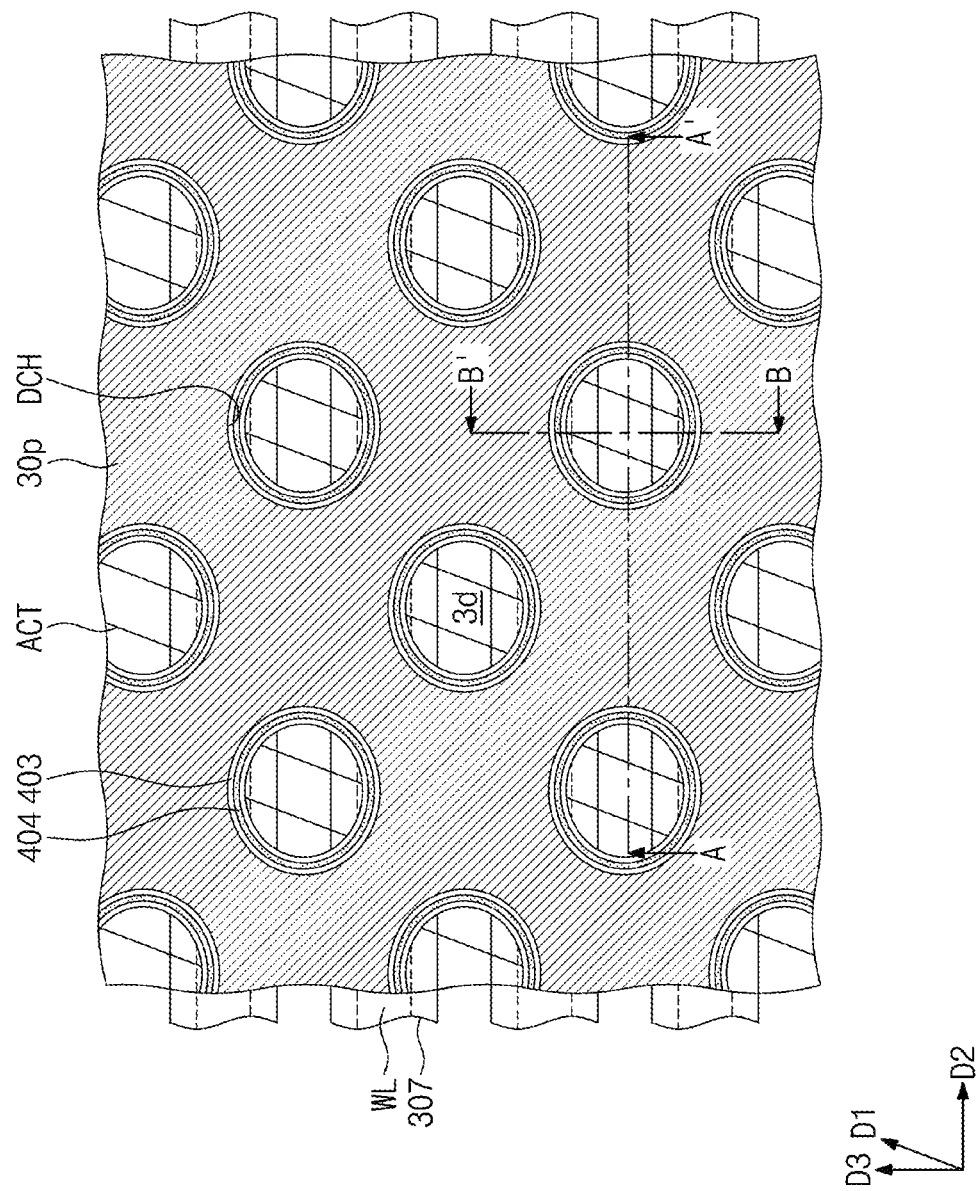
Figure 17:
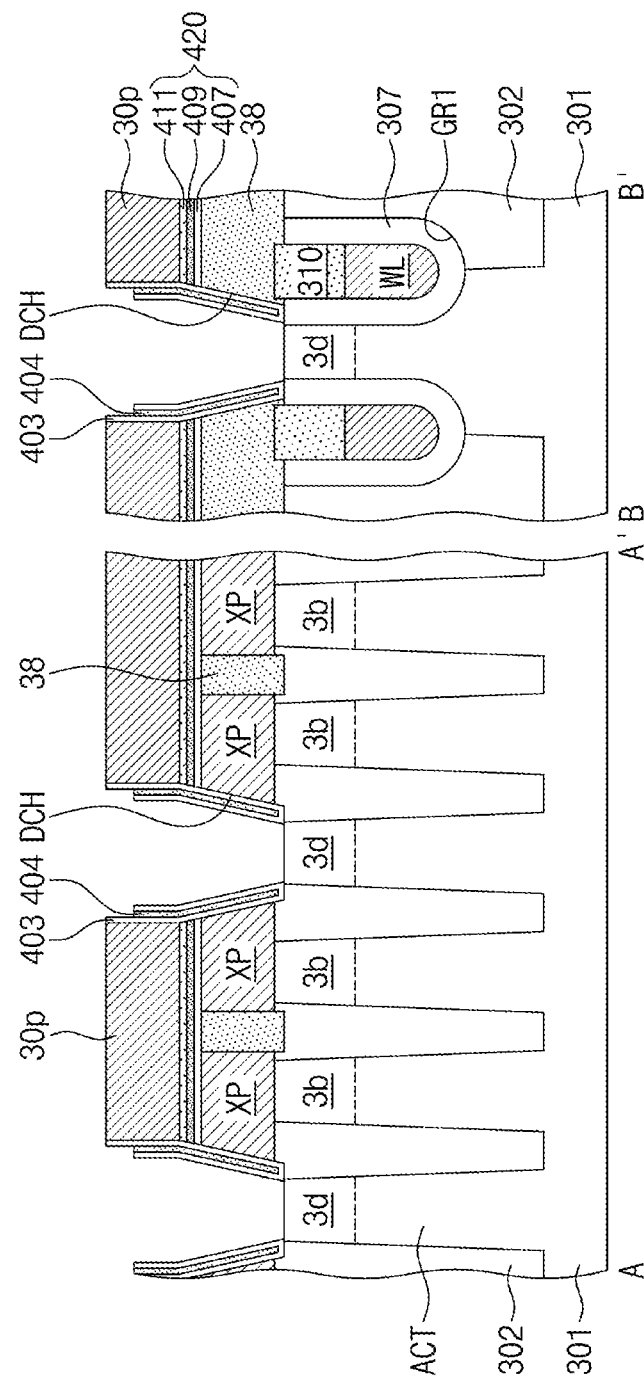

Referring to FIGS. 16 and 17, a first contact insulating layer may be conformally formed on the substrate 301. In an embodiment of the present inventive concept, the first contact insulating layer may be formed of or include silicon nitride. A portion of the first contact insulating layer may be etched to expose the first impurity region 3$d$. A sacrificial layer may be conformally formed on the entire top surface of the substrate 301. The sacrificial layer may be formed of or include a material having an etch selectivity with respect to the first contact insulating layer. In an embodiment of the present inventive concept, the sacrificial layer may be formed of or include silicon oxide. A portion of the sacrificial layer may be selectively etched to expose the first impurity region 3$d$ and a top surface of the first contact insulating layer. A second contact insulating layer may be conformally formed on the entire top surface of the substrate 301. The second contact insulating layer may be formed of or include the same material as the first contact insulating layer. A portion of the second contact insulating layer may be selectively etched to expose the first impurity region 3$d$, the sacrificial layer, and the top surface of the first contact insulating layer. As a result, the first contact insulating pattern 403 and a sacrificial pattern 404 may be formed to sequentially cover inner side surfaces of the contact holes DCH. The first contact insulating pattern 403 may have a U-shaped profile. The sacrificial pattern 404 may be spaced apart from the inner side surface of the contact hole DCH by the first contact insulating pattern 403. A top surface of the sacrificial pattern 404 may be located at a level lower than the uppermost surface of the first contact insulating pattern 403.

Figure 18:
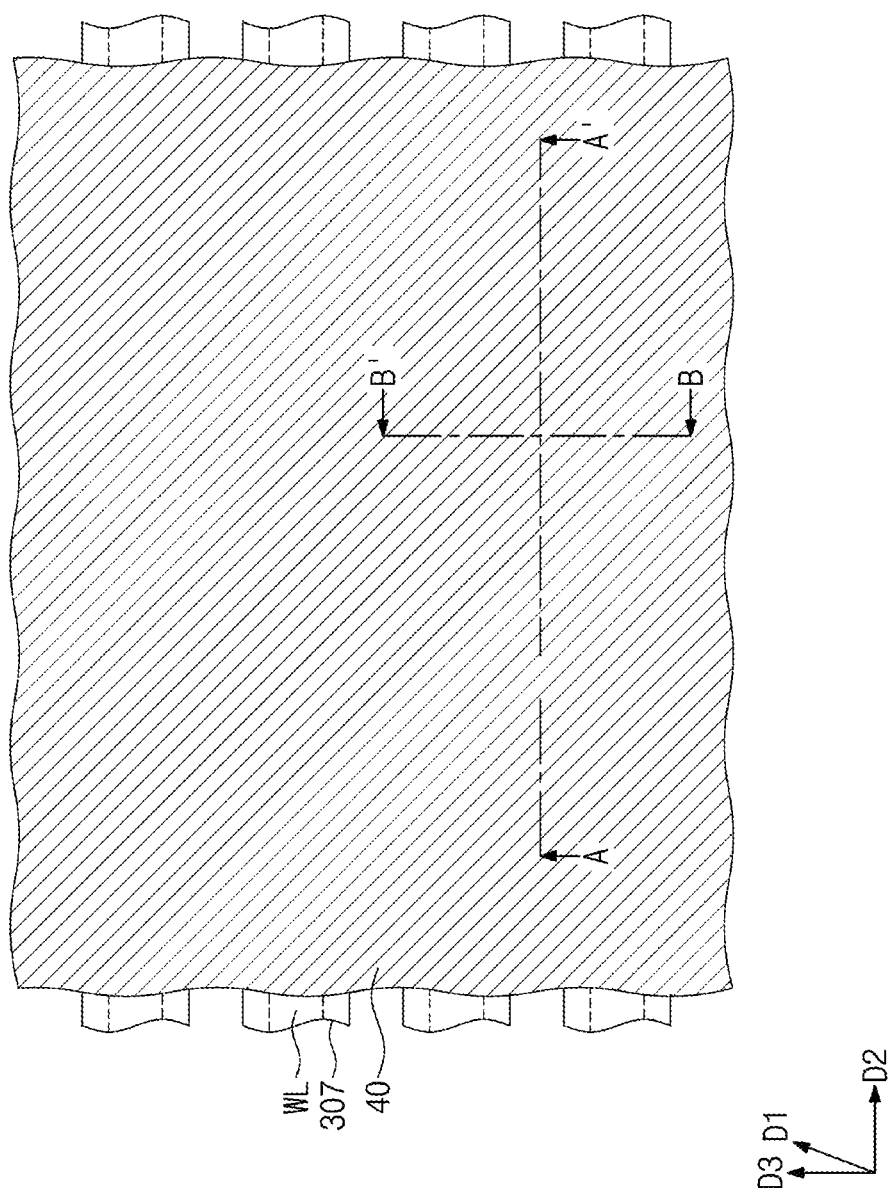
Figure 19:
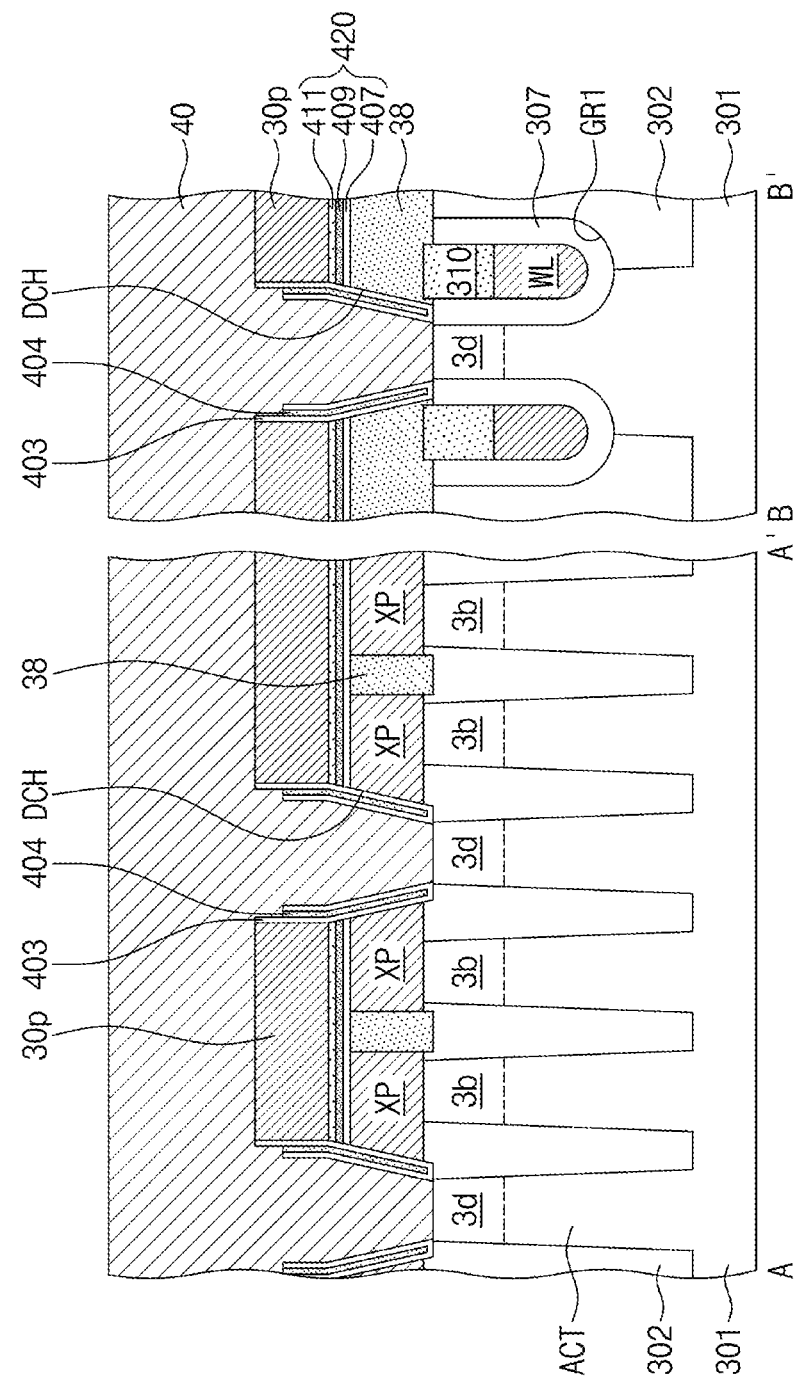

Referring to FIGS. 18 and 19, a third conductive layer 40 may be formed on the substrate 301. For example, the third conductive layer 40 may be formed on the entire top surface of the substrate 301. In an embodiment of the present inventive concept, the third conductive layer 40 may be a doped poly-silicon layer. The third conductive layer 40 may be formed to fill a remaining portion of the contact hole DCH. A top surface of the third conductive layer 40 may be located at a level higher than top surfaces of the second conductive patterns 30$p$.

Figure 20:
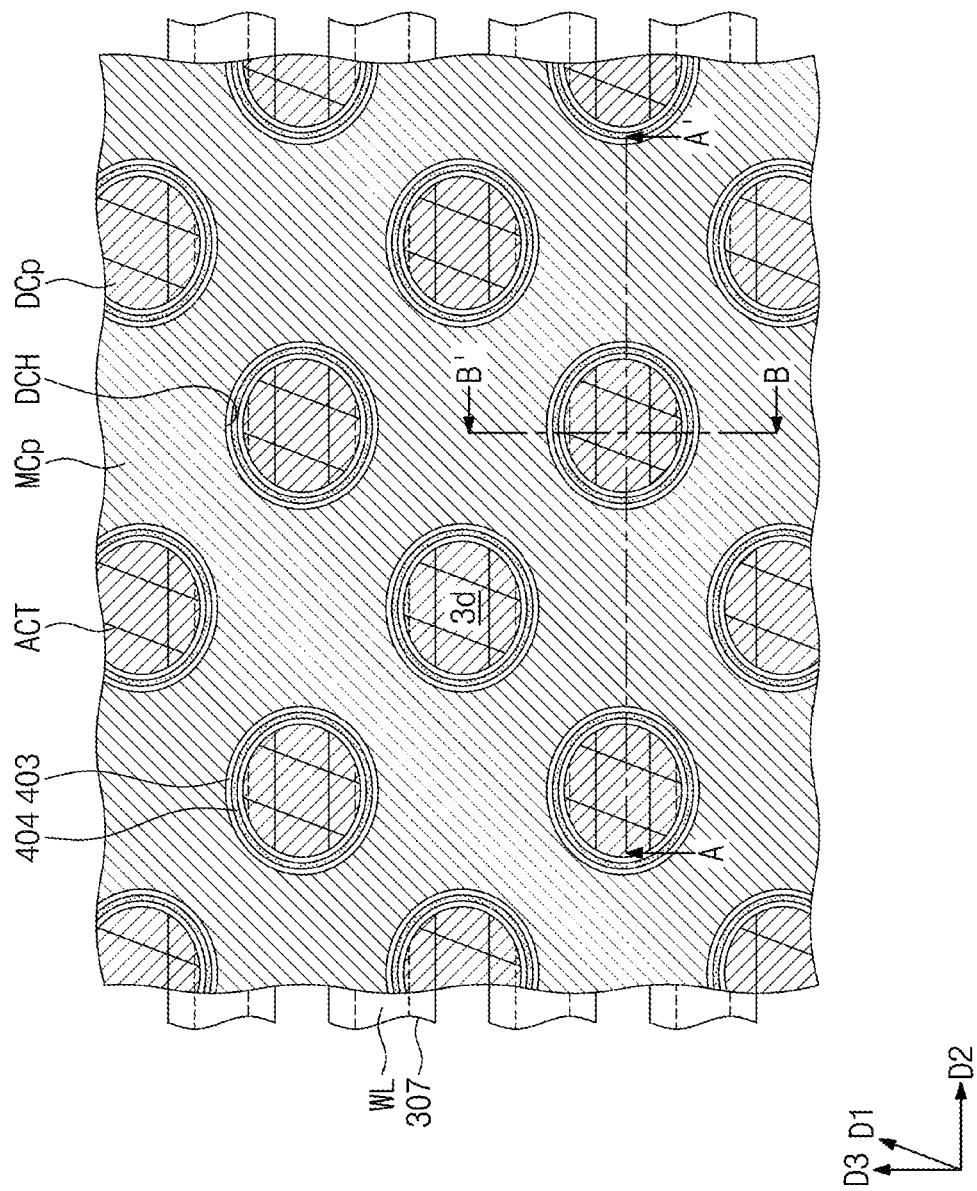
Figure 21:
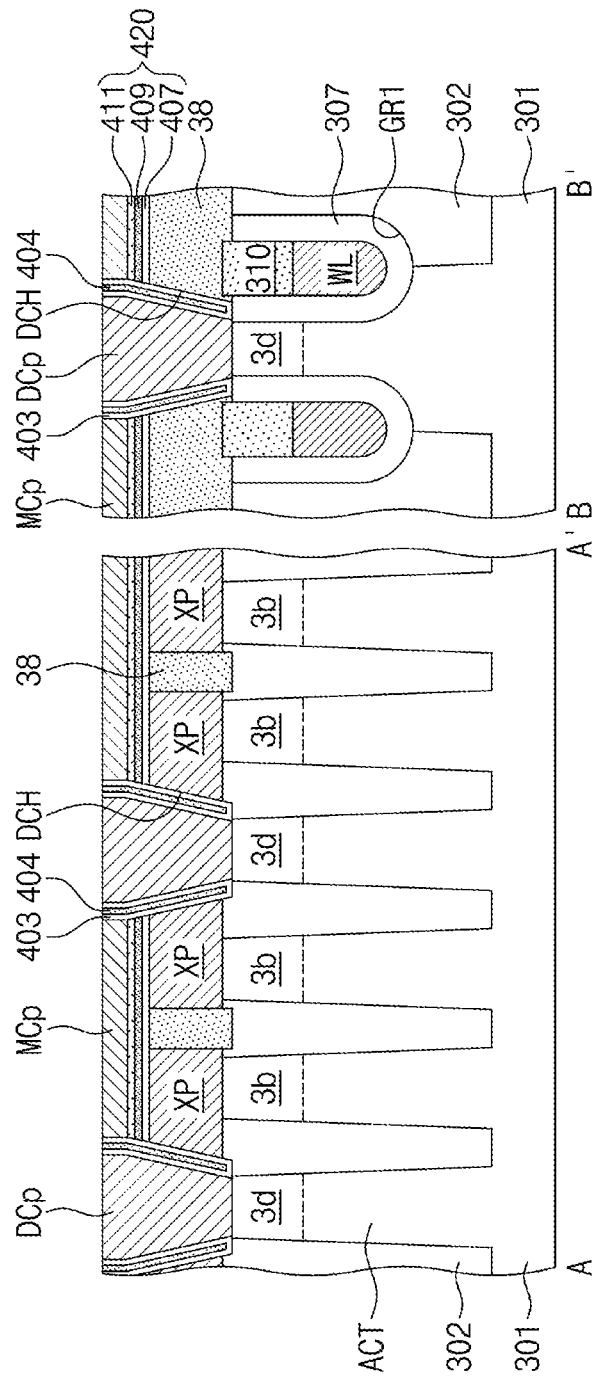

Referring to FIGS. 20 and 21, a planarization process may be performed on the third conductive layer 40. The planarization process may be performed such that a top surface of the first contact insulating pattern 403 is located at substantially the same level as the top surface of the sacrificial pattern 404. The planarization process may be performed to expose the top surface of the first contact insulating pattern 403 and the top surface of the sacrificial pattern 404. As a result of the planarization process, the third conductive layer 40 may be etched to form a preliminary bit line contact DCp in the contact hole DCH. As a result of the planarization process, the second conductive patterns 30$p$ may be etched to form a preliminary mask polysilicon pattern MCp on the buffer layer 420.

Figure 22:
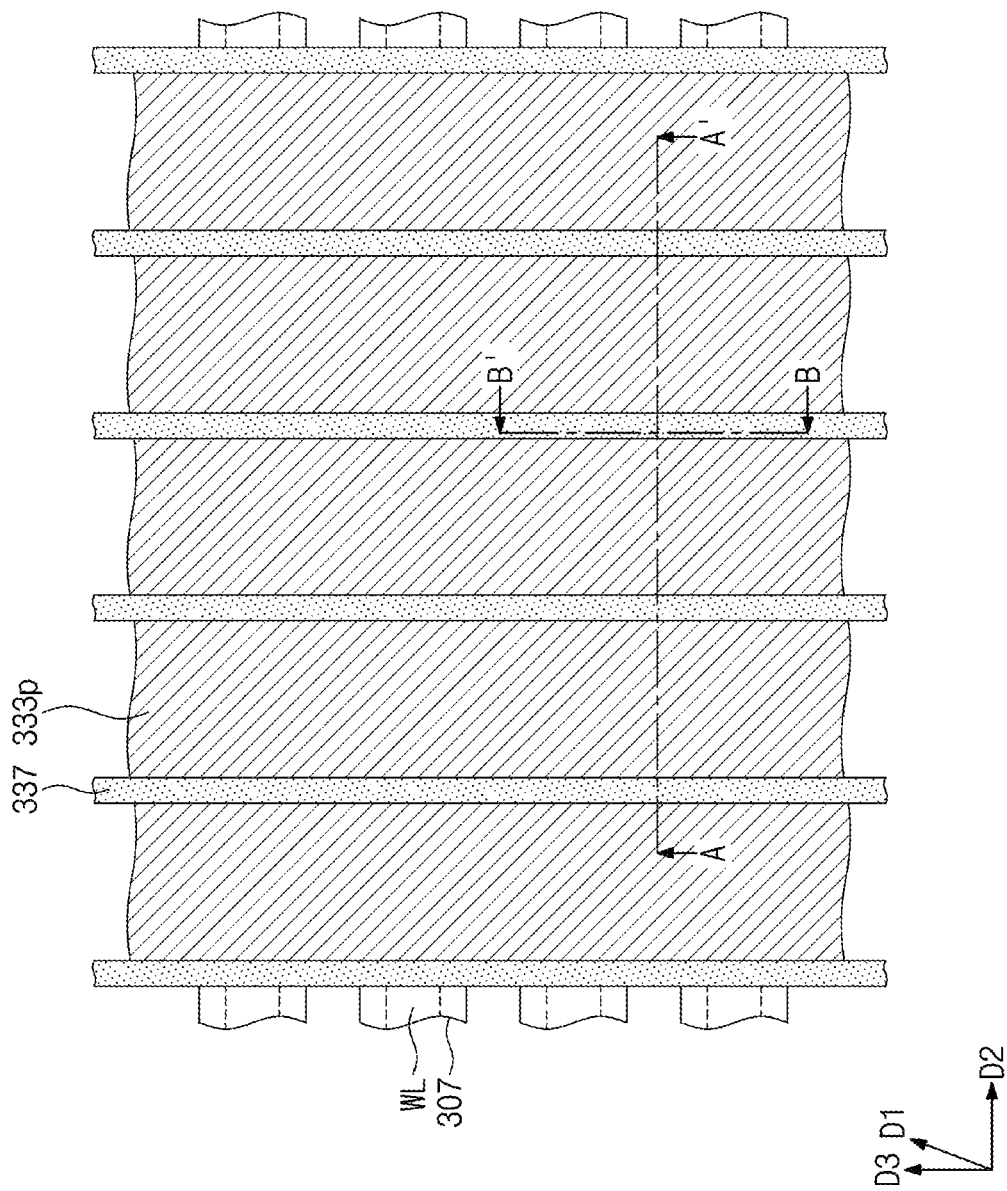
Figure 23:
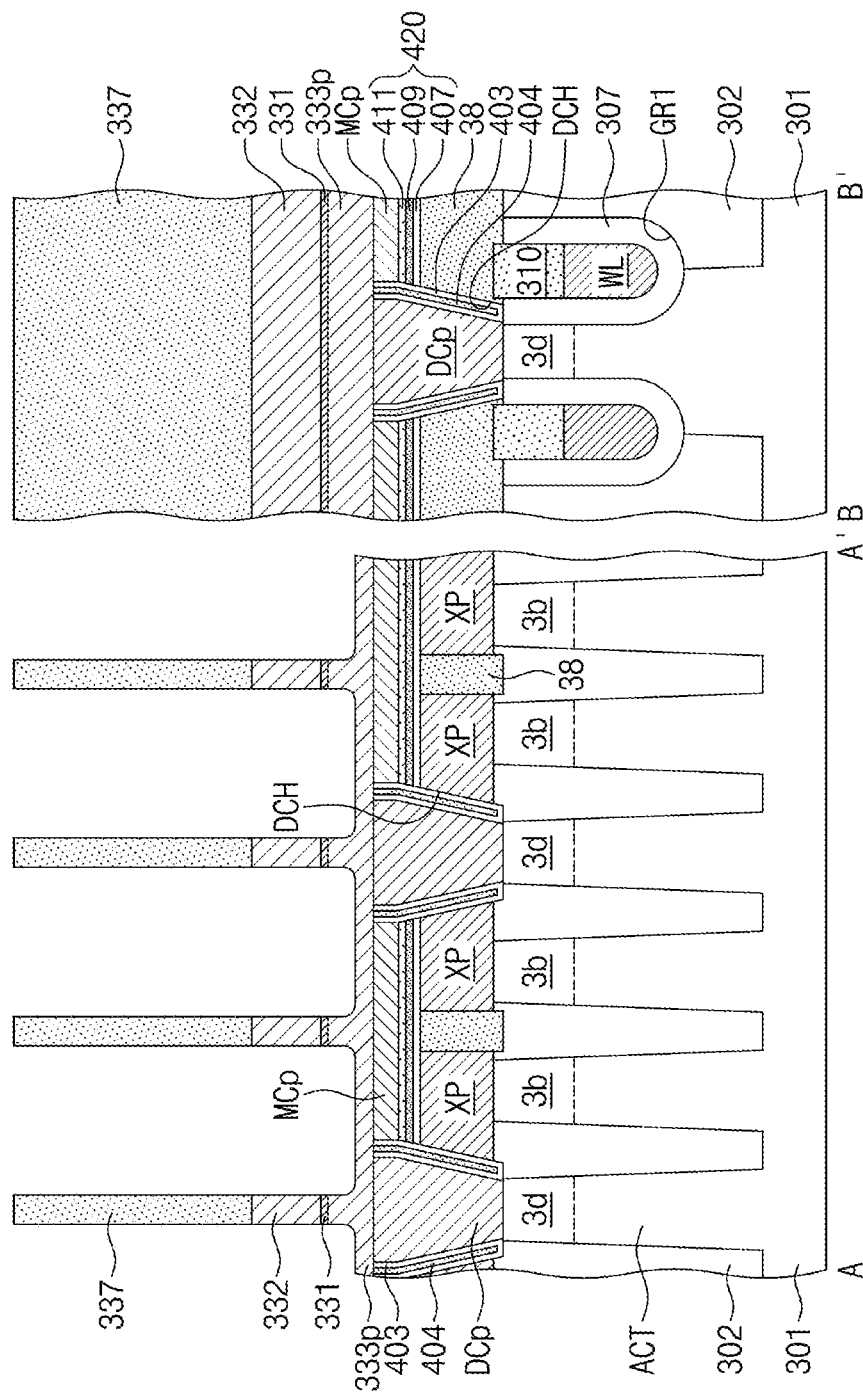

Referring to FIGS. 22 and 23, a poly-silicon layer, a bit line diffusion barrier layer, a bit line interconnection layer, and a bit line capping layer may be sequentially formed on the top surface of the substrate 301. For example, the poly-silicon layer, the bit line diffusion barrier layer, the bit line interconnection layer, and the bit line capping layer may be sequentially formed on the top surface of the substrate 301. In an embodiment of the present inventive concept, the poly-silicon layer may be doped with impurities.

Third mask patterns may be formed on the bit line capping layer. The bit line capping layer, the bit line interconnection layer, the bit line diffusion barrier layer, and the poly-silicon layer may be sequentially etched using the third mask patterns as an etch mask. Accordingly, the bit line capping pattern 337, the bit line interconnection pattern 332, the bit line diffusion prevention pattern 331, and a preliminary bit line polysilicon pattern 333$p$ may be formed. A top surface of the preliminary bit line polysilicon pattern 333$p$ may be exposed by the etching process. The exposed top surface of the preliminary bit line polysilicon pattern 333$p$ may be located at a level lower than a bottom surface of the bit line diffusion prevention pattern 331.

Figure 24:
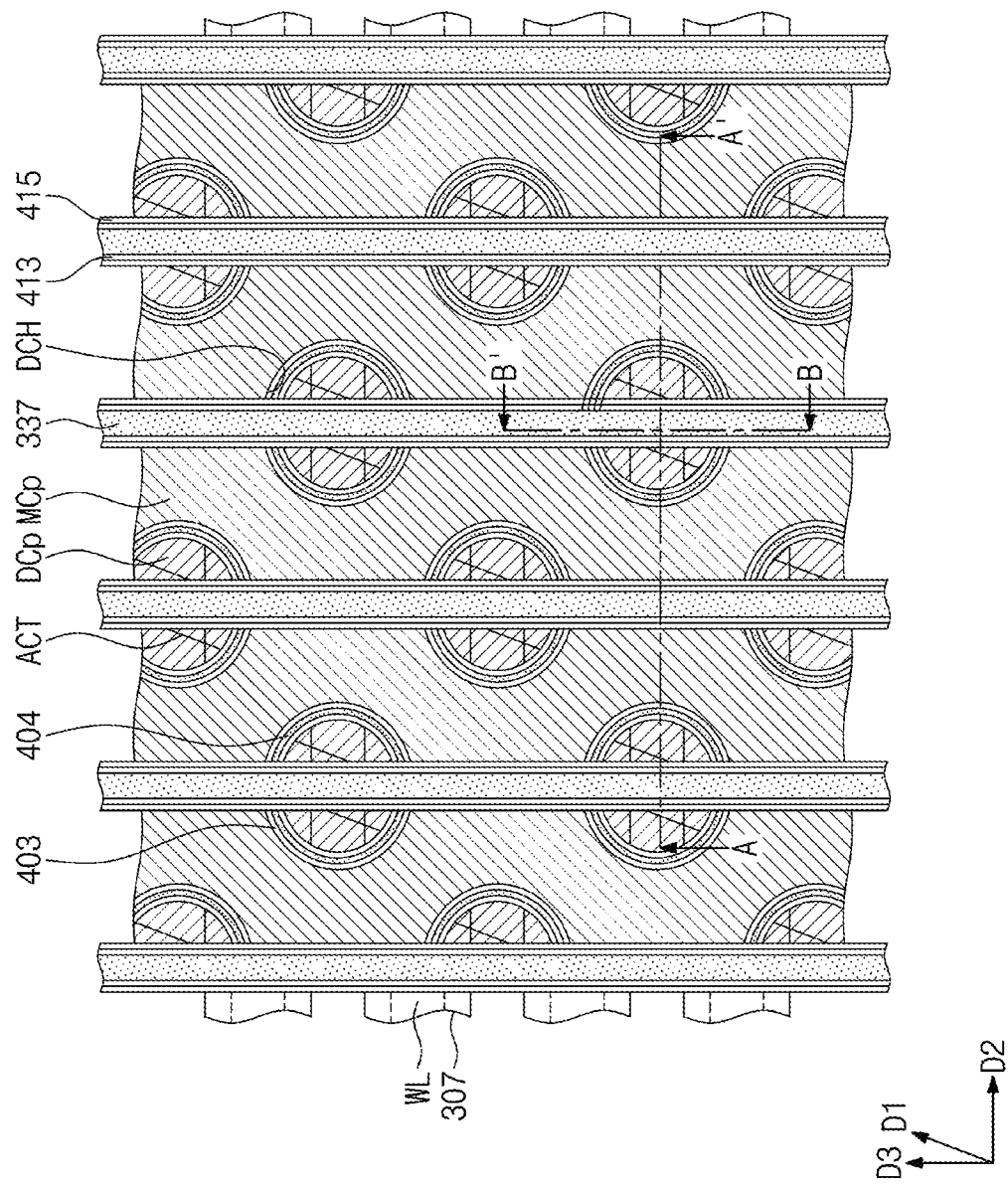
Figure 25:
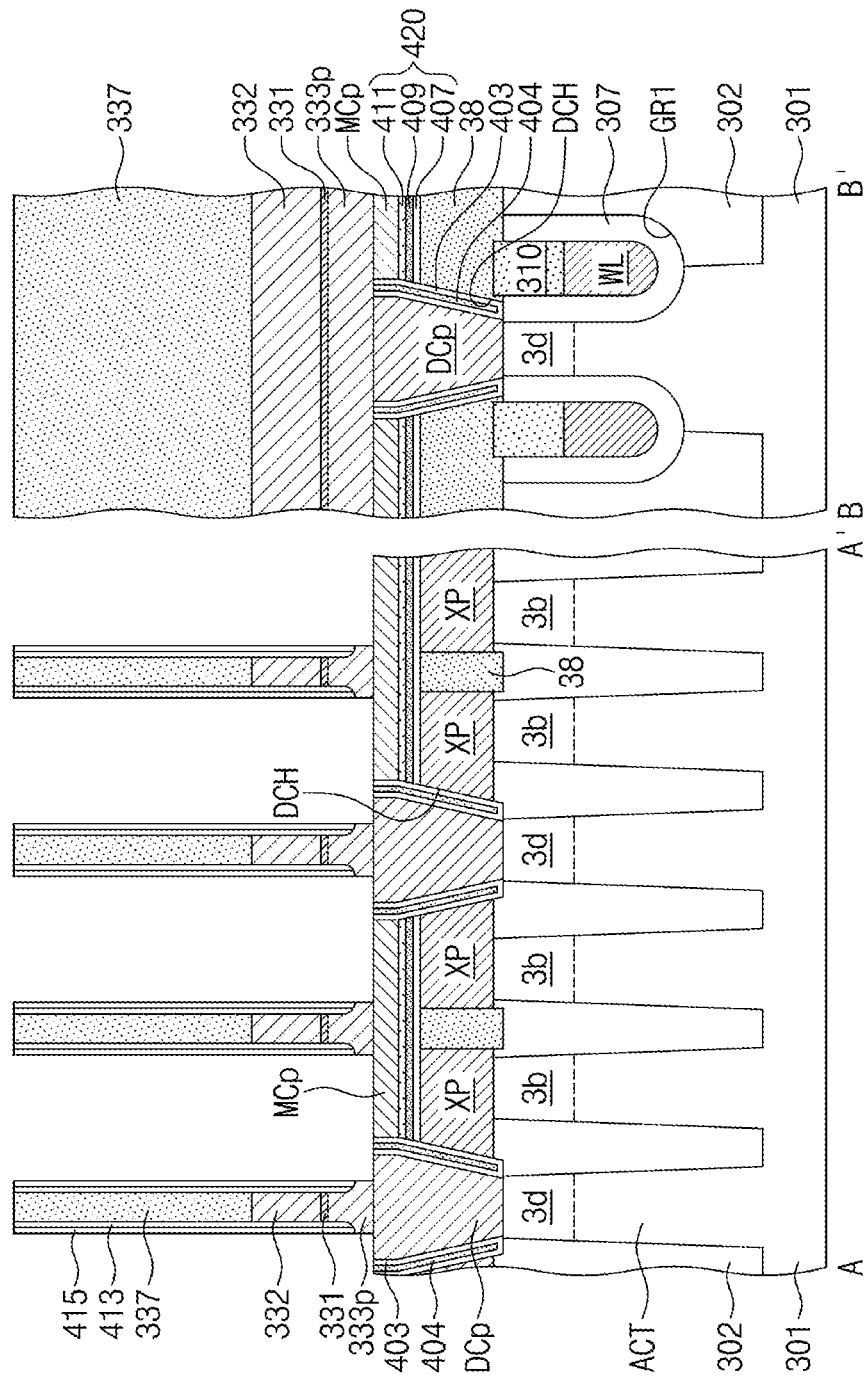

Referring to FIGS. 24 and 25, a first protection spacer 413 and a second protection spacer 415 may be sequentially formed to cover side surfaces of the bit line capping pattern 337, the bit line interconnection pattern 332, the bit line diffusion prevention pattern 331, and the preliminary bit line polysilicon pattern 333$p$. The first protection spacer 413 and the second protection spacer 415 may be formed of or include materials having an etch selectivity with respect to each other. In an embodiment of the present inventive concept, the first protection spacer 413 may be formed of or include silicon nitride, and the second protection spacer 415 may be formed of or include SiOC.

A portion of the preliminary bit line polysilicon pattern 333$p$ may be removed by using the bit line capping pattern 337, the bit line interconnection pattern 332, the bit line diffusion prevention pattern 331, the first protection spacer 413, and the second protection spacer 415 as an etch mask. Accordingly, the top surfaces of the first contact insulating pattern 403, the sacrificial pattern 404, and the preliminary mask polysilicon pattern MCp may be exposed to the outside.

Figure 26:
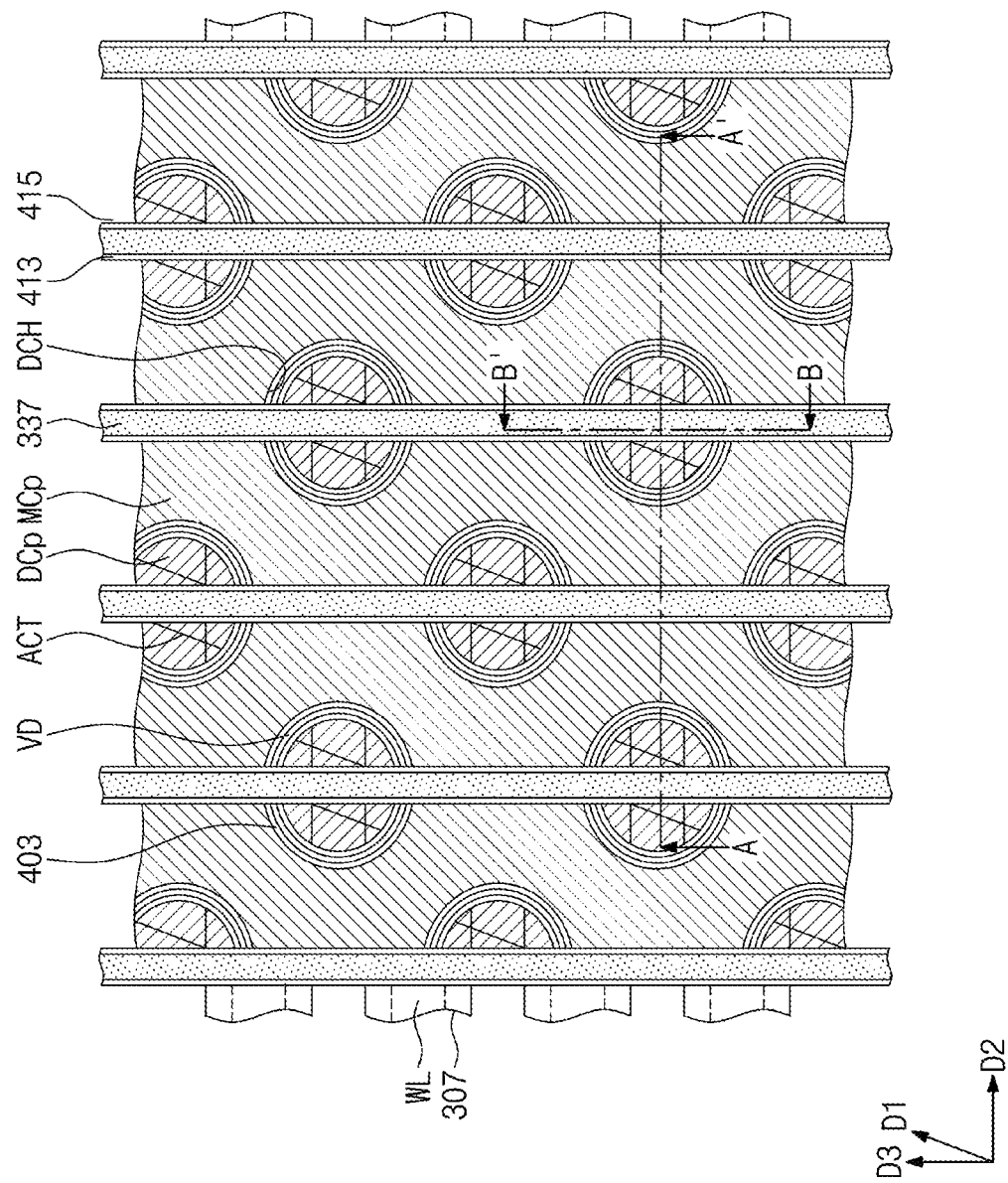
Figure 27:
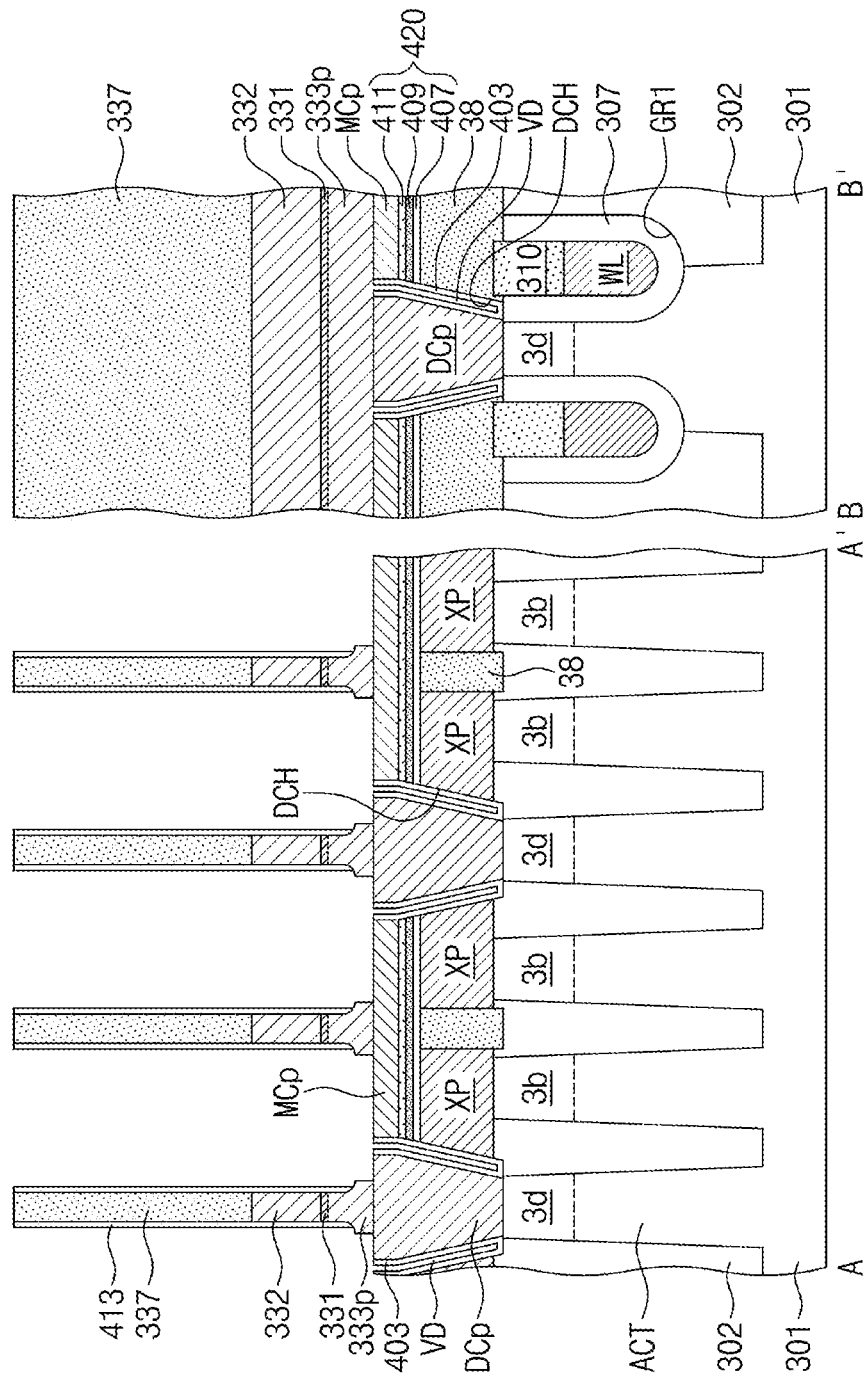

Referring to FIGS. 26 and 27, the sacrificial pattern 404 may be removed to form a void region VD. The void region VD may be formed on the first contact insulating pattern 403. When the sacrificial pattern 404 is removed, the second protection spacer 415 may also be removed to expose a side surface of the first protection spacer 413. The first protection spacer 413 may protect the bit line capping pattern 337, the bit line interconnection pattern 332, and the bit line diffusion prevention pattern 331. The void region VD may also be formed in a region below the preliminary bit line polysilicon pattern 333p.

Figure 28:
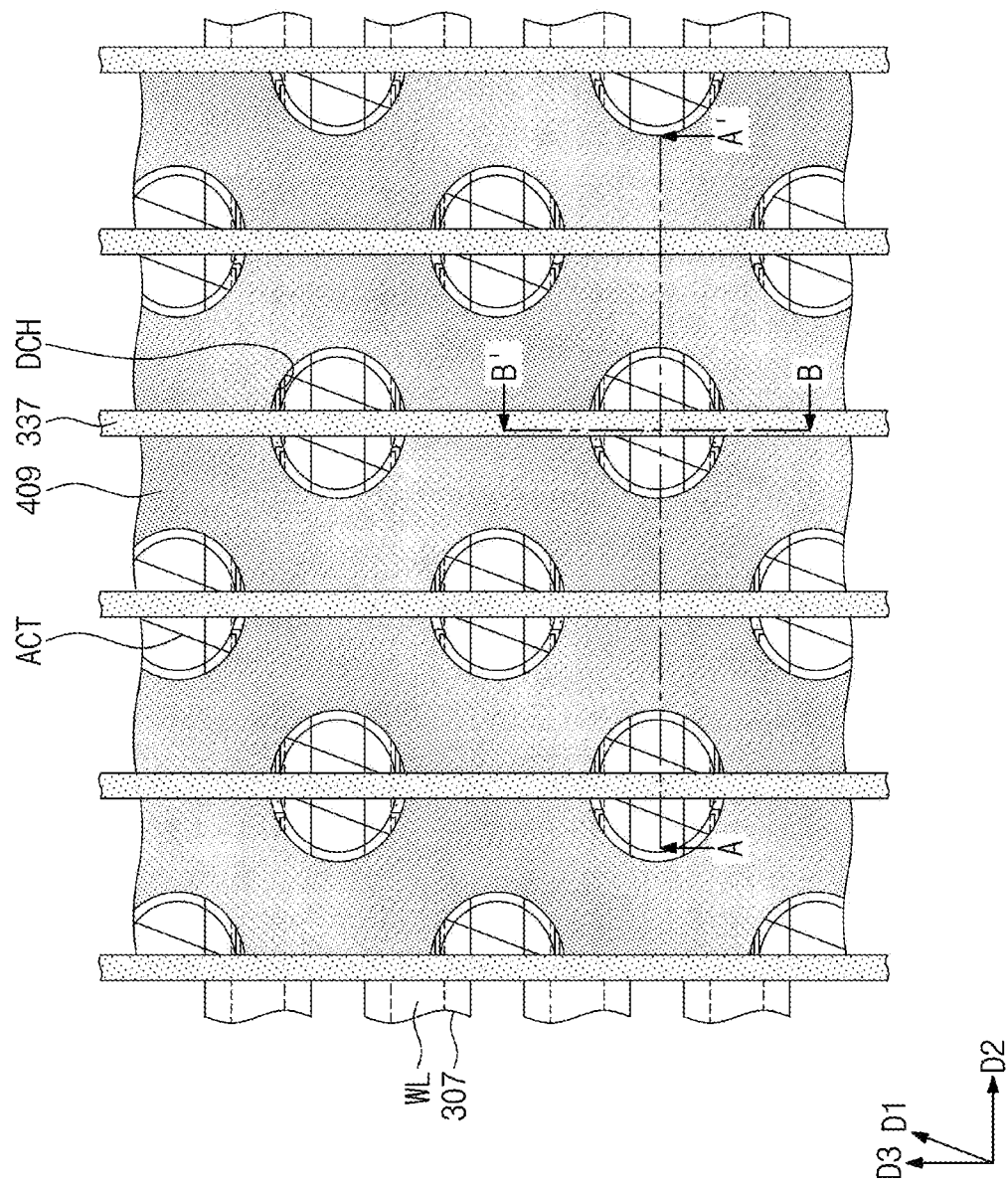
Figure 29:
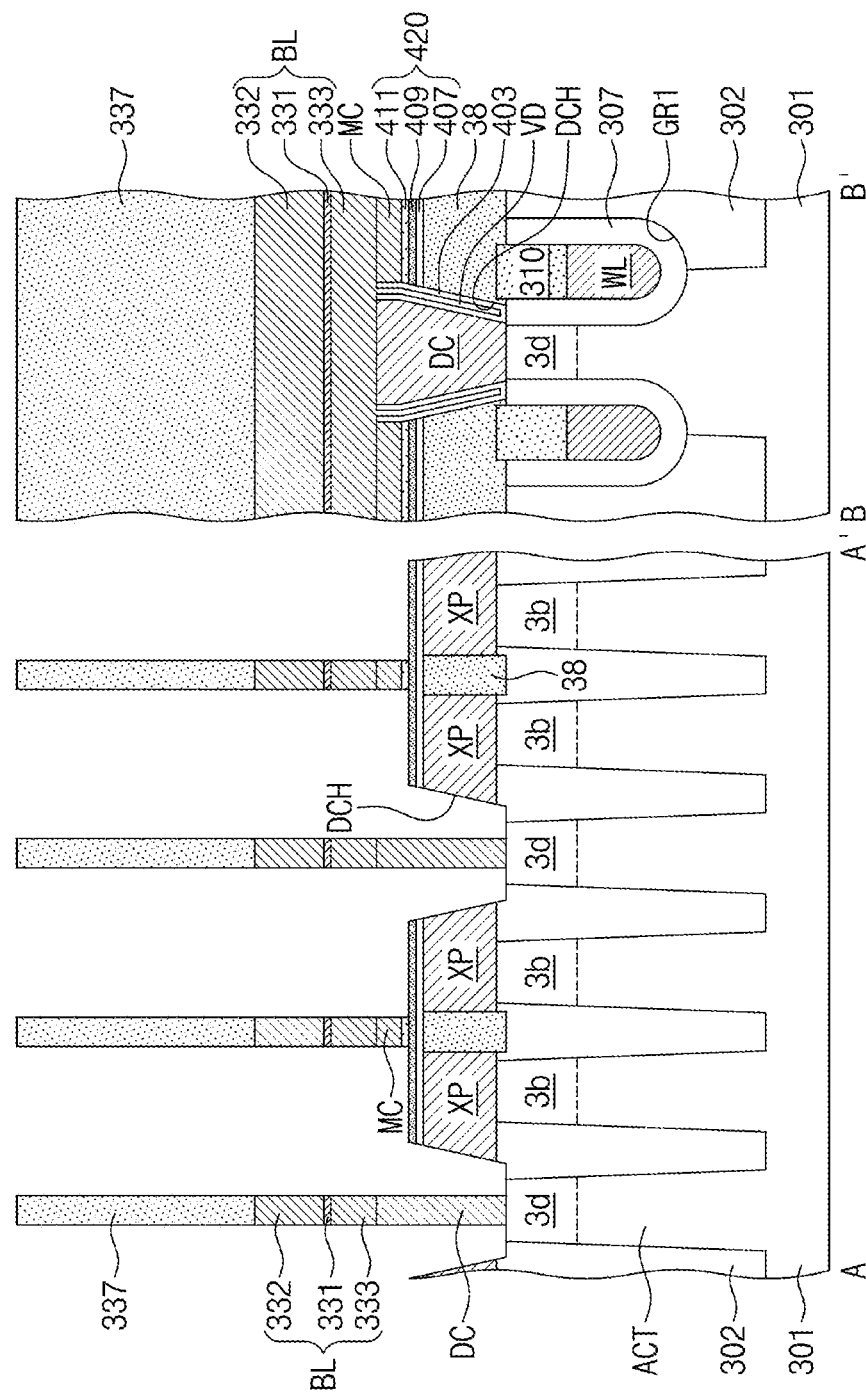

Referring to FIGS. 28 and 29, the first protection spacer 413 may be removed. The bit line polysilicon pattern 333 may be formed by etching the preliminary bit line polysilicon pattern 333p using the bit line capping pattern 337 as an etch mask. Here, due to the presence of the void region VD, an etchant, which is used to etch the preliminary bit line polysilicon pattern 333p, may be easily supplied into the contact hole DCH, and this may allow the bit line polysilicon pattern 333 to have a substantially uniform width regardless of the height or vertical level. The first contact insulating pattern 403 may prevent the storage node pad XP from being etched during the etching process. In an embodiment of the present inventive concept, a portion of the first contact insulating pattern 403 covering a side surface of the storage node pad XP may be removed during the etching process.

In the etching process, the preliminary mask polysilicon pattern MCp and the preliminary bit line contact DCp may also be etched using the bit line capping pattern 337 as etch mask. As a result, the mask polysilicon pattern MC and the bit line contact DC may be formed. Furthermore, in the etching process, the third buffer layer 411 may also be etched by using the bit line capping pattern 337 as an etch mask. The third buffer layer 411 may be formed to expose the top surface of the second buffer layer 409. As an example, the third buffer layer 411 may be etched to have a side surface that is substantially aligned to the side surface of the mask polysilicon pattern MC.

Figure 30:
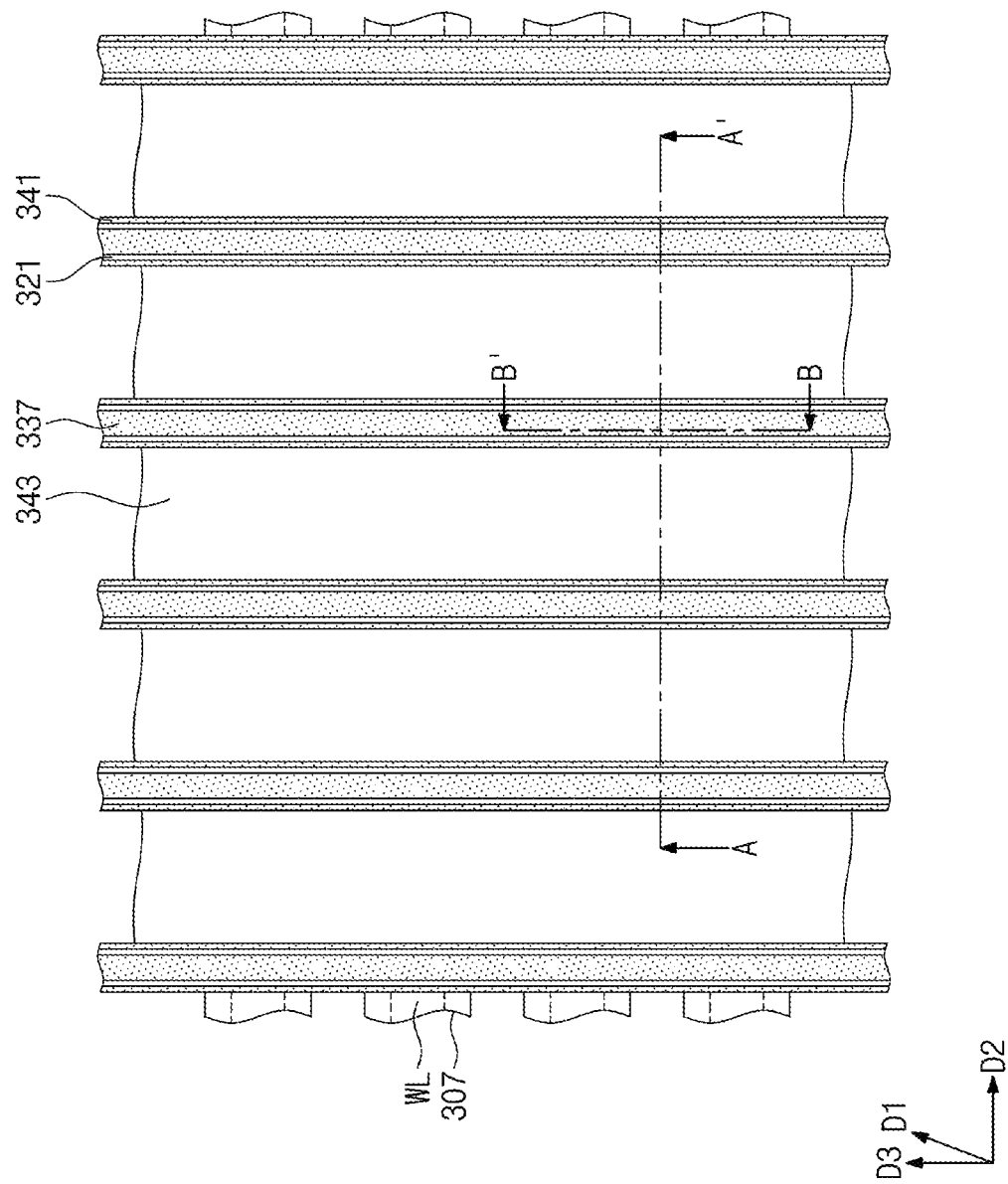
Figure 31:
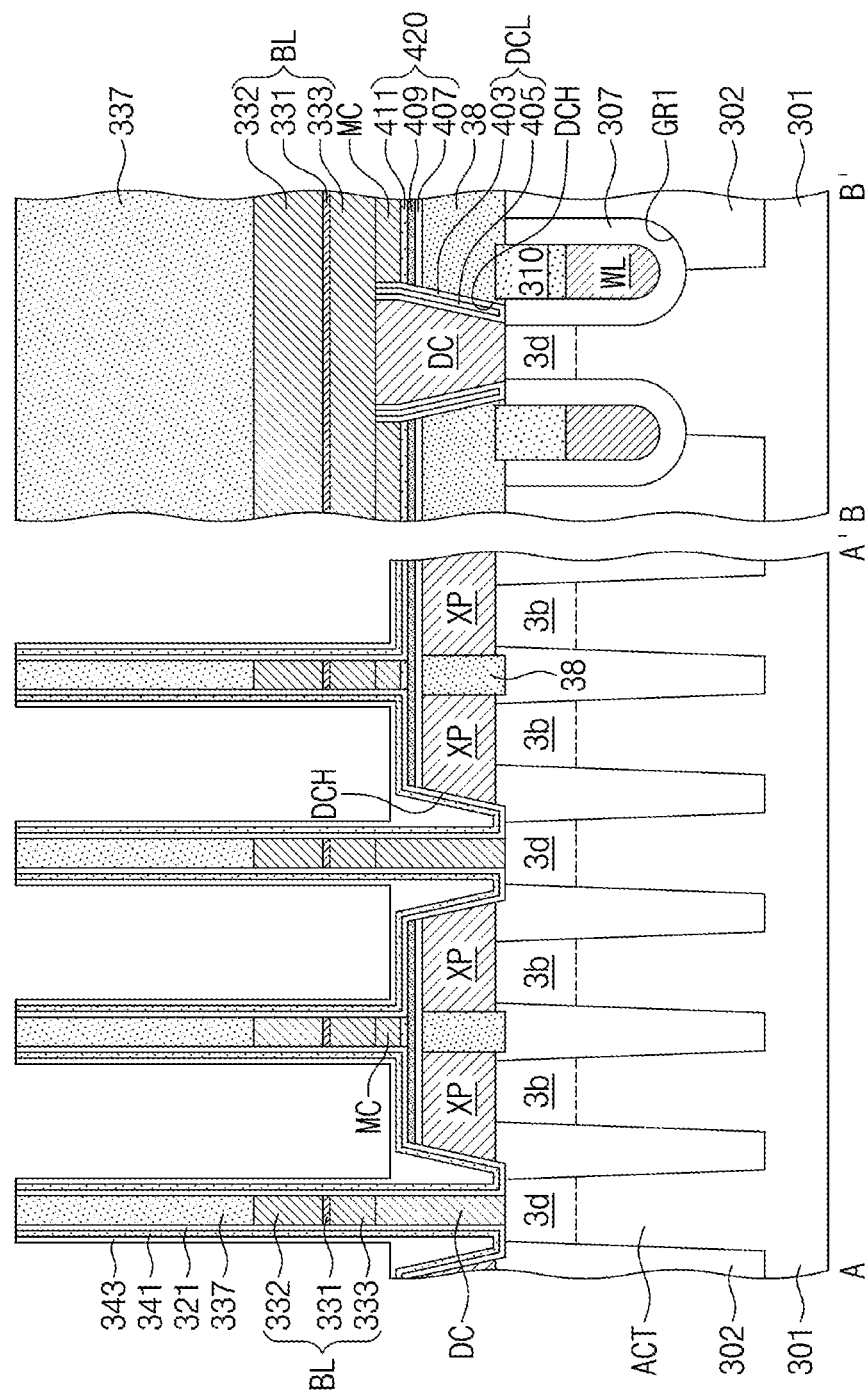

Referring to FIGS. 30 and 31, the spacer liner 321 may be conformally formed on the top surface of the substrate 301. For example, the spacer liner 321 may be conformally formed on the entire top surface of the substrate 301. Here, a portion of the spacer liner 321 may constitute the second contact insulating pattern 405 filling the void region VD below the bit line BL. The spacer liner 321 may be formed of or include at least one of, for example, silicon nitride or silicon oxide. The first gapfill insulating pattern 341 may be conformally formed on the spacer liner 321. The first gapfill insulating pattern 341 may be formed of or include, for example, silicon oxide. The second gapfill insulating pattern 343 may be formed on the first gapfill insulating pattern 341. The second gapfill insulating pattern 343 may fill a remaining portion of the contact hole DCH. The second gapfill insulating pattern 343 may be extended along a side surface of the first gapfill insulating pattern 341. The second gapfill insulating pattern 343 may be formed of or include, for example, silicon nitride.

Figure 32:
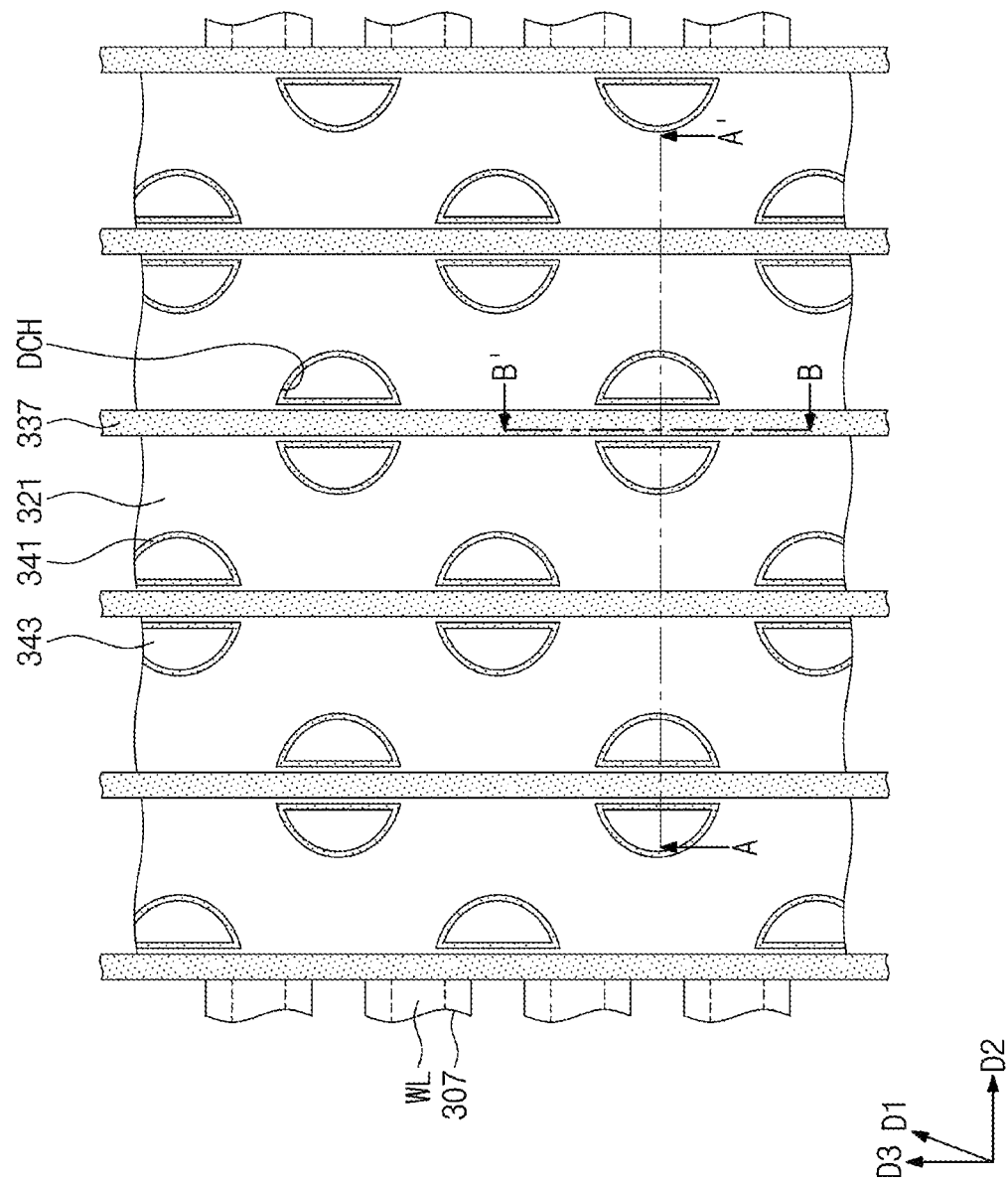
Figure 33:
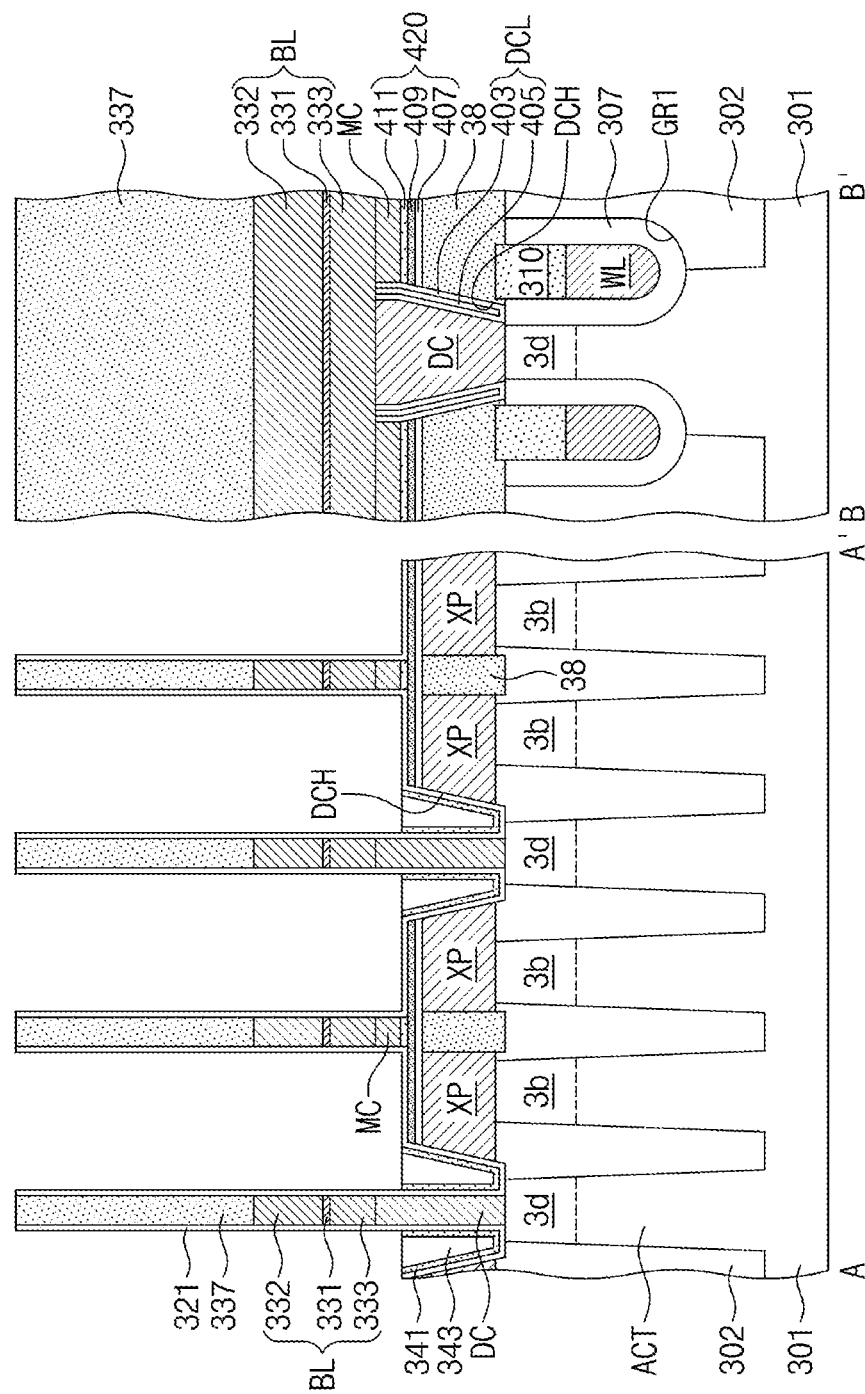

Referring to FIGS. 32 and 33, a portion of each of the first and second gapfill insulating patterns 341 and 343 may be selectively removed to expose the spacer liner 321. In an embodiment of the present inventive concept, the first and second gapfill insulating patterns 341 and 343 may have top surfaces that are located at substantially the same level. The first and second gapfill insulating patterns 341 and 343 may be formed to fill the contact hole DCH.

Figure 34:
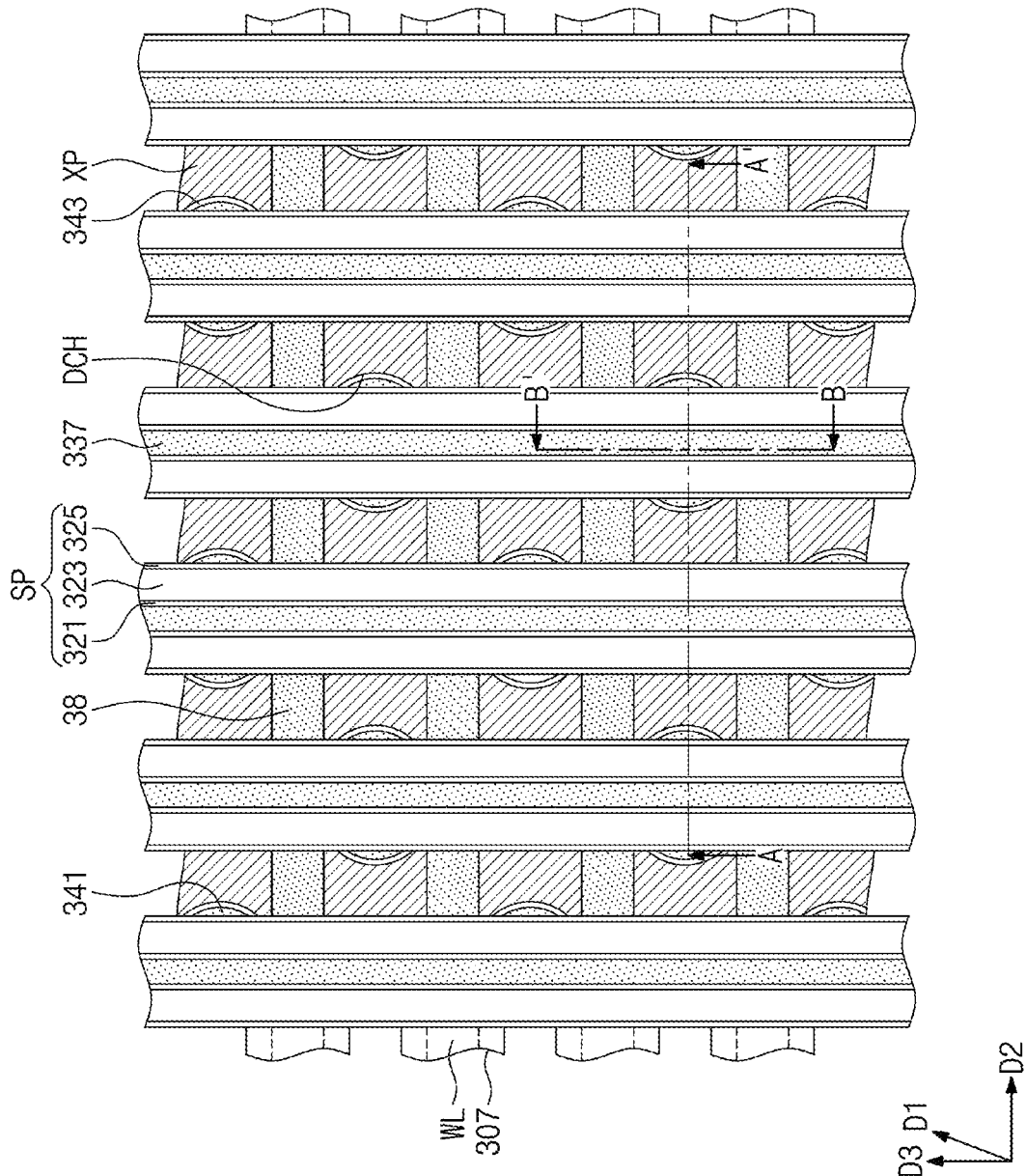
Figure 35:
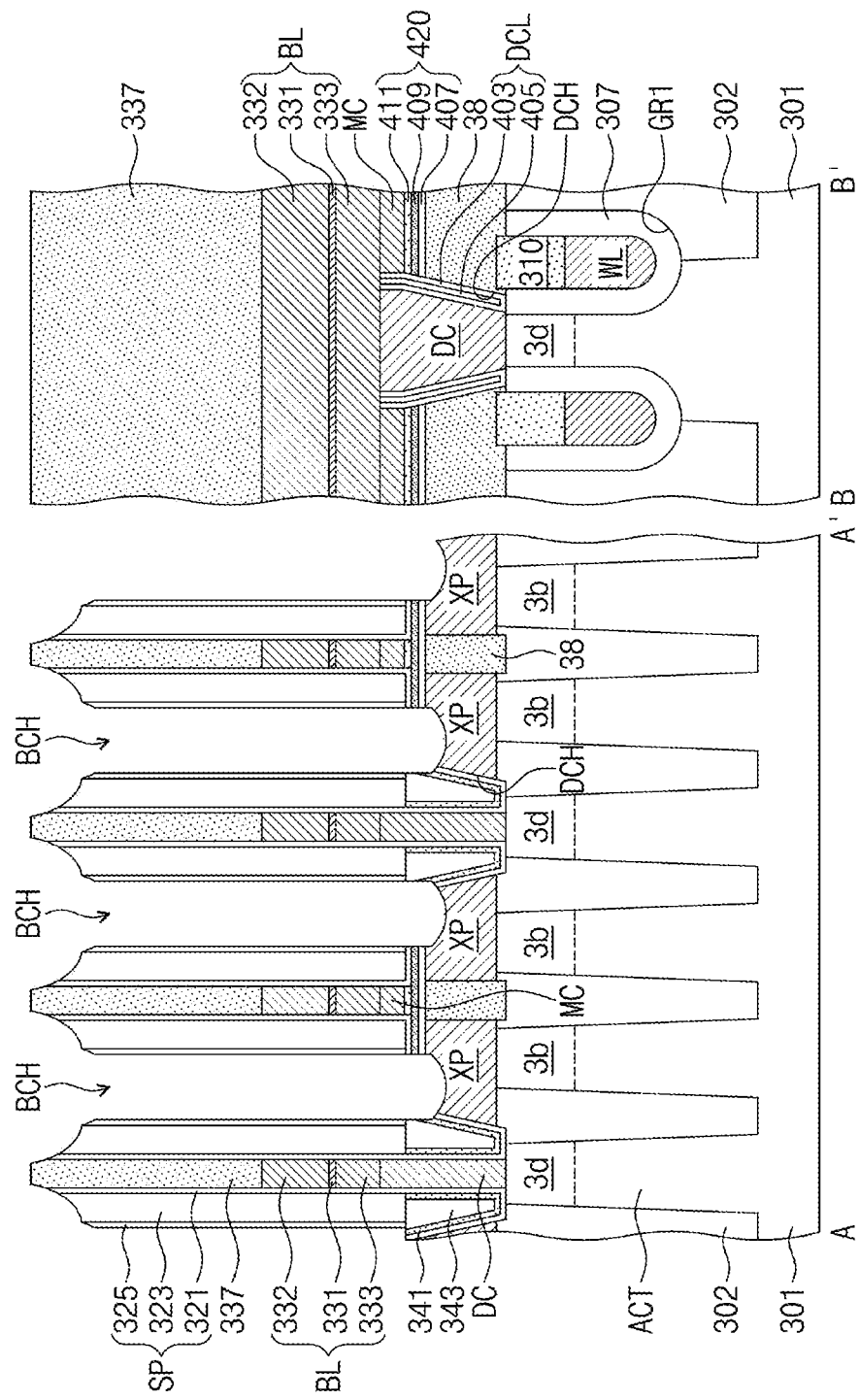

Referring to FIGS. 34 and 35, a first spacer layer may be conformally formed on the substrate 301 and then may be etched-back to form the first spacer 323 covering a side surface of the spacer liner 321. For example, the first spacer layer may be conformally formed on the entire top surface of the substrate 301. Here, the first gapfill insulating pattern 341, the second gapfill insulating pattern 343, the first buffer layer 407, and the second buffer layer 409 may also be etched to expose the top surface of the storage node pad XP. A second spacer layer may be conformally formed on the top surface of the substrate 301 and may be etched-back to form the second spacer 325 covering the side surface of the first spacer 323. For example, the second spacer layer may be conformally formed on the entire top surface of the substrate 301. Here, a portion of the second spacer layer covering the storage node pad XP may be selectively removed to expose the top surface of the storage node pad XP. As a result, the bit line spacer SP may be formed. A storage node contact hole BCH may be formed between adjacent ones of the bit line spacer SP to expose the top surface of the storage node pad XP.

Referring back to FIGS. 1 to 3, a contact diffusion barrier layer and a contact metal layer may be sequentially formed on the top surface of the substrate 301 to fill the storage node contact hole BCH. For example, the contact diffusion barrier layer and the contact metal layer may be sequentially formed on the entire top surface of the substrate 301. Both of the contact diffusion barrier layer and the contact metal layer may be formed of or include at least one of metallic materials and may be formed by a deposition process, which is performed at a lower temperature (e.g., of several hundreds of degrees Celsius, for example, about 300-400° C.) than that in an annealing process (e.g., at a temperature of about 1000° C.), and in this case, it may be possible to reduce a process failure.

A planarization process may be performed to expose a top surface of the bit line capping pattern 337 and to form the contact diffusion prevention pattern 311 and the contact metal pattern 313. The contact diffusion prevention pattern 311 and the contact metal pattern 313 may constitute the storage node contact BC. A fourth conductive layer may be formed on the storage node contact BC and the bit line capping patterns 337 and then may be etched to form the landing pads LP. Trenches may be formed between the landing pads LP. The landing pad separation patterns LPS may be formed by filling the trenches with an insulating layer and performing an etch-back or CMP process on the insulating layer. The data storage patterns DSP may be formed on the landing pads LP.

Figure 36:
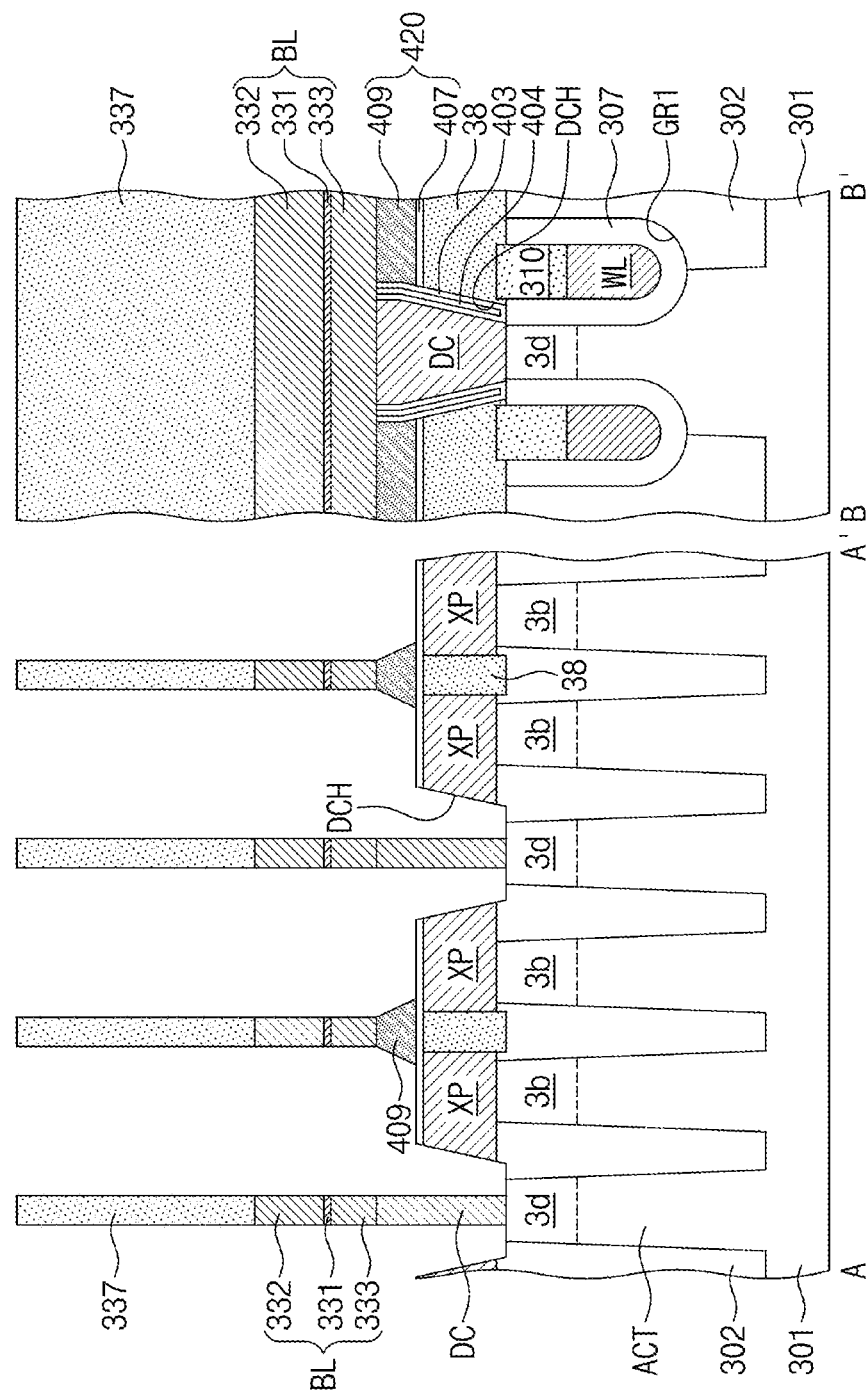
FIG. 36 is a sectional view, which is taken along the lines A-A' and B-B' of FIG. 1 to illustrate a semiconductor memory device according to a comparative example.

FIG. 36 is a sectional view, which is taken along the lines A-A' and B-B' of FIG. 1 to illustrate a semiconductor memory device according to a comparative example. In the following description of the comparative example, an element previously described with reference to FIGS. 1 to 3 may be identified by the same reference number without repeating an overlapping description thereof, for concise description.

Referring to FIG. 36, the semiconductor memory device according to the comparative example might not include the mask polysilicon pattern MC and the third buffer layer 411 (e.g., see FIG. 27). In the comparative example, the buffer layer 420 may include the first buffer layer 407 and the second buffer layer 409. The first buffer layer 407 may include, for example, silicon oxide, and the second buffer layer 409 may include, for example, silicon nitride. A thickness of the second buffer layer 409 may be larger than a thickness of the second buffer layer 409 described with reference to FIG. 27.

In the case where the mask polysilicon pattern MC and the third buffer layer 411 are not provided, the second buffer layer 409 may be thickly (e.g., a relatively high thickness) formed to increase stability in a process of forming the bit line BL. If the thickness of the second buffer layer 409 is increased, the second buffer layer 409 may also be etched during a process of etching the bit line BL, thereby having an inclined side surface. Accordingly, the top surface of the first buffer layer 407 may be exposed, and the first buffer layer 407, which is on the storage node pad XP, may also be etched in a subsequent process. In this case, the first buffer layer 407 on the storage node pad XP may have an increased thickness dispersion, and it may be difficult to realize the contact area between the storage node contact BC and the storage node pad XP to a desired value. Since the second buffer layer 409 is formed to have an inclined side surface, a portion of the second buffer layer 409 may be vertically overlapped with the storage node pad XP. This may lead to a reduction in an area of the top surface of the storage node pad XP, which is exposed when the storage node contact BC is formed. In this case, the contact area between the storage node contact BC and the storage node pad XP may be reduced, and thus, the electric characteristics of the semiconductor memory device may be deteriorated.

According to an embodiment of the present inventive concept, the mask polysilicon pattern MC and the third buffer layer 411 may prevent the second buffer layer 409 from being etched in the step of forming the bit line BL (e.g., see FIG. 29). Accordingly, even when the second buffer layer 409 is not thickly formed, it may be possible to increase the stability in a process of forming the bit line BL, and moreover, due to the second buffer layer 409, it may be possible to prevent the first buffer layer 407 from being exposed and etched in a subsequent process. As a result, it may be possible to easily achieve a desired contact area between the storage node contact BC and the storage node pad XP. Furthermore, since side surfaces of the mask polysilicon pattern MC and the third buffer layer 411 are vertically aligned to each other, an area of the top surface of the storage node pad XP, which is exposed when the storage node contact BC is formed, may be increased. As a result, the contact area between the storage node contact BC and the storage node pad XP may be increased, and this may make it possible to increase the electric characteristics of the semiconductor memory device.

Figure 37:
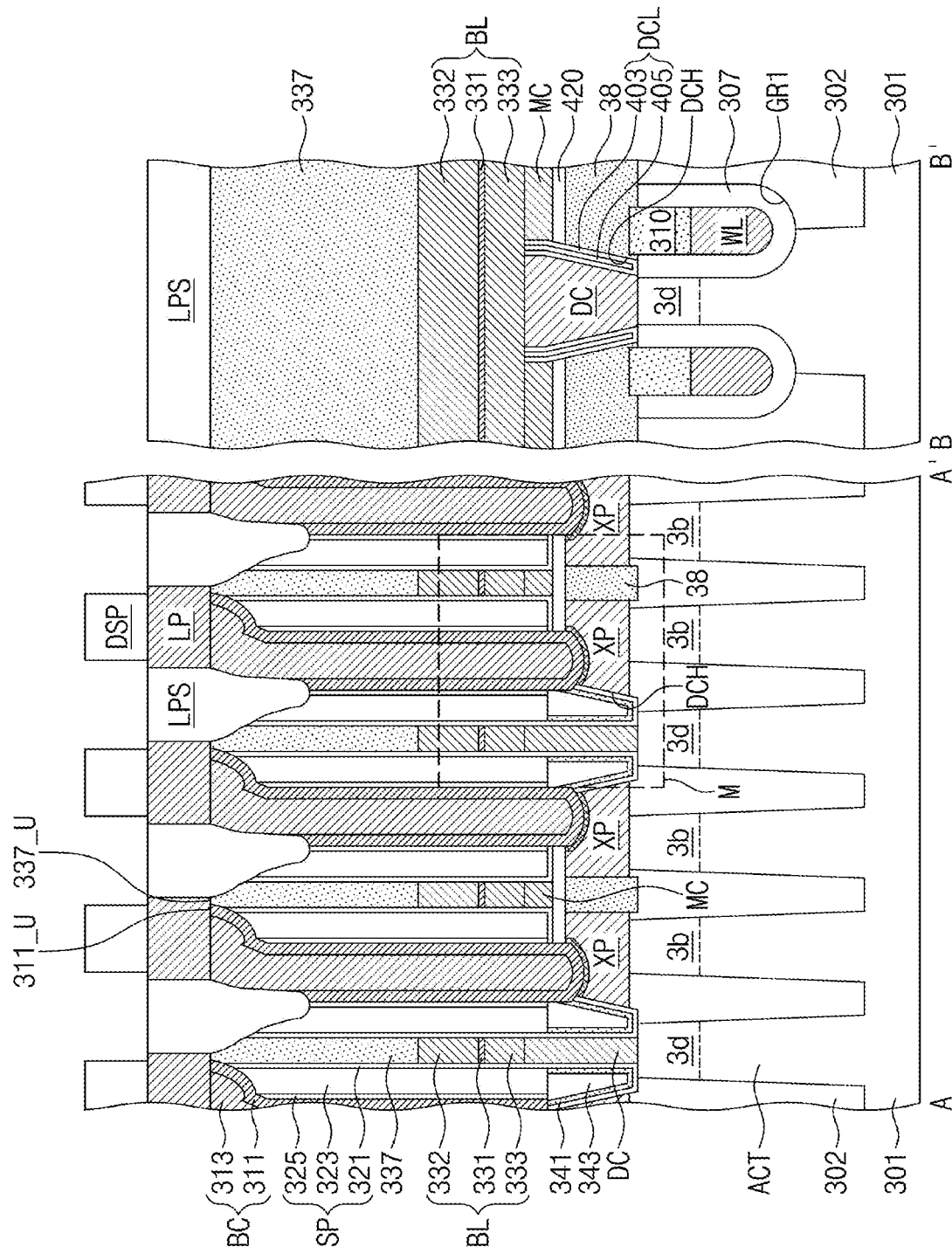
FIG. 37 is a sectional view, which is taken along the lines A-A' and B-B' of FIG. 1 to illustrate a semiconductor memory device according to an embodiment of the present inventive concept.
Figure 38:
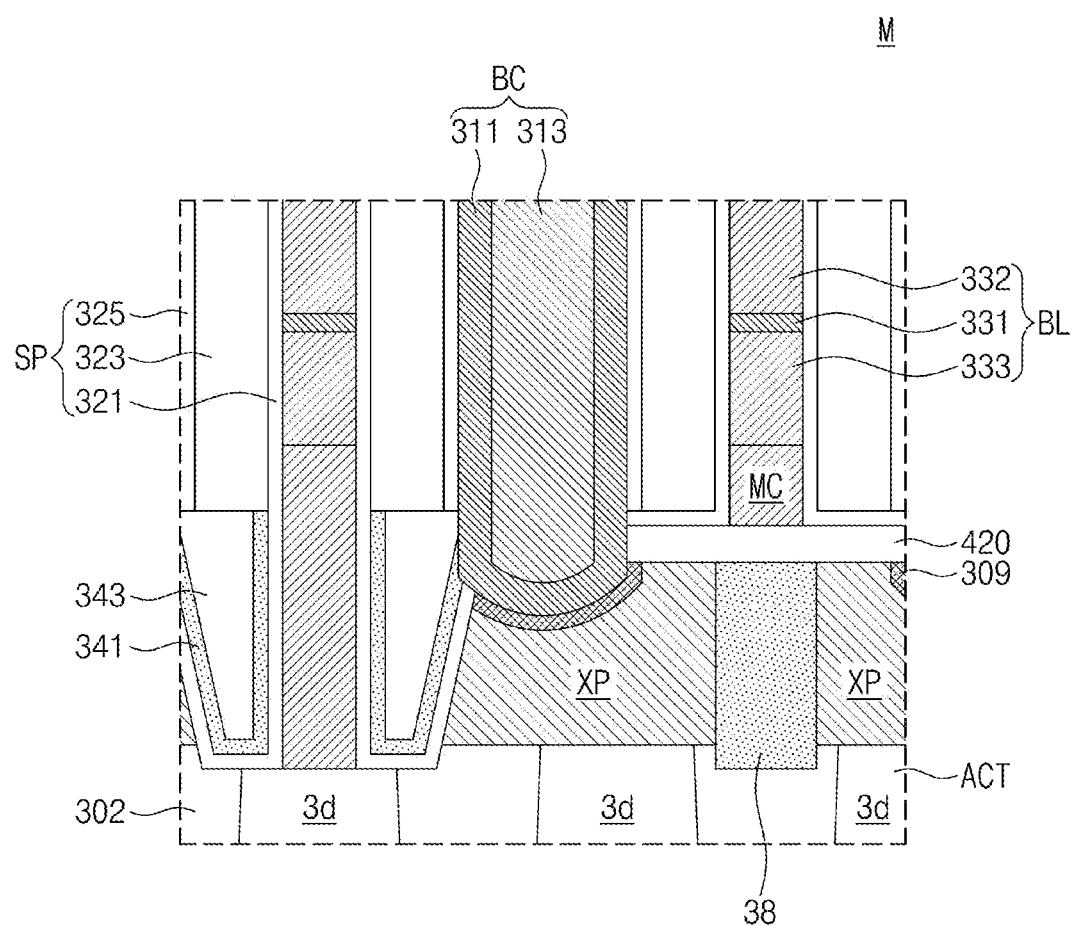
FIG. 38 is an enlarged sectional view of a portion 'M' of FIG. 37.

FIG. 37 is a sectional view, which is taken along the lines A-A' and B-B' of FIG. 1 to illustrate a semiconductor memory device according to an embodiment of the present inventive concept. FIG. 38 is an enlarged sectional view of a portion 'M' of FIG. 37. In the following description of the present embodiment, an element previously described with reference to FIGS. 1 to 3 may be identified by the same reference number without repeating an overlapping description thereof, for concise description.

Referring to FIGS. 37 and 38, the buffer layer 420 may have a single-layered structure. For example, the buffer layer 420 may be formed of or include silicon oxide. When the bit line BL is formed, the mask polysilicon pattern MC may be used as a mask that may protect the buffer layer 420. Accordingly, it may be possible to prevent the buffer layer 420 from being etched, when the bit line BL is formed.

Figure 39:
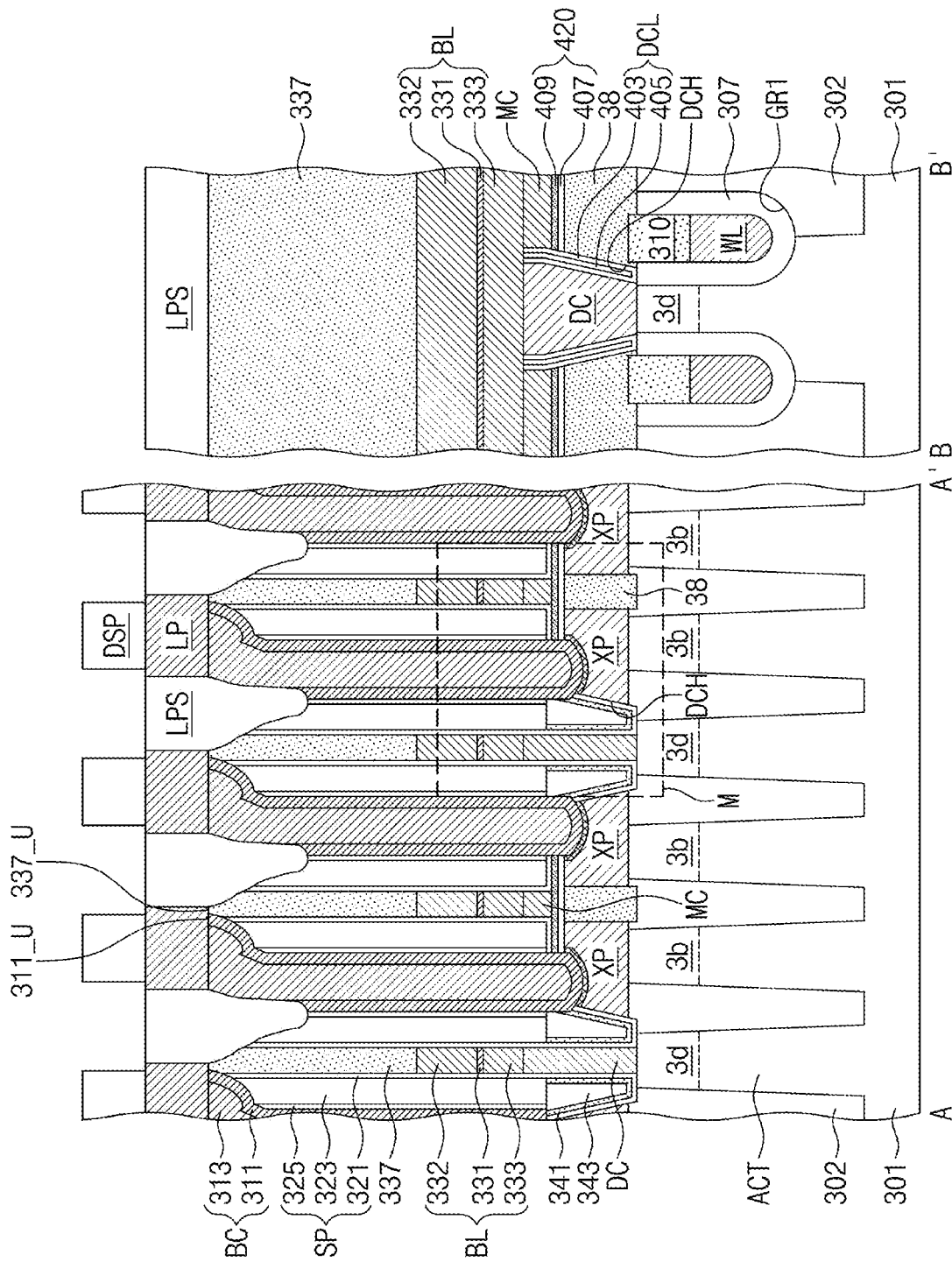
FIG. 39 is a sectional view, which is taken along the lines A-A' and B-B' of FIG. 1 to illustrate a semiconductor memory device according to an embodiment of the present inventive concept.
Figure 40:
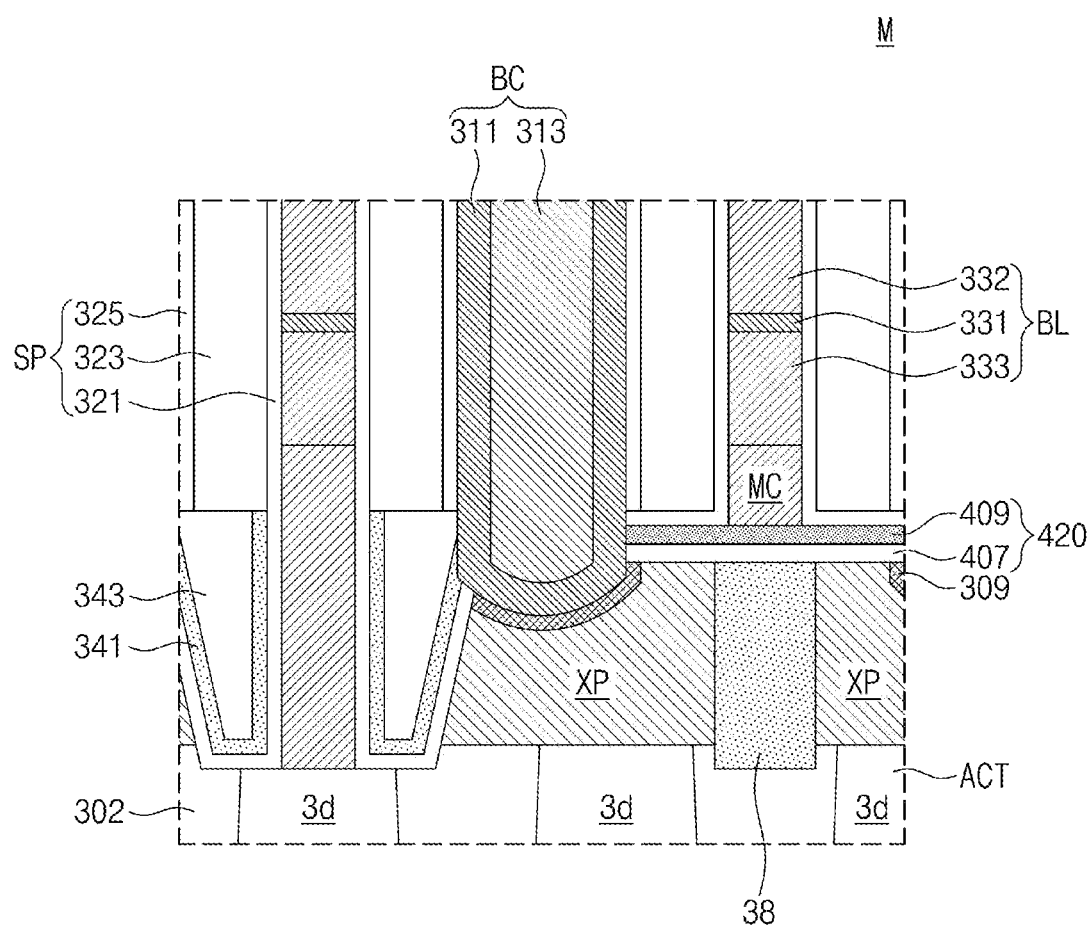
FIG. 40 is an enlarged sectional view of a portion 'M' of FIG. 39.

FIG. 39 is a sectional view, which is taken along the lines A-A' and B-B' of FIG. 1 to illustrate a semiconductor memory device according to an embodiment of the present inventive concept. FIG. 40 is an enlarged sectional view of a portion 'M' of FIG. 39. In the following description of the present embodiment, an element previously described with reference to FIGS. 1 to 3 may be identified by the same reference number without repeating an overlapping description thereof, for concise description.

Referring to FIGS. 39 and 40, the buffer layer 420 may include the first buffer layer 407 and the second buffer layer 409. The first and second buffer layers 407 and 409 may be substantially the same as the first and second buffer layers 407 and 409 described with reference to FIGS. 1 to 3. In the present embodiment, the third buffer layer 411 may be omitted. The mask polysilicon pattern MC may be disposed on the top surface of the second buffer layer 409. For example, the mask polysilicon pattern MC may be in contact with the top surface of the second buffer layer 409.

The mask polysilicon pattern MC may be used as a mask for protecting the buffer layer 420, when the bit line BL is formed. Accordingly, when the bit line BL is formed, it may be possible to have an inclined side surface of the second buffer layer 409 and thereby to prevent the top surface of the first buffer layer 407 from being exposed.

Figure 41:
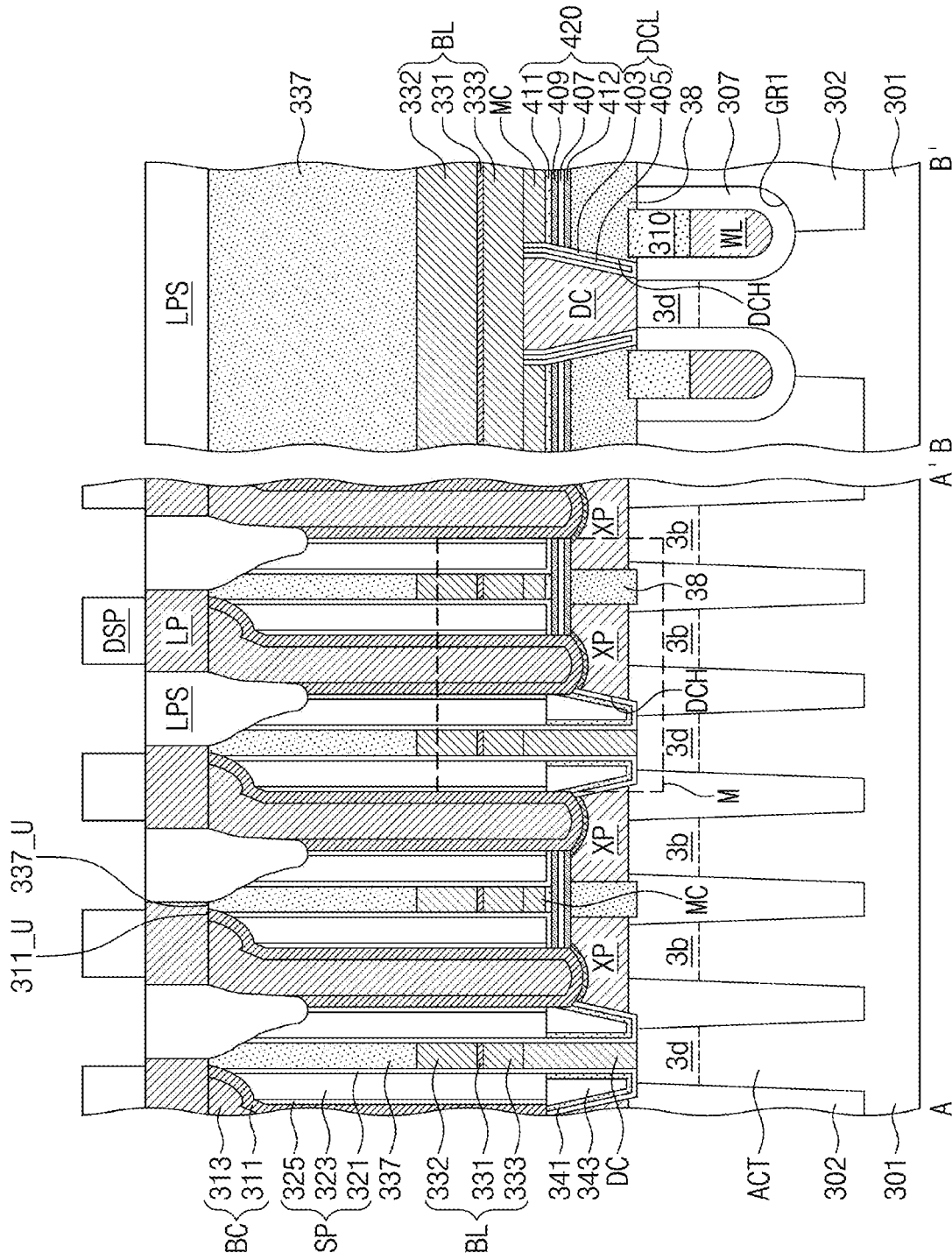
FIG. 41 is a sectional view, which is taken along the lines A-A' and B-B' of FIG. 1 to illustrate a semiconductor memory device according to an embodiment of the present inventive concept.
Figure 42:
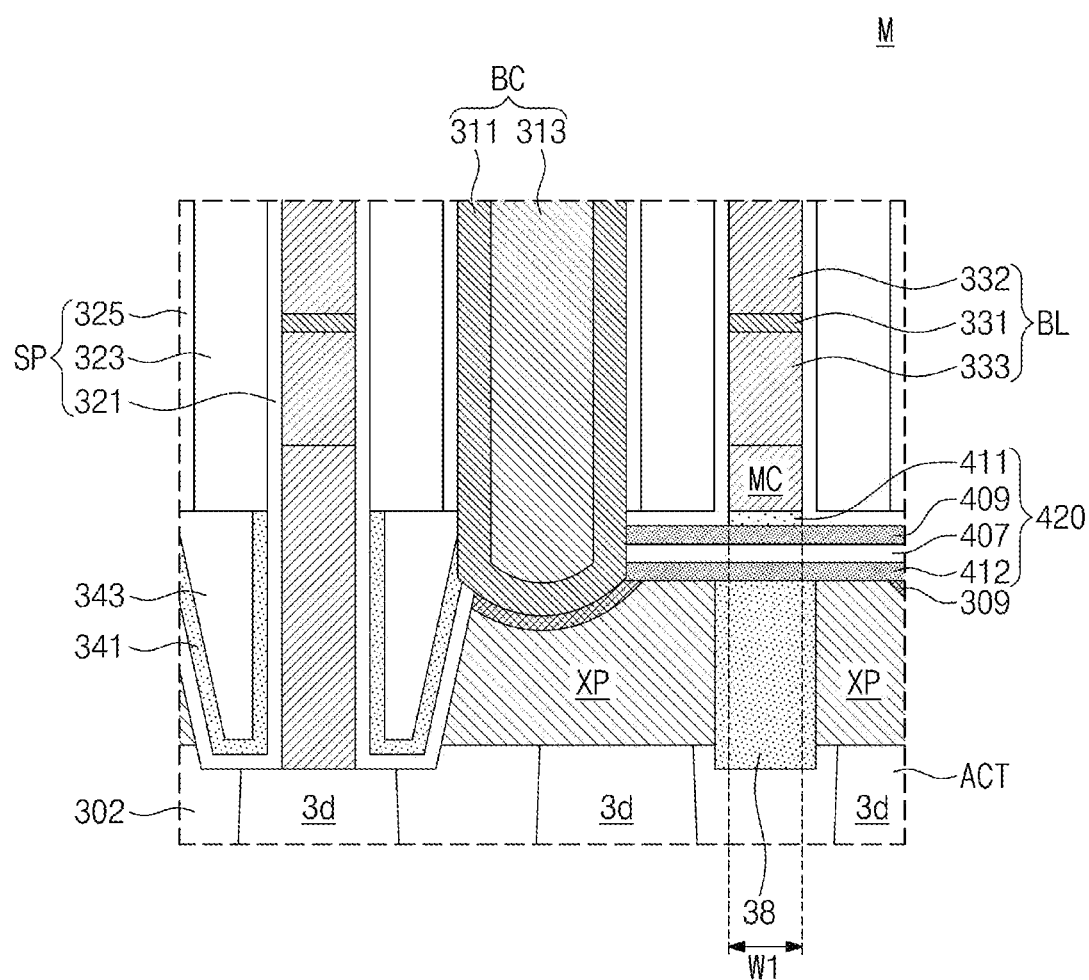
FIG. 42 is an enlarged sectional view of a portion 'M' of FIG. 41.

FIG. 41 is a sectional view, which is taken along the lines A-A' and B-B' of FIG. 1 to illustrate a semiconductor memory device according to an embodiment of the present inventive concept. FIG. 42 is an enlarged sectional view of a portion 'M' of FIG. 41. In the following description of the present embodiment, an element previously described with reference to FIGS. 1 to 3 may be identified by the same reference number without repeating an overlapping description thereof, for concise description.

Referring to FIGS. 41 and 42, the buffer layer 420 may include the first to third buffer layers 407, 409, and 411, which are sequentially stacked on each other. The first to third buffer layers 407, 409, and 411 may be substantially the same as the first to third buffer layers 407, 409, and 411 described with reference to FIGS. 1 to 3. The buffer layer 420 may further include a fourth buffer layer 412 disposed below the first buffer layer 407. The fourth buffer layer 412 may be formed of or include the same material as the second buffer layer 409. In an embodiment of the present inventive concept, the fourth buffer layer 412 may be formed of or include silicon nitride. A thickness of the fourth buffer layer 412 may be smaller than a thickness of the mask polysilicon pattern MC. A width of the fourth buffer layer 412 may be larger than a width of the third buffer layer 411.

The mask polysilicon pattern MC and the third buffer layer 411 may be used as a mask for protecting the second buffer layer 409, when the bit line BL is formed. Accordingly, when the bit line BL is formed, it may be possible to have an inclined side surface of the second buffer layer 409, and thereby prevent the top surface of the first buffer layer 407 from being exposed.

Figure 43:
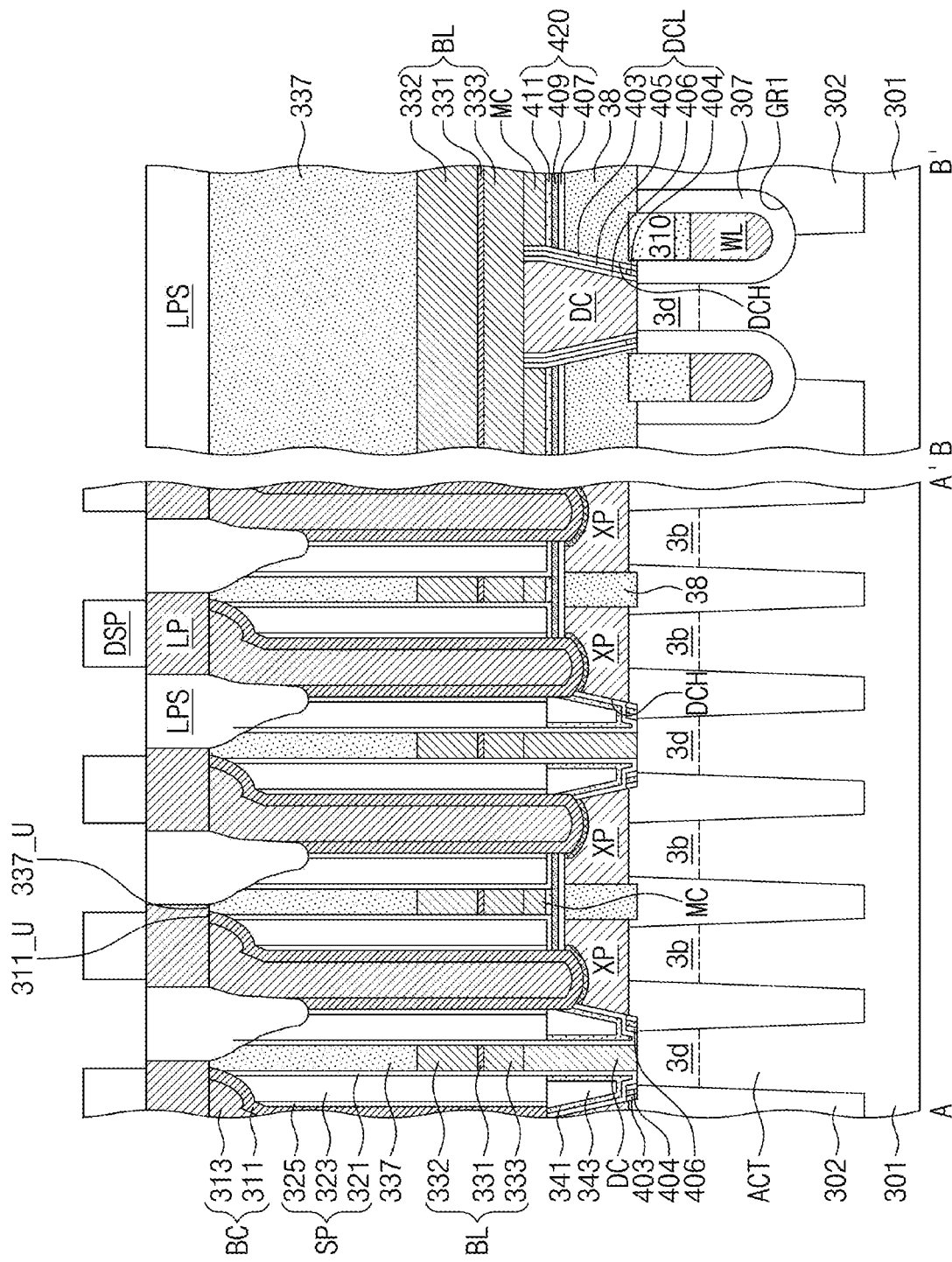
FIG. 43 is a sectional view, which is taken along the lines A-A' and B-B' of FIG. 1 to illustrate a semiconductor memory device according to an embodiment of the present inventive concept.

FIG. 43 is a sectional view, which is taken along the lines A-A' and B-B' of FIG. 1 to illustrate a semiconductor memory device according to an embodiment of the present inventive concept. In the following description of the present embodiment, an element previously described with reference to FIGS. 1 to 3 may be identified by the same reference number without repeating an overlapping description thereof, for concise description.

Referring to FIG. 43, the first contact insulating pattern 403, the sacrificial pattern 404, the second contact insulating pattern 405, and a third contact insulating pattern 406 may be provided in the contact hole DCH. The sacrificial pattern 404 may be interposed between the first contact insulating pattern 403 and the third contact insulating pattern 406. The sacrificial pattern 404 may be formed of or include the same material as the sacrificial pattern 404 described with reference to FIG. 17. For example, the sacrificial pattern 404 might not be in contact with an inner side surface of the contact hole DCH. In an embodiment of the present inventive concept, the sacrificial pattern 404 may be formed of or include silicon oxide. The sacrificial pattern 404 may be in contact with the bottom surface of the contact hole DCH. The sacrificial pattern 404 may be located at a bottom end of the contact hole DCH.

The second contact insulating pattern 405 may be provided between the bit line BL and the sacrificial pattern 404. The second contact insulating pattern 405 may be substantially the same as the second contact insulating pattern 405 described with reference to FIGS. 1 to 3.

The third contact insulating pattern 406 may be disposed below the bit line BL and may be interposed between the bit line contact DC and the second contact insulating pattern 405 and between the bit line contact DC and the sacrificial pattern 404. The third contact insulating pattern 406 may be interposed between the first gapfill insulating pattern 341 and the sacrificial pattern 404. The third contact insulating pattern 406 may be formed of or include the same material as the first contact insulating pattern 403. The third contact insulating pattern 406 may be formed of or include, for example, silicon nitride.

FIGS. 44 to 47 are sectional views, each of which is taken along the lines A-A' and B-B' of FIG. 1 to illustrate a method of fabricating a semiconductor memory device, according to an embodiment of the present inventive concept.

Figure 44:
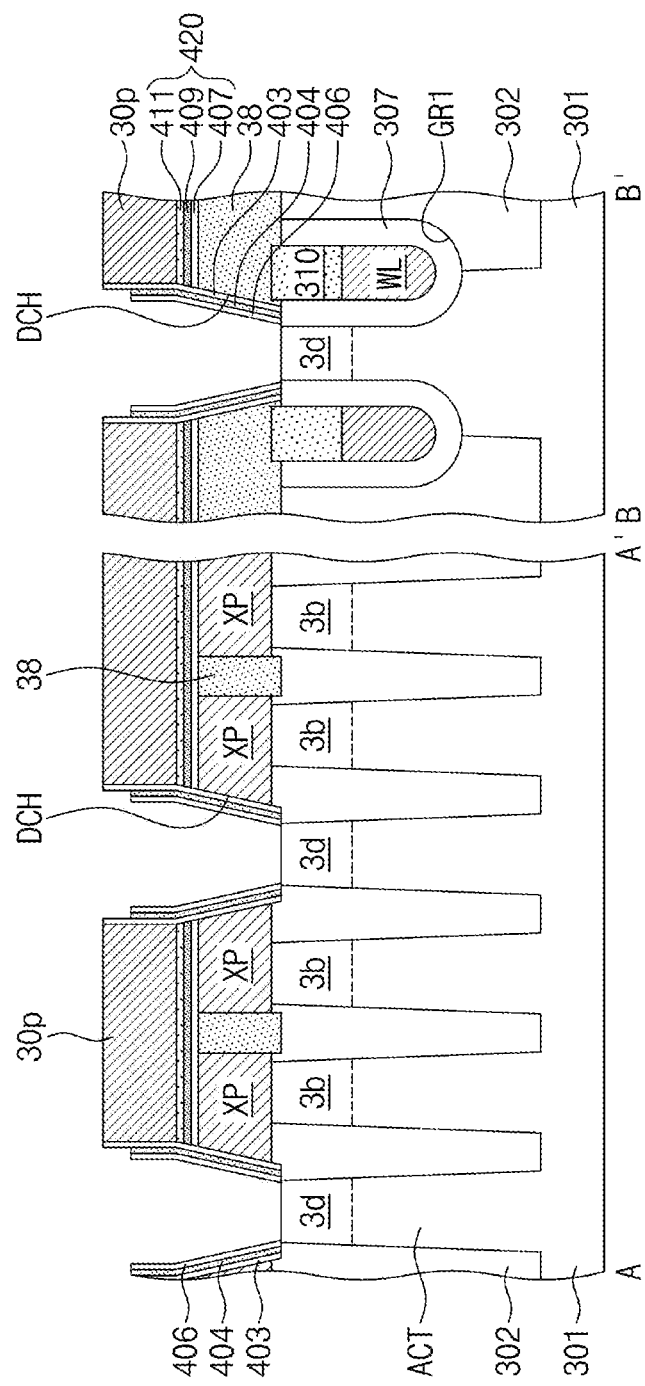
FIGS. 44, 45, 46 and 47 are sectional views, each of which is taken along the lines A-A' and B-B' of FIG. 1 to illustrate a method of fabricating a semiconductor memory device, according to an embodiment of the present inventive concept.

Referring to FIG. 44, a first contact insulating layer may be conformally formed on the entire top surface of the substrate 301, after the process described with reference to FIGS. 4 to 15. In an embodiment of the present inventive concept, the first contact insulating layer may be formed of or include silicon nitride. A portion of the first contact insulating layer covering the bottom surface of the contact hole DCH may be etched to expose the first impurity region 3d. A sacrificial layer may be conformally formed on the top surface of the substrate 301. For example, the sacrificial layer may be conformally formed on the entire top surface of the substrate 301. The sacrificial layer may be formed of or include a material having an etch selectivity with respect to the first contact insulating layer. In an embodiment of the present inventive concept, the sacrificial layer may be formed of or include silicon oxide. A portion of the sacrificial layer covering the bottom surface of the contact hole DCH may be selectively etched to expose the first impurity region 3d and the top surface of the first contact insulating layer. A second contact insulating layer may be conformally formed on the top surface of the substrate 301. For example, the second contact insulating layer may be conformally formed on the entire top surface of the substrate 301. The second contact insulating layer may be formed of or include the same material as the first contact insulating layer. A portion of the second contact insulating layer may be selectively etched to expose the first impurity region 3d, a top surface of the sacrificial layer, and a top surface of the first contact insulating layer. As a result, the first contact insulating pattern 403, the sacrificial pattern 404, and the third contact insulating pattern 406 may be formed to sequentially cover inner side surfaces of the contact holes DCH. The sacrificial pattern 404 may be interposed between the first and third contact insulating patterns 403 and 406. The sacrificial pattern 404 may be disposed on the bottom surface of the contact hole DCH. For example, a bottom surface of the sacrificial pattern 404 may be in contact with the bottom surface of the contact hole DCH. The top surface of the sacrificial pattern 404 and the top surface of the third contact insulating pattern 406 may be located at a level lower than the top surface of the first contact insulating pattern 403.

Figure 45:
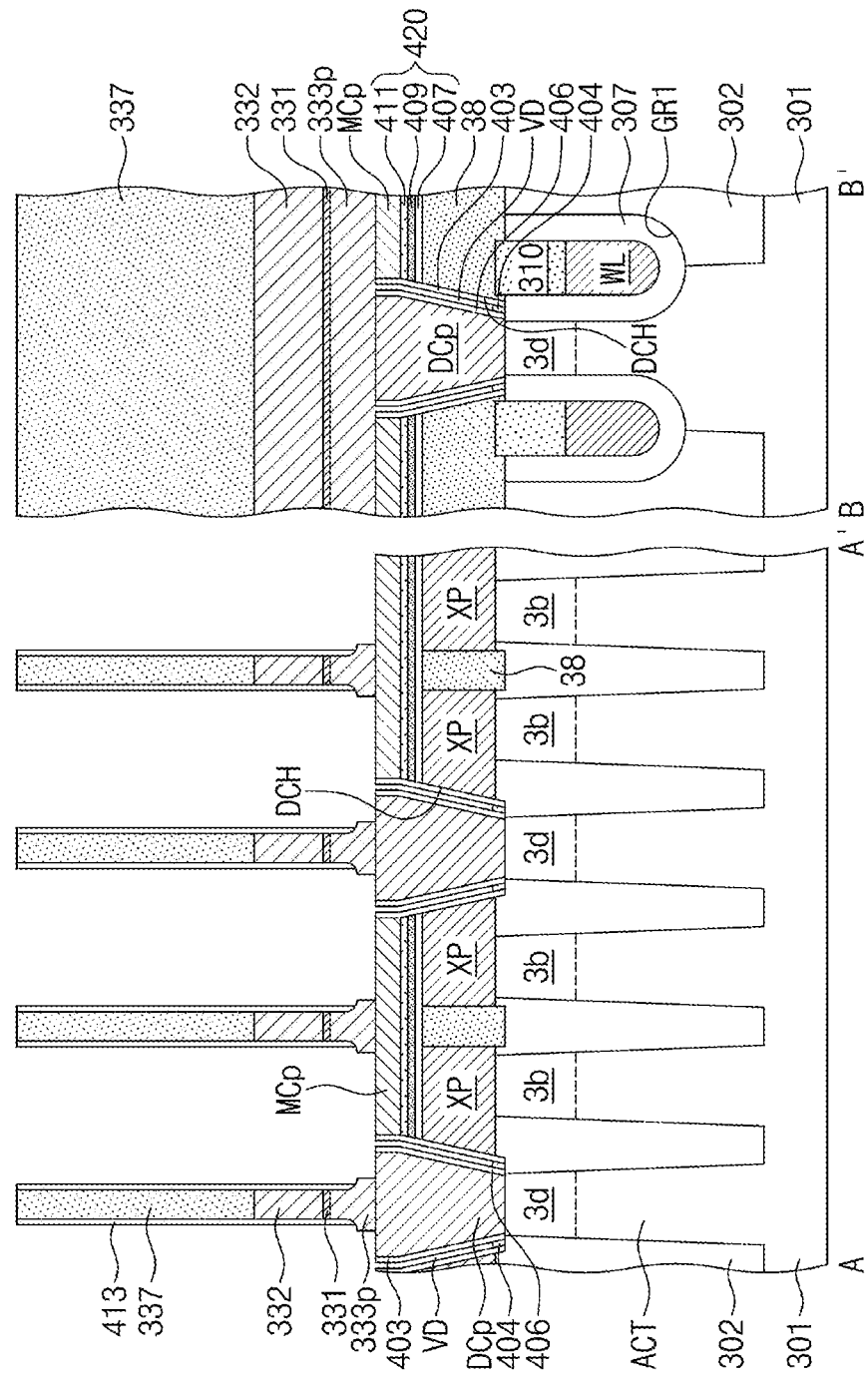

Referring to FIG. 45, after the process described with reference to FIGS. 18 to 25, an upper portion of the sacrificial pattern 404 may be removed to form the void region VD. The void region VD may be formed on the sacrificial pattern 404. The top surface of the sacrificial pattern 404 may be located at a level lower than the top surface of the first contact insulating pattern 403 and the top surface of the third contact insulating pattern 406. The second protection spacer 415, along with the upper portion of the sacrificial pattern 404, may also be removed.

Figure 46:
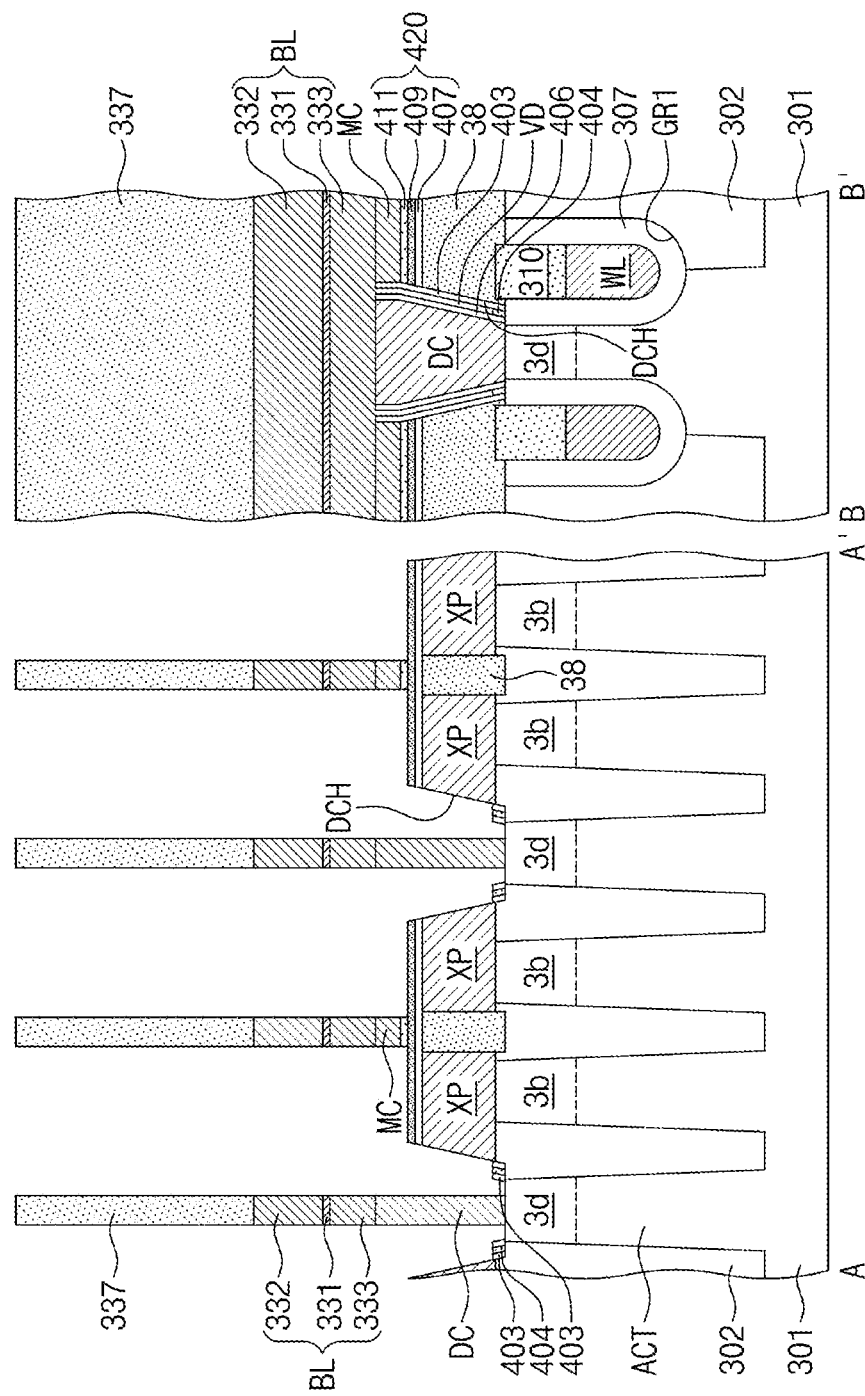

Referring to FIG. 46, the first protection spacer 413 may be removed. The bit line polysilicon pattern 333 may be formed by etching the preliminary bit line polysilicon pattern 333p using the bit line capping pattern 337 as an etch mask. The first contact insulating pattern 403 may protect the storage node pad XP in the etching process and may prevent the storage node pad XP from being etched. In an embodiment of the present inventive concept, an upper portion of the first contact insulating pattern 403 covering the side surface of the storage node pad XP may be removed during the etching process.

In the etching process, the preliminary mask polysilicon pattern MCp and the preliminary bit line contact DCp may also be etched using the bit line capping pattern 337 as etch mask. As a result, the mask polysilicon pattern MC and the bit line contact DC may be formed. Furthermore, in the etching process, the third buffer layer 411 may also be etched using the bit line capping pattern 337 as an etch mask. The top surface of the second buffer layer 409 may be exposed by the third buffer layer 411. In an embodiment of the present inventive concept, the side surface of the third buffer layer 411 may be substantially aligned to the side surface of the mask polysilicon pattern MC.

Figure 47:
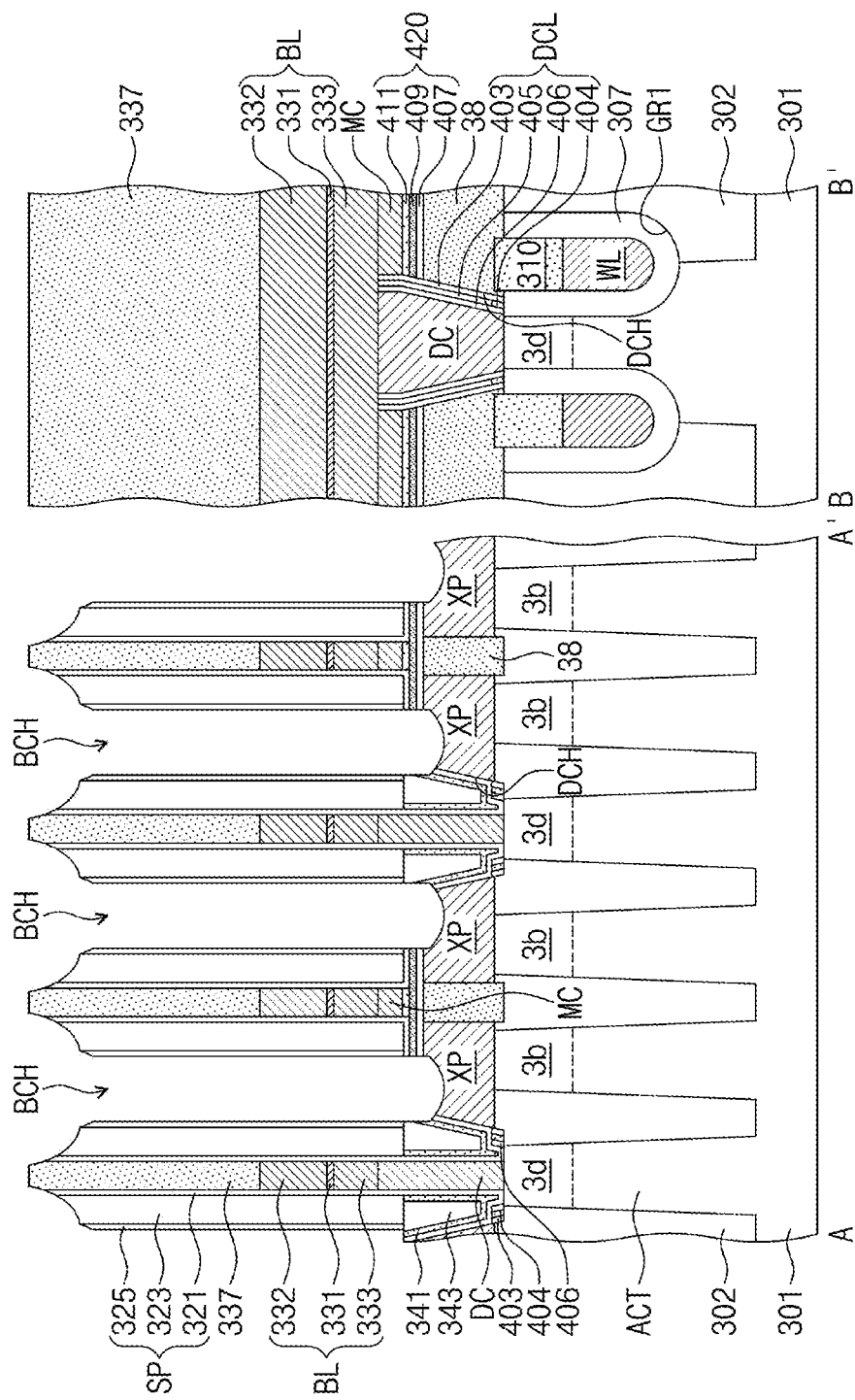

Referring to FIG. 47, after the process described with reference to FIGS. 30 to 33, a first spacer layer may be conformally formed on the entire top surface of the substrate 301 and then may be etched-back to form the first spacer 323 covering the side surface of the spacer liner 321. Here, the first gapfill insulating pattern 341, the second gapfill insulating pattern 343, the first buffer layer 407, and the second buffer layer 409 may also be etched to expose the top surface of the storage node pad XP. A second spacer layer may be conformally formed on the entire top surface of the substrate 301 and may be etched-back to form the second spacer 325 covering the side surface of the first spacer 323. Here, a portion of the second spacer layer covering the storage node pad XP may be selectively removed to expose the top surface of the storage node pad XP. As a result, the bit line spacer SP may be formed. The storage node contact hole BCH may be formed between adjacent ones of the bit line spacer SP to expose the top surface of the storage node pad XP. The second contact insulating pattern 405 may be formed in the void region VD, when the spacer liner 321 is formed.

Referring back to FIG. 43, the contact diffusion prevention pattern 311 and the contact metal pattern 313 may be formed to fill the storage node contact hole BCH. The contact diffusion prevention pattern 311 and the contact metal pattern 313 may constitute the storage node contact BC. The landing pads LP may be formed on the storage node contact BC and the bit line capping patterns 337. Trenches may be formed between the landing pads LP. The landing pad separation patterns LPS may be formed by filling the trenches with an insulating layer and performing an etch-back or CMP process on the insulating layer. The data storage patterns DSP may be formed on the landing pads LP.

According to an embodiment of the present inventive concept, a mask polysilicon pattern and a third buffer layer may be formed to prevent a second buffer layer from being etched in a process of forming a bit line. Accordingly, even when the second buffer layer is not thickly formed, it may be possible to increase the stability in a process of forming the bit line, and it may be possible to prevent the first buffer layer from being exposed through the second buffer layer and from being etched in a subsequent process. As a result, it may be possible to easily achieve a desired contact area between the storage node contact and the storage node pad. In addition, since the mask polysilicon pattern and the third buffer layer are formed to have side surfaces that are vertically aligned to each other, it may be possible to increase an area of a top surface of the storage node pad exposed in the process of forming the storage node contact. As a result, the contact area between the storage node contact and the storage node pad may be increased, and this may make it possible to increase electric characteristics of a semiconductor memory device.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor memory device, comprising:
    a device isolation pattern provided on a substrate to provide a first active portion and a second active portion;
    a first storage node pad disposed on the first active portion;
    a second storage node pad disposed on the second active portion;
    a pad separation pattern disposed between the first and second storage node pads;
    a word line disposed in the substrate to cross the first and second active portions;
    a bit line disposed on the pad separation pattern and crossing the word line;
    a buffer layer disposed on the pad separation pattern; and
    a mask polysilicon pattern interposed between the buffer layer and the bit line,
    wherein a side surface of the mask polysilicon pattern is aligned to a side surface of the bit line,
    wherein the mask polysilicon pattern is vertically overlapped with the pad separation pattern,
    wherein the pad separation pattern is vertically overlapped with the buffer layer under the buffer layer, and
    wherein the buffer layer is vertically overlapped with the mask polysilicon pattern under the mask polysilicon pattern.

2. The semiconductor memory device of claim 1, wherein a top surface of the first storage node pad is coplanar with a top surface of the pad separation pattern.

3. The semiconductor memory device of claim 1, further comprising:
    a storage node contact disposed at a side of the bit line to be adjacent to the first storage node pad, and
    an ohmic contact layer interposed between the storage node contact and the first storage node pad.

4. The semiconductor memory device of claim 1, further comprising a bit line contact interposed between the bit line and the second active portion,
    wherein a top surface of the bit line contact is located at a same level as a top surface of the mask polysilicon pattern.

5. The semiconductor memory device of claim 4, further comprising:
    a first gapfill insulating pattern disposed between the bit line contact and the first storage node pad; and
    a second gapfill insulating pattern disposed on the first gapfill insulating pattern,
    wherein the first gapfill insulating pattern and the second gapfill insulating pattern comprise different materials from each other.

6. The semiconductor memory device of claim 1, wherein the buffer layer comprises:
    a first buffer layer disposed on the pad separation pattern;
    a second buffer layer disposed on the first buffer layer; and
    a third buffer layer disposed on the second buffer layer,
    wherein a width of the third buffer layer is smaller than each of a width of the first buffer layer and a width of the second buffer layer.

7. The semiconductor memory device of claim 6, wherein a side surface of the third buffer layer is aligned with a side surface of the mask polysilicon pattern.

8. The semiconductor memory device of claim 6, wherein the first buffer layer comprises silicon oxide,
    the second buffer layer comprises silicon nitride, and
    the third buffer layer comprises silicon oxynitride.

9. The semiconductor memory device of claim 6, further comprising a fourth buffer layer disposed between the first buffer layer and the pad separation pattern,
    wherein the fourth buffer layer comprises a same material as the second buffer layer.

10. The semiconductor memory device of claim 1, wherein the mask polysilicon pattern is horizontally offset from the first storage node pad.

11. A semiconductor memory device, comprising:
    a device isolation pattern disposed on a substrate to provide a first active portion and a second active portion;
    a first storage node pad and a second storage node pad disposed on the first and second active portions, respectively;
    a pad separation pattern disposed between the first and second storage node pads;
    a word line disposed in the substrate to cross the first and second active portions;
    a bit line crossing the word line;
    a buffer layer disposed on the pad separation pattern; and
    a mask polysilicon pattern interposed between the buffer layer and the bit line,
    wherein the buffer layer comprises:
    a first buffer layer disposed on the pad separation pattern;
    a second buffer layer disposed on the first buffer layer; and
    a third buffer layer disposed on the second buffer layer, and
    a width of the third buffer layer is smaller than each of a width of the first buffer layer and a width of the second buffer layer.

12. The semiconductor memory device of claim 11, wherein a side surface of the mask polysilicon pattern is aligned to a side surface of the bit line, and
    the mask polysilicon pattern is vertically overlapped with the pad separation pattern.

13. The semiconductor memory device of claim 11, wherein the third buffer layer is horizontally offset from the storage node pad.

14. The semiconductor memory device of claim 11, wherein a top surface of the first buffer layer is covered with the second buffer layer.

15. The semiconductor memory device of claim 11, wherein a thickness of the second buffer layer is smaller than a thickness of the mask polysilicon pattern.

16. A semiconductor memory device, comprising:
a device isolation pattern disposed on a substrate to provide first to third active portions, which are adjacent to each other in a first direction;
first to third impurity regions disposed on the first to third active portions, respectively;
a word line disposed in the substrate and crossing the first and second active portions;
a word line capping pattern disposed on the word line;
a bit line contact disposed on the first active portion;
a first bit line located on the bit line contact and crossing the word line, wherein the first bit line comprises a bit line polysilicon pattern, a bit line diffusion prevention pattern, and a bit line interconnection pattern, which are sequentially stacked on the bit line contact;
a bit line spacer disposed on a side surface of the first bit line;
a bit line capping pattern disposed on a top surface of the first bit line;
a first storage node pad disposed on the second active portion;
a second storage node pad disposed on the third active portion;
a pad separation pattern disposed between the first storage node pad and the second storage node pad;
a second bit line disposed on the pad separation pattern;
a buffer layer disposed between the second bit line and the pad separation pattern;
a mask polysilicon pattern disposed between the buffer layer and the second bit line;
a storage node contact electrically connected to the first storage node pad;
landing pads disposed on the storage node contact;
a landing pad separation pattern disposed between the landing pads; and
a data storage pattern disposed on the landing pads,
wherein a side surface of the mask polysilicon pattern is aligned to a side surface of the second bit line,
wherein the mask polysilicon pattern is vertically overlapped with the pad separation pattern,
wherein the pad separation pattern is vertically overlapped with the buffer layer under the buffer layer, and
wherein the buffer layer is vertically overlapped with the mask polysilicon pattern under the mask polysilicon pattern.

17. The semiconductor memory device of claim 16, wherein the buffer layer comprises a first buffer layer and a second buffer layer, wherein the first buffer layer is disposed on a top surface of the pad separation pattern, and the second buffer layer is disposed on the first buffer layer,
wherein the first buffer layer comprises silicon oxide, and wherein the second buffer layer comprises silicon nitride.

18. The semiconductor memory device of claim 17, wherein the buffer layer further comprises a third buffer layer interposed between the second buffer layer and the mask polysilicon pattern, and
a side surface of the third buffer layer is aligned to a side surface of the mask polysilicon pattern.

19. The semiconductor memory device of claim 16, wherein a top surface of the bit line contact is located at a same level as a top surface of the mask polysilicon pattern.

20. The semiconductor memory device of claim 16, wherein the storage node contact comprises a contact diffusion prevention pattern and a contact metal pattern disposed on the contact diffusion prevention pattern.

* * * * *